(12) United States Patent
Kwon

(10) Patent No.: US 10,796,920 B1
(45) Date of Patent: Oct. 6, 2020

(54) METHODS OF MANUFACTURING INTEGRATED CIRCUIT DEVICES

(71) Applicant: Samsung Electronics Co., Ltd., Suwon-si, Gyeonggi-do (KR)

(72) Inventor: Dohyun Kwon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/708,504

(22) Filed: Dec. 10, 2019

(30) Foreign Application Priority Data

Apr. 17, 2019 (KR) .......................... 10-2019-0045134

(51) Int. Cl.
*H01L 21/308* (2006.01)
*H01L 23/00* (2006.01)
*H01L 21/768* (2006.01)

(52) U.S. Cl.
CPC .... *H01L 21/3081* (2013.01); *H01L 21/76811* (2013.01); *H01L 21/76898* (2013.01); *H01L 24/85* (2013.01)

(58) Field of Classification Search
None
See application file for complete search history.

(56) References Cited

U.S. PATENT DOCUMENTS

| 9,330,965 | B2 | 5/2016 | Chen et al. | |
|---|---|---|---|---|
| 2013/0023118 | A1* | 1/2013 | Jeong | H01L 21/76816 |
| | | | | 438/672 |
| 2017/0271202 | A1 | 9/2017 | Xu et al. | |
| 2018/0247864 | A1 | 8/2018 | Burns et al. | |
| 2018/0269144 | A1 | 9/2018 | Briggs et al. | |
| 2018/0308754 | A1 | 10/2018 | Guler | |
| 2018/0323100 | A1 | 11/2018 | Nyhus et al. | |
| 2018/0374750 | A1 | 12/2018 | Zhang et al. | |

FOREIGN PATENT DOCUMENTS

KR 10-2018-0124045 11/2018

OTHER PUBLICATIONS

Briggs et al. "Fully aligned via integration for extendibility of interconnects to beyond the 7 nm node" 2017 IEEE International Electron Devices Meeting (IEDM) (Dec. 2017).

* cited by examiner

*Primary Examiner* — Roberts P Culbert
(74) *Attorney, Agent, or Firm* — Myers Bigel, P.A.

(57) ABSTRACT

Methods of manufacturing an integrated circuit device are provided. A method of manufacturing an integrated circuit device includes sequentially forming a device layer, a wiring insulating layer, and a hard mask layer on a semiconductor substrate. The method includes sequentially removing a first region and a second region of the hard mask layer by using a first mask layer having a first opening and a second mask layer having a second opening as an etch mask, respectively. The method includes forming a first wiring recess through the wiring insulating layer and a second wiring recess having a depth that is less than that of the first wiring recess by removing a portion of the wiring insulation layer by using a portion of the hard mask layer as an etching mask. Moreover, the method includes forming a wiring structure that is in the first wiring recess and the second wiring recess.

20 Claims, 48 Drawing Sheets

METHODS OF MANUFACTURING INTEGRATED CIRCUIT DEVICES

CROSS-REFERENCE TO RELATED APPLICATION

This application claims the benefit of Korean Patent Application No. 10-2019-0045134, filed on Apr. 17, 2019, in the Korean Intellectual Property Office, the disclosure of which is incorporated herein in its entirety by reference.

BACKGROUND

The present disclosure relates to methods of manufacturing integrated circuit devices. Due to advances in electronics technology, down-scaling of integrated circuit devices is rapidly advancing. In a down-scaled integrated circuit device, the process margin of a process for interconnecting a wiring layer and a via plug may be reduced.

SUMMARY

The inventive concepts provide methods of manufacturing an integrated circuit device capable of interconnecting a wiring layer and a via plug even if the process margin for forming the wiring layer and the via plug is reduced in accordance with down-scaling of the integrated circuit device.

In order to overcome the above technical problem, the inventive concepts provide methods of manufacturing an integrated circuit device. A method of manufacturing an integrated circuit device, according to some embodiments herein, may include sequentially forming a device layer, a wiring insulating layer, and a hard mask layer on a semiconductor substrate. The device layer may include a plurality of semiconductor devices. The method may include sequentially removing a first region and a second region of the hard mask layer by using a first mask layer having a first opening extending in a first horizontal direction and a second mask layer having a second opening extending in the first horizontal direction as an etch mask, respectively. A portion of the second opening may overlap in a vertical direction a stitch region that includes a first portion of the wiring insulating layer and may overlap a portion of the first opening in the vertical direction. The method may include forming a first wiring recess passing through the wiring insulating layer and a second wiring recess having a depth that is less than a depth of the first wiring recess by removing the first portion of the wiring insulating layer by using as an etch mask a third region of the hard mask layer that remains after removing the first region and the second region of the hard mask layer. Moreover, the method may include forming a wiring structure that is in the first wiring recess and the second wiring recess and is electrically connected to the plurality of semiconductor devices.

A method of manufacturing an integrated circuit device, according to some embodiments herein, may include sequentially forming a device layer, a wiring insulating layer, an etch stop film, and a hard mask layer on a semiconductor substrate including portion that is in a stitch region of integrated circuit device. The device layer may include a plurality of semiconductor devices. The method may include forming a first recess in the hard mask layer by removing a first region of the hard mask layer by using as an etch mask a first mask layer having a first opening that has a portion in the stitch region and extends in a first horizontal direction. The method may include forming a second recess by removing a second region of the hard mask layer by using as an etch mask a second mask layer having a second opening that has a portion in the stitch region and extends in the first horizontal direction. The method may include removing a first portion of the etch stop film that is in the stitch region. The method may include removing a third region of the hard mask layer and a second portion of the etch stop film through the first recess, removing a fourth region of the hard mask layer and a third portion of the etch stop film through the second recess, and removing a portion of an upper first portion of the wiring insulating layer that is in the stitch region. Moreover, the method may include forming a first wiring recess passing through the wiring insulating layer in the stitch region and forming a second wiring recess having a depth that is less than a depth of the first wiring recess, by removing a second portion of the wiring insulating layer by using as an etch mask a fifth region of the hard mask layer that remains after removing the third region and the fourth region of the hard mask layer.

A method of manufacturing an integrated circuit device, according to some embodiments herein, may include sequentially forming a semiconductor substrate having a stitch region, a wiring insulating layer, an etch stop film, a first hard mask layer, and a second hard mask layer. The method may include forming a first recess by removing a first region of the second hard mask layer by using as an etch mask a first mask layer having a first opening that extends in a first horizontal direction and has a portion that is in the stitch region. The method may include forming a second recess by removing a second region of the second hard mask layer and a first portion of the first hard mask layer that is in the stitch region by using as an etch mask a second mask layer having a second opening that extends in the first horizontal direction and has a first portion in the stitch region and a second portion that is different from the first opening. The method may include removing a first portion of the etch stop film that is in the stitch region. The method may include removing a second portion of the first hard mask layer and a second portion of the etch stop film through the first recess, removing a third portion of the first hard mask layer and a third portion of the etch stop film through the second recess, and removing a portion of an upper first portion of the wiring insulating layer that is in the stitch region. Moreover, the method may include forming a first wiring recess passing through the wiring insulating layer and a second wiring recess having a depth that is less than that of the first wiring recess by removing a second portion of the wiring insulating layer by using a fourth portion of the first hard mask layer as an etch mask. The first wiring recess may be formed in the stitch region.

BRIEF DESCRIPTION OF THE DRAWINGS

Embodiments of the inventive concepts will be more clearly understood from the following detailed description taken in conjunction with the accompanying drawings in which:

FIGS. 10B and 10C are cross-sectional views taken along lines B-B' and C-C' in FIG. 10A;

FIGS. 16B and 16C are cross-sectional views taken along lines B-B' and C-C' in FIG. 16A.

DETAILED DESCRIPTION

FIGS. 1A to 9C are plan views and cross-sectional views illustrated in accordance with a process sequence for explaining a method of manufacturing an integrated circuit device, according to example embodiments of the inventive concepts. Specifically, each of FIGS. 1B, 2B, 3B, 4B, 5B, 6B, 7B, 8B and 9B and each of FIGS. 1C, 2C, 3C, 4C, 5C, 6C, 7C, 8C and 9C are cross-sectional views taken along lines B-B' and C-C' of each of FIGS. 1A, 2A, 3A, 4A, 5A, 6A, 7A, 8A, and 9A.

Figure 1A:
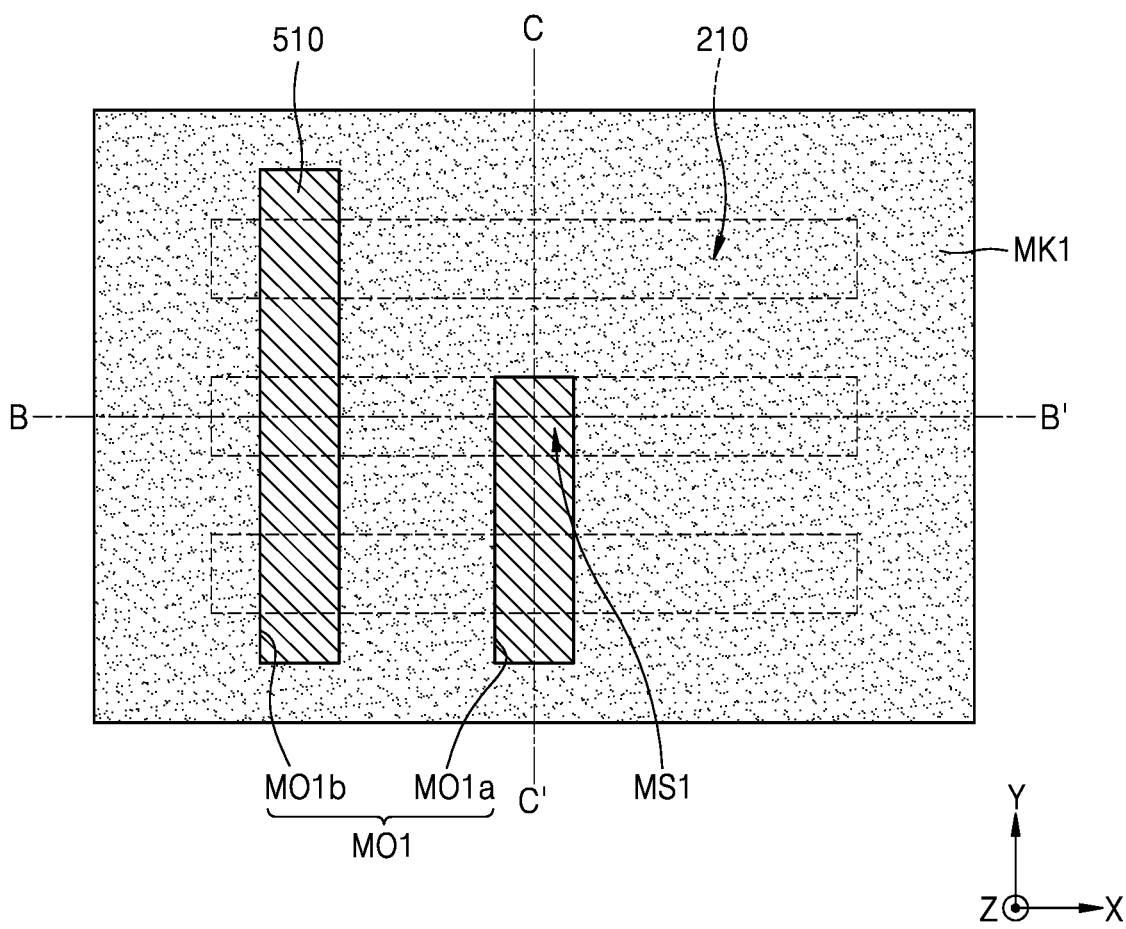
FIGS. 1A to 9C are plan views and cross-sectional views illustrated in accordance with a process sequence for explaining a method of manufacturing an integrated circuit device, according to example embodiments of the inventive concepts, wherein specifically, each of FIGS. 1B, 2B, 3B, 4B, 5B, 6B, 7B, 8B and 9B and each of FIGS. 1C, 2C, 3C, 4C, 5C, 6C, 7C, 8C and 9C are cross-sectional views taken along lines B-B' and C-C' of each of FIGS. 1A, 2A, 3A, 4A, 5A, 6A, 7A, 8A, and 9A.
Figure 1B:
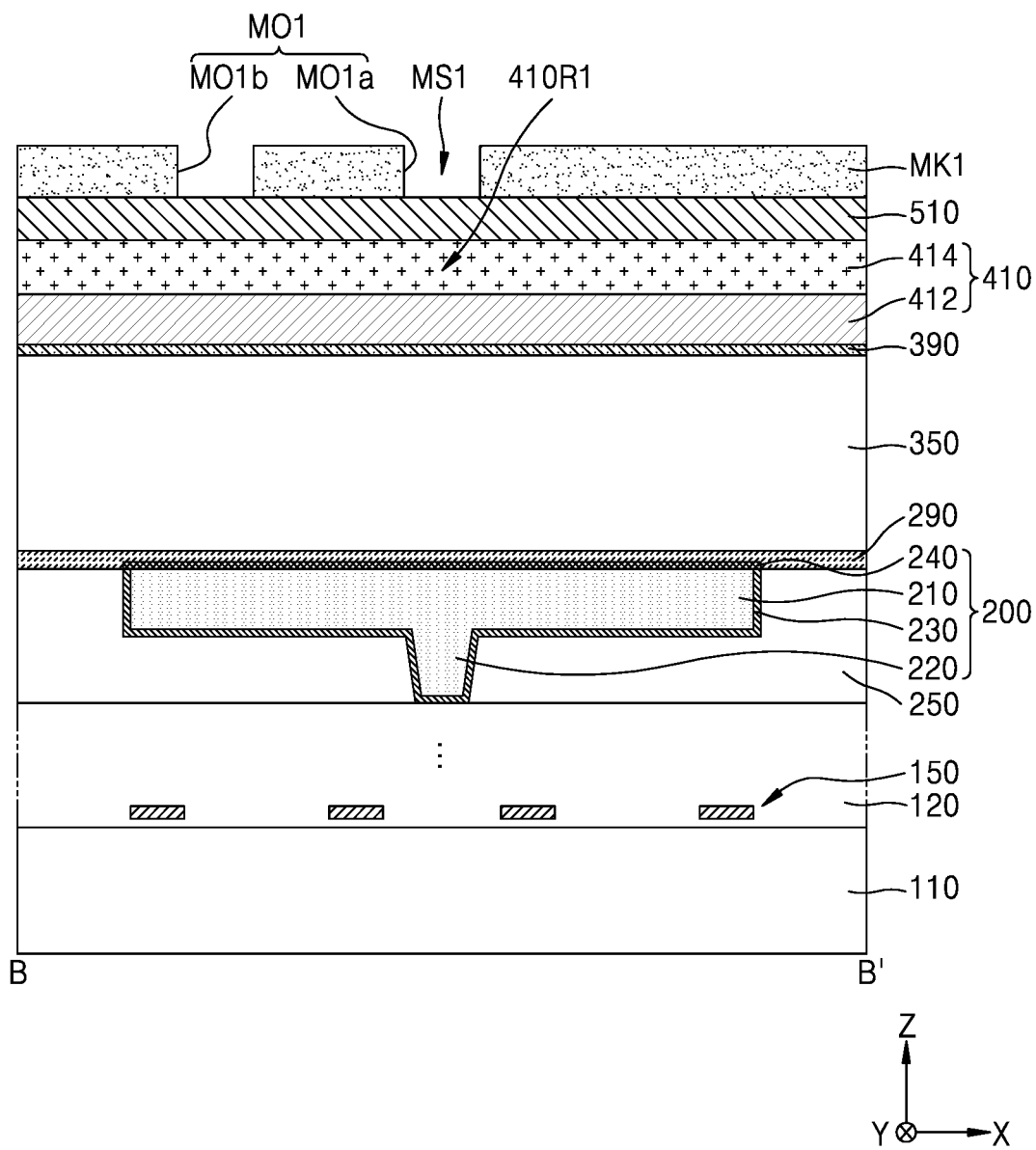
Figure 1C:
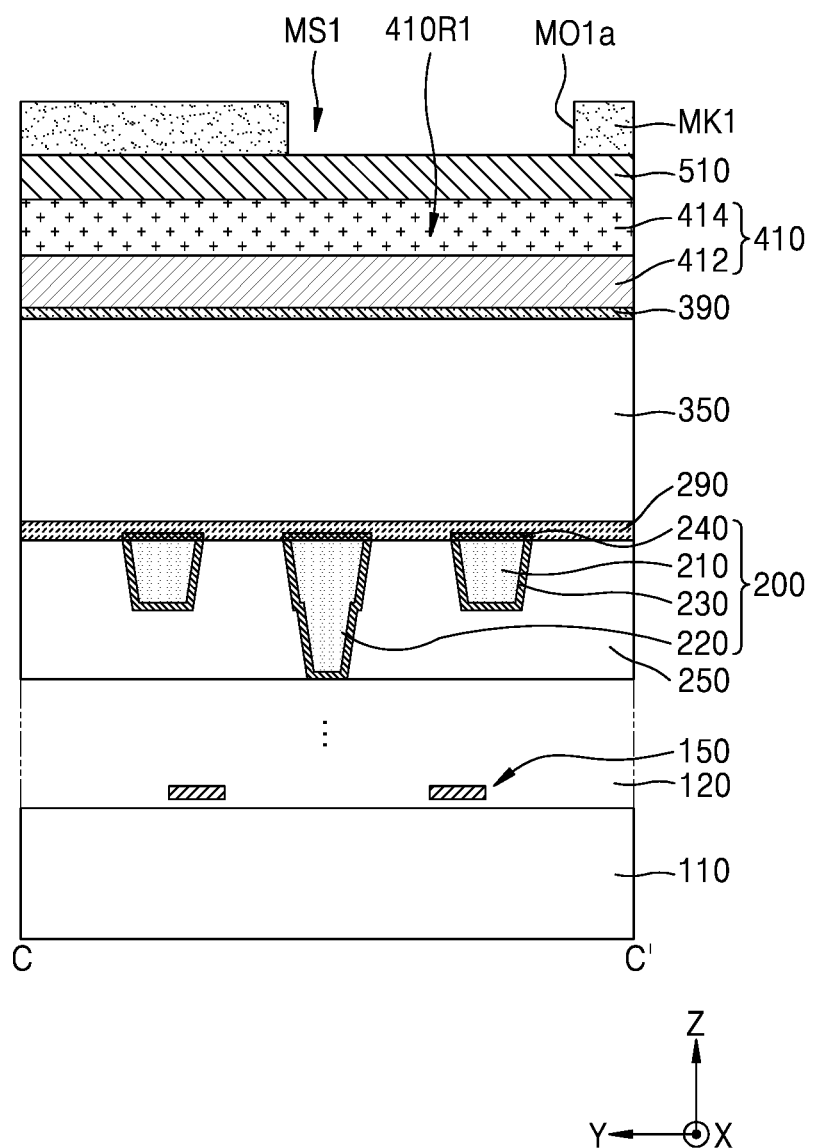
Figure 2A:
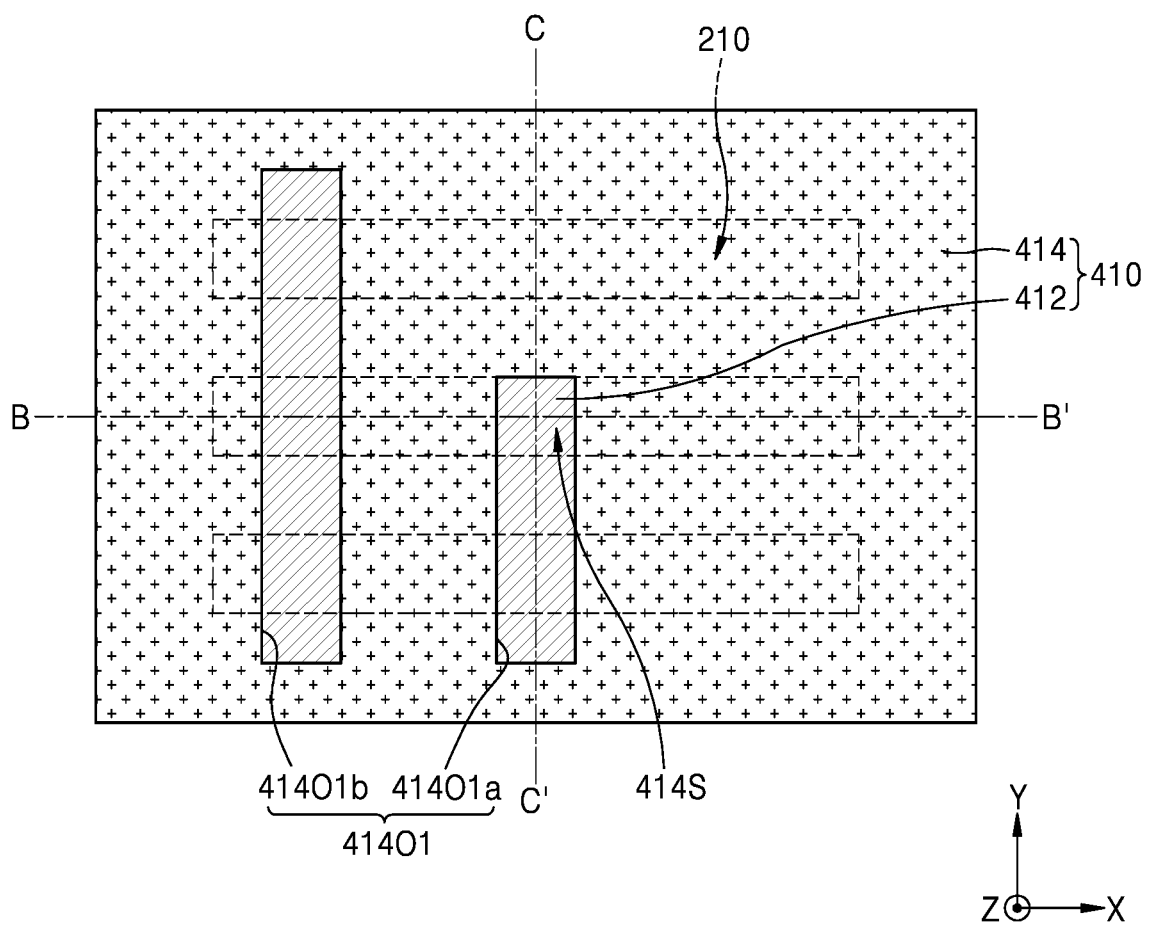
Figure 2B:
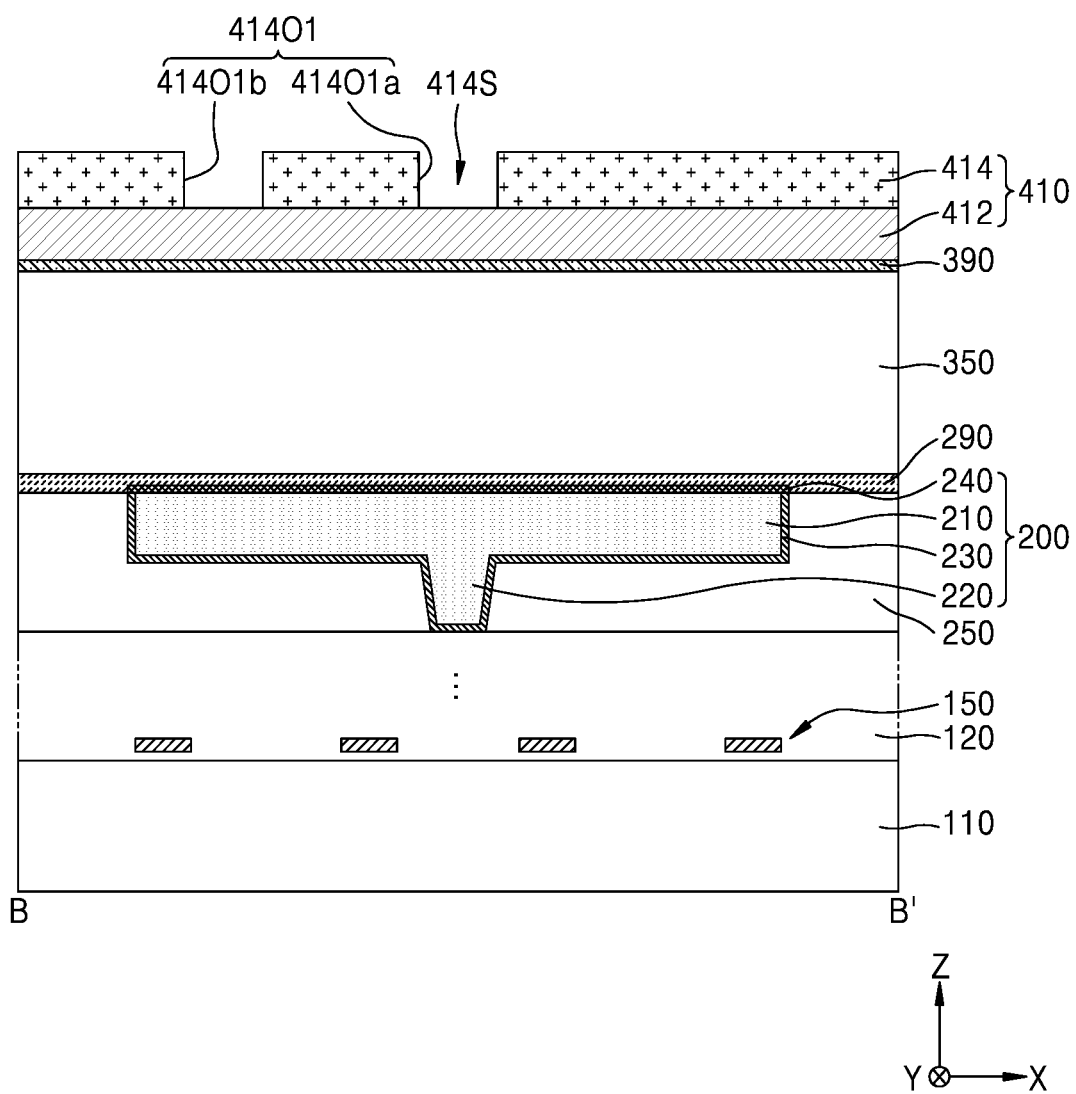
Figure 2C:
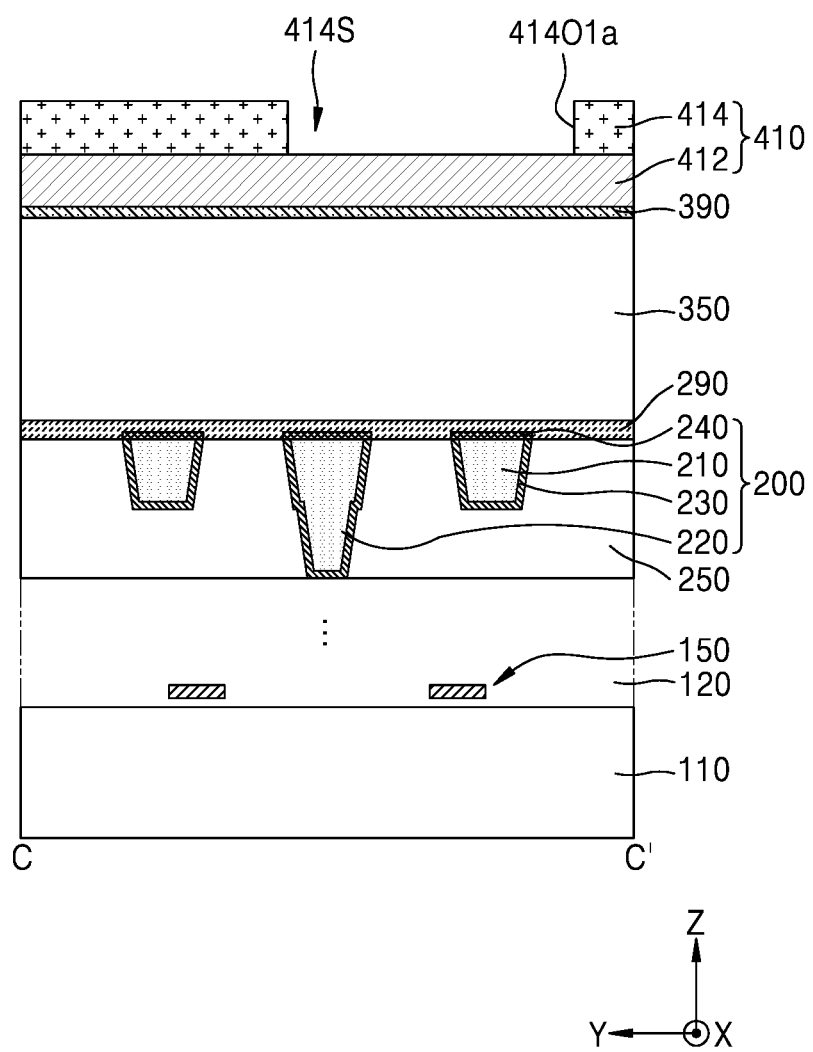

Referring to FIGS. 1A to 1C, a device layer 120 is formed on a semiconductor substrate 110, the device layer 120 including a plurality of semiconductor devices 150. The semiconductor substrate 110 may include silicon (Si), for example. Alternatively, the semiconductor substrate 110 may include a semiconductor element such as germanium (Ge), or a compound semiconductor such as silicon carbide (SiC), gallium arsenide (GaAs), indium arsenide (InAs), or indium phosphide (InP). The semiconductor substrate 110 may also include a silicon on insulator (SOI) structure. For example, the semiconductor substrate 110 may include a buried oxide (BOX) layer. The semiconductor substrate 110 may include a conductive region, for example, a well doped with impurities, or a structure doped with impurities. In addition, the semiconductor substrate 110 may include various device isolation structures such as a shallow trench isolation (STI) structure. The semiconductor substrate 110 may include an active surface and an inactive surface opposite the active surface.

The device layer 120 including the plurality of semiconductor devices 150 may be formed on the active surface of the semiconductor substrate 110.

At least a part of the plurality of semiconductor devices 150 may include a transistor. For example, the at least a part of the plurality of semiconductor devices 150 may include a bipolar junction transistor (BJT) or a field effect transistor (FET). For example, the at least a part of the plurality of semiconductor devices 150 may include a planar transistor or a FinFET. When the at least a part of the plurality of semiconductor devices 150 includes a FinFET, a plurality of fin-type active regions may protrude and extend parallel to each other in a horizontal direction (an X direction or a Y direction) in the semiconductor substrate 110.

The plurality of semiconductor devices 150 may constitute a logic cell. The logic cell may be variously configured to include a plurality of circuit elements such as transistors, resistors, and the like. The logic cell may constitute, for example, AND, NAND, OR, NOR, exclusive OR (XOR), exclusive NOR (XNOR), inverter (INV), adder (ADD), buffer (BUF), delay (DLY), filter (FIL), multiplexer (MXT/MXIT), OAI (OR/AND/INVERTER), AO (AND/OR), AOI (AND/OR/INVERTER), D flip-flop, reset flip-flop, master-slave flip-flop, latch, and the like. The logic cell may also constitute standard cells that perform a desired logical function such as a counter, a buffer, and the like.

The plurality of semiconductor devices 150 may include various kinds of individual devices for constituting, for example, a central processing unit (CPU), a graphics processing unit (GPU), and an application processor (AP), and the like, or various kinds of individual devices for constituting, for example, a dynamic random access memory (DRAM) device, a static random access memory (SRAM) device, a flash memory device, an electrically erasable and programmable read-only memory (EEPROM) device, a phase-change random access memory (PRAM) device, a magnetic random access memory (MRAM) device, and a resistive random access memory (RRAM) device, and the like.

The device layer 120 may include the semiconductor devices 150, a conductive line and a conductive plug for connecting the semiconductor devices 150 to each other, and an insulating layer filling spaces between the semiconductor devices 150. The device layer 120 may include various types and shapes of conductive materials, semiconductor materials, and insulating materials. Moreover, the insulating layer may be on the conductive line and the conductive plug.

A lower wiring structure 200 may be formed on the device layer 120. In some embodiments, the lower wiring structure 200 may be formed using a dual damascene process. The lower wiring structure 200 may be electrically connected to each semiconductor device 150, so that the lower wiring structure 200 may provide electrical connections between the plurality of semiconductor devices 150 and electrical connections between the plurality of semiconductor devices 150 and a reference wiring structure 300 described with reference to FIGS. 10A to 10C.

The lower wiring structure 200 may include a lower wiring layer 210 and a lower via plug 220 connected to the lower wiring layer 210. A lower wiring insulation layer 250 may fill a space between/adjacent the lower wiring layer 210 and the lower via plug 220. In some embodiments, the lower wiring layer 210 and the lower via plug 220 may be in contact with each other and may be formed integrally.

For example, the lower wiring layer 210 may include a plurality of lines extending in a line shape in the first horizontal direction (the X direction) parallel to each other. An extending length in the first horizontal direction (the X direction) of the lower wiring layer 210 shown in FIGS. 1A and 1B is an illustrative example and is not limited thereto.

The lower wiring structure 200 may further include a lower barrier layer 230 surrounding bottom surfaces and side surfaces of the lower wiring layer 210 and the lower via plug 220. The lower barrier layer 230 may be disposed between (a) the lower wiring layer 210 and the lower via plug 220 and (b) the lower wiring insulating layer 250. In some embodiments, the lower barrier layer 230 may also be disposed between the lower via plug 220 and a conductive layer in contact with the bottom surface of the lower via plug 220. In some embodiments, the lower wiring structure 200 may further include a lower cover layer 240 covering an upper surface of the lower wiring layer 210.

For example, the lower wiring layer 210 and the lower via plug 220 may include a metal material such as tungsten (W), copper (Cu), titanium (Ti), tantalum (Ta), ruthenium (Ru), manganese (Mn), or cobalt (Co). For example, the lower barrier layer 230 may include a nitride or an oxide of a metal such as Ti, Ta, Ru, Mn, Co, or W, or may include an alloy such as cobalt tungsten phosphide (CoWP), cobalt tungsten boron (CoWB), cobalt tungsten boron phosphide (CoWBP), and the like. For example, the lower cover layer 240 may include a metal material such as W, Ti, Ta, Ru, Mn, or Co. For example, the lower wiring insulating layer 250 may include a silicon oxide, or an insulating material having a dielectric constant lower than that of silicon oxide. In some embodiments, the lower wiring insulating layer 250 may include a tetraethyl orthosilicate (TEOS) film, or an ultra low K (ULK) film having an ultra low dielectric constant K of 2.2 to 2.4. The ULK film may include a silicon oxycarbide (SiOC) film or a carbon-doped silicon oxide (SiCOH) film.

A lower etch stop film 290 may be formed on the lower wiring structure 200 and the lower wiring insulating layer 250 to cover upper surfaces of the lower wiring layer 210 and the lower wiring insulating layer 250. In some embodiments, when the lower cover layer 240 covers the upper surface of the lower wiring layer 210, the lower etch stop film 290 may cover the upper surfaces of the lower cover layer 240 and the lower wiring insulating layer 250. For example, the lower etch stop film 290 may include a nitride such as silicon nitride (SiN) or aluminum nitride (AlN). In some embodiments, the lower etch stop film 290 may include a material that does not include carbon.

A reference wiring insulating layer 350 may be formed on the lower etch stop film 290 to cover the lower wiring structure 200 and the lower wiring insulating layer 250. For example, the reference wiring insulating layer 350 may include a silicon oxide, or an insulating material having a dielectric constant lower than that of the silicon oxide. In some embodiments, the reference wiring insulating layer 350 may include a TEOS film, or an ULK film having an ultra low dielectric constant of 2.2 to 2.4. The ULK film may include a SiOC film or a SiCOH film.

In some embodiments, after forming the lower etch stop film 290 covering the device layer 120 without forming the lower wiring structure 200 and the lower wiring insulating layer 250, the reference wiring insulating layer 350 covering the lower etch stop film 290 may be formed.

A reference etch stop film 390 and a reference hard mask layer 410 may be sequentially formed on the reference wiring insulating layer 350. For example, the reference etch stop film 390 may include silicon carbonitride (SiCN), or may include a stacked structure of SiCN/SiN or SiCN/SiN/AlN. In some embodiments, the reference etch stop film 390 may include a material containing carbon. The reference hard mask layer 410 may include titanium nitride (TiN) or silicon oxynitride (SiON), or may include a stacked structure of SiON/TiN. In some embodiments, the reference hard mask layer 410 may include a first reference hard mask layer 412 and a second reference hard mask layer 414 stacked on the first reference hard mask layer 412. For example, the first reference hard mask layer 412 may include a metal nitride such as TiN, and the second reference hard mask layer 414 may include an oxynitride such as SiON. In some embodiments, the first reference hard mask layer 412 may include a metal nitride such as TiN, and the second reference hard mask layer 414 may include a material containing carbon such as SiC or SiCN, and in this case, the reference etch stop film 390 may include a material that does not contain carbon, for example, a nitride such as SiN or AlN. Each of the reference etch stop film 390, the first reference hard mask layer 412, and the second reference hard mask layer 414 may include a different one among (i) a metal nitride material, (ii) an oxynitride material, and (iii) a material comprising carbon.

The first reference hard mask layer 412 and the second reference hard mask layer 414 may have a large etch selectivity ratio or may have similar etch characteristics depending on conditions of an etch process.

A first mask layer MK1 having a first opening MO1 may be formed on the reference hard mask layer 410. For example, the first mask layer MK1 may include a photoresist or may be formed using the photoresist. In some embodiments, a first anti-reflective film 510 may be formed on the reference hard mask layer 410 prior to forming the first mask layer MK1.

For example, the first opening MO1 may be formed in plural in the shape of lines extending in the second horizontal direction (the Y direction) parallel to each other. In some embodiments, the first horizontal direction (the X direction) and the second horizontal direction (the Y direction) may be perpendicular to each other. The first opening MO1 may include a first cutting opening MO1a and a first extension opening MO1b. An extension length of the first cutting opening MO1a in the second horizontal direction (the Y direction) may be less than an extension length of the first extension opening MO1b. For example, a portion of the first cutting opening MO1a may overlap with a portion of the lower wiring layer 210 underlying thereof, and one end of the first cutting opening MO1a in the second horizontal direction (the Y direction) may overlap with a portion adjacent to a side surface of the lower wiring layer 210 underlying thereof in a vertical direction (a Z direction). In some embodiments, one end of the first cutting opening MO1a may be aligned with a portion of the side surface of the lower wiring layer 210 underlying thereof in the vertical direction (the Z direction).

In the first cutting opening MO1a, a portion overlapping with a portion of the lower wiring layer 210 underlying thereof adjacent to one end of the first cutting opening MO1a may be defined as a first mask stitch region MS1. The first mask stitch region MS1 of the first opening MO1 may correspond to a portion overlapping with a second opening MO2 described in FIGS. 3A to 3C in the vertical direction (the Z direction). A portion of the second opening MO2 overlapping with the first mask stitch region MS1 in the vertical direction (the Z direction) may be defined as a second mask stitch region MS2.

As used herein, the term "stitch region" may refer to any portion of the integrated circuit device that is overlapped in the vertical direction (the Z direction) by the first mask stitch region MS1 and/or the second mask stitch region MS2. For example, the stitch region may include a portion of the reference wiring insulating layer 350 that is overlapped in the vertical direction (the Z direction) by the first mask stitch region MS1 and/or the second mask stitch region MS2. Moreover, the stitch region may, in some embodiments, extend vertically from the top of the integrated circuit device to the bottom of the integrated circuit device.

Herein, that a portion of the first opening MO1, that is, the portion of the first mask stitch region MS1, may overlap with a portion of the second opening MO2, that is, the second mask stitch region MS2, may mean that a portion of the semiconductor substrate 110, a portion of the lower wiring layer 210, and a portion of the reference wiring insulating layer 350 overlapping with the first mask stitch region MS1 of the first opening MO1 in the vertical direction may be correspondingly the same parts as a portion of the semiconductor substrate 110, a portion of the lower wiring layer 210, and a portion of the reference wiring insulating layer 350 overlapping with the second mask stitch region MS2 in the vertical direction.

Meanwhile, the terms of "reference", "upper", and "lower" contained in the names of elements herein are used for convenience of explanation and to easily indicate relationships with other elements. For example, except for the words themselves consisting of the terms of "reference", "upper" and "lower", elements having the same or similar names and containing the terms of "upper" and "lower" may be respectively used herein to refer to the elements arranged in the "upper" and "lower" positions by using the element containing the term of "reference" as a reference. Thus, the elements containing the terms of "reference", "upper" and "lower" may be used herein to refer to the same elements while omitting the terms of "reference", "upper" and "lower", when there is no need for comparisons of positional relation to each other. For example, each of the reference wiring insulating layer 350, the reference etch stop film 390, the reference hard mask layer 410, the first reference hard mask layer 412, and the second reference hard mask layer 414 may refer to the wiring insulating layer 350, the etch stop film 390, the hard mask layer 410, the first hard mask layer 412, and the second hard mask layer 414, respectively.

Referring to FIGS. 1A to 2C together, by removing a first region 410R1, which is a portion of the reference hard mask layer 410 using the first mask layer MK1 as an etch mask, a first recess 414O1 may be formed. The first region 410R1 may be a portion of the reference hard mask layer 410 located under the first opening MO1 of the first mask layer MK1 and may be a portion in which the first region 410R1 is removed. After forming the first recess 414O1, the first mask layer MK1 and the first anti-reflective film 510 may be removed.

The first recess 414O1 may extend in the vertical direction (the Z direction) from the upper surface of the reference hard mask layer 410 toward the semiconductor substrate 110, but the reference etch stop film 390 may not be exposed at a bottom level (e.g., may not be exposed by/through a lower region) of the first recess 414O1. That is, a depth of the first recess 414O1 in the vertical direction (the Z direction) may be less than a thickness of the reference hard mask layer 410.

When the reference hard mask layer 410 includes the first reference hard mask layer 412 and the second reference hard mask layer 414 stacked on the first reference hard mask layer 412, the first recess 414O1 may pass through the second reference hard mask layer 414 and then expose the first reference hard mask layer 412 at the bottom level of the first recess 414O1. That is, the first recess 414O1 may be formed by removing a portion of the second reference hard mask layer 414 using the first mask layer MK1 as the etch mask. The depth of the first recess 414O1 in the vertical direction (the Z direction) may be equal to or greater than a thickness of the second reference hard mask layer 414.

The first recess 414O1 may include a first cutting recess 414O1a corresponding to the first cutting opening MO1a of the first mask layer MK1 and a first extension recess 414O1b corresponding to the first extension opening MO1b of the first mask layer MK1. An extension length of the first cutting recess 414O1a in the second horizontal direction (the Y direction) may be less than an extension length of the first extension recess 414O1b. For example, a portion of the first cutting recess 414O1a may overlap with a portion of the lower wiring layer 210 underlying thereof, and one end of the first cutting recess 414O1a in the second horizontal direction (the Y direction) may overlap with a portion adjacent to the side surface of the lower wiring layer 210 underlying thereof in the vertical direction (the Z direction). In some embodiments, one end of the first cutting recess 414O1a may be aligned with a portion of the side surface of the lower wiring layer 210 underlying thereof in the vertical direction (the Z direction).

In the first cutting recess 414O1a, a portion overlapping with a portion of the lower wiring layer 210 underlying thereof adjacent to one end of the first cutting recess 414O1a may be defined as a first recess stitch region 414S.

Figure 3A:
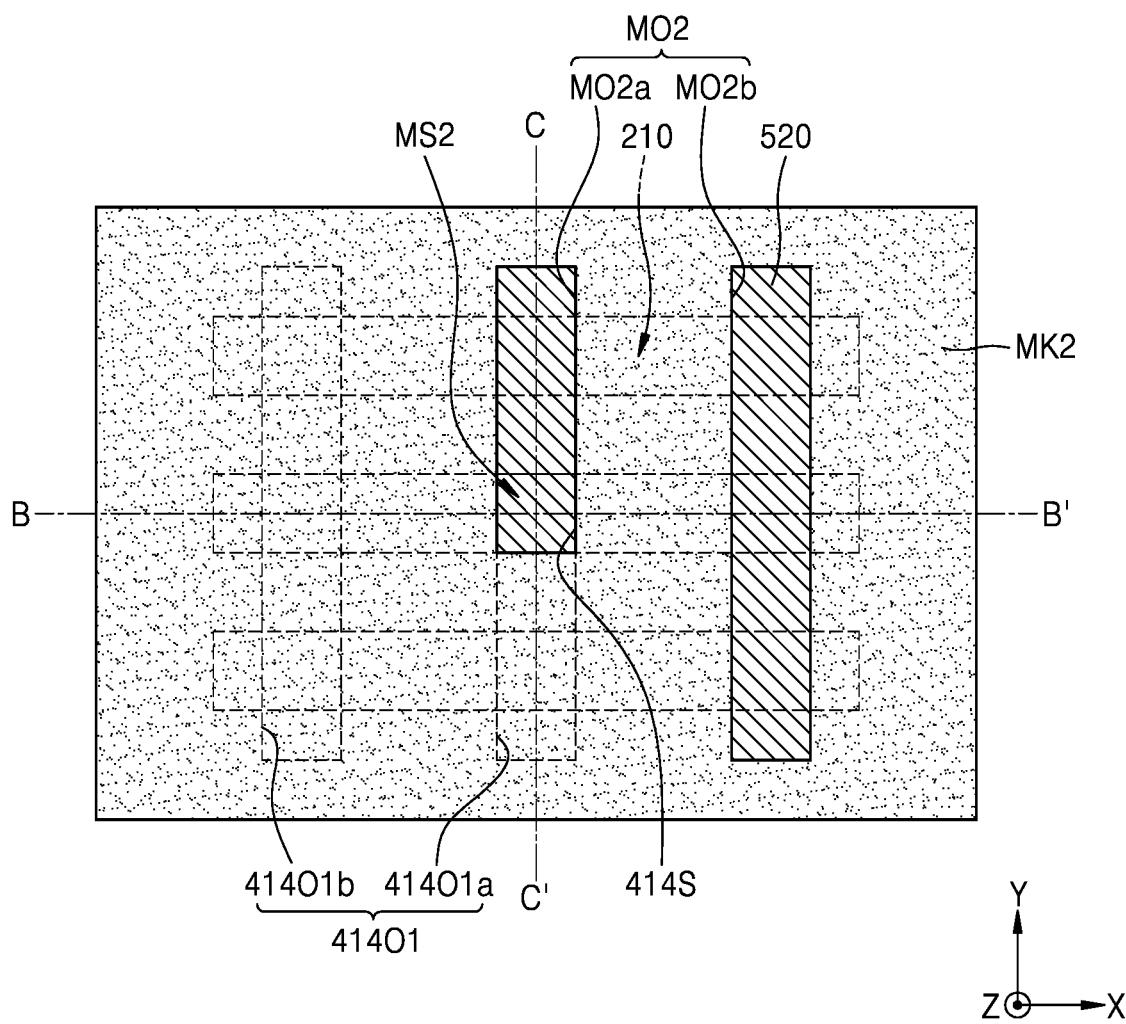
Figure 3B:
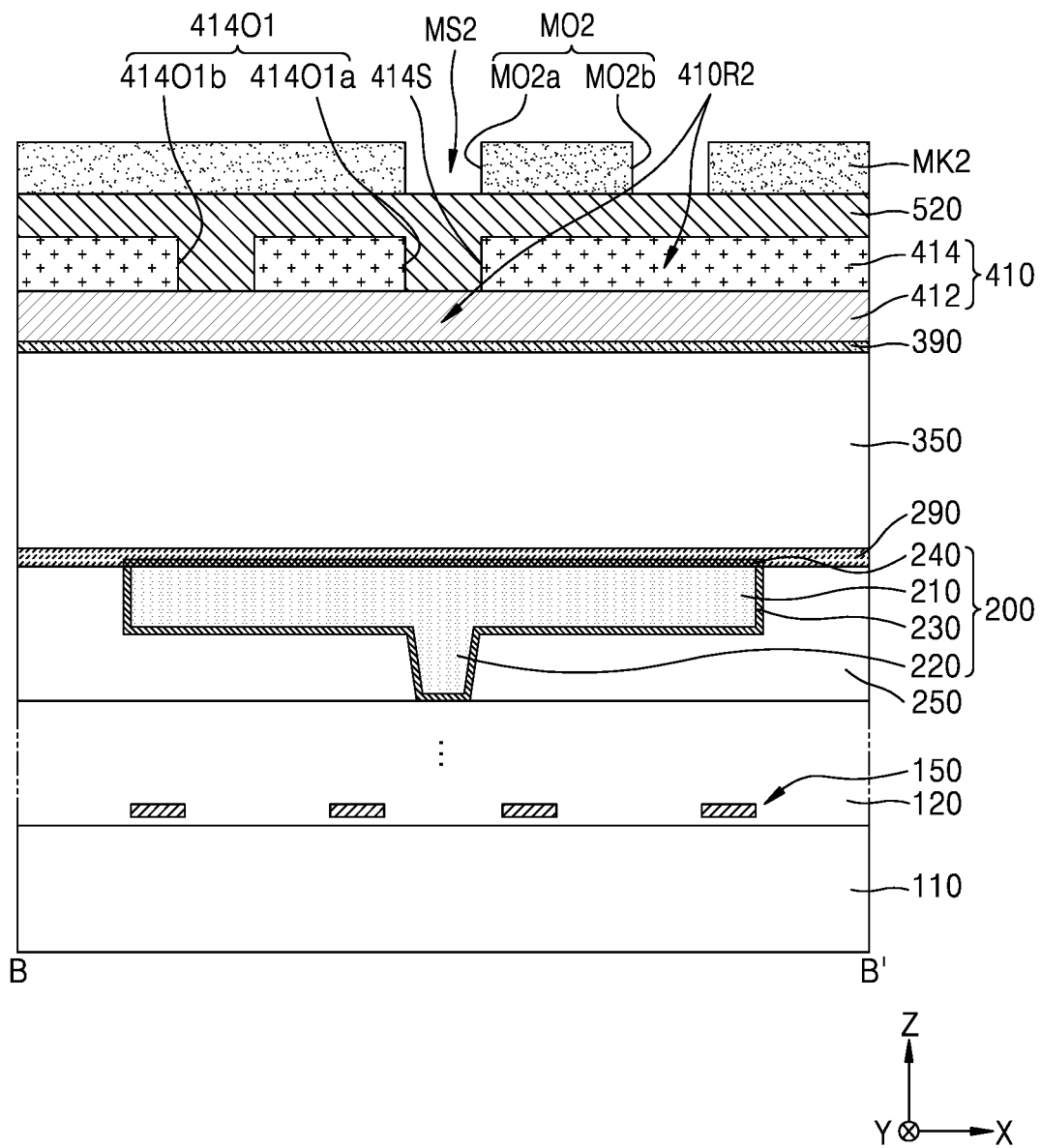
Figure 3C:
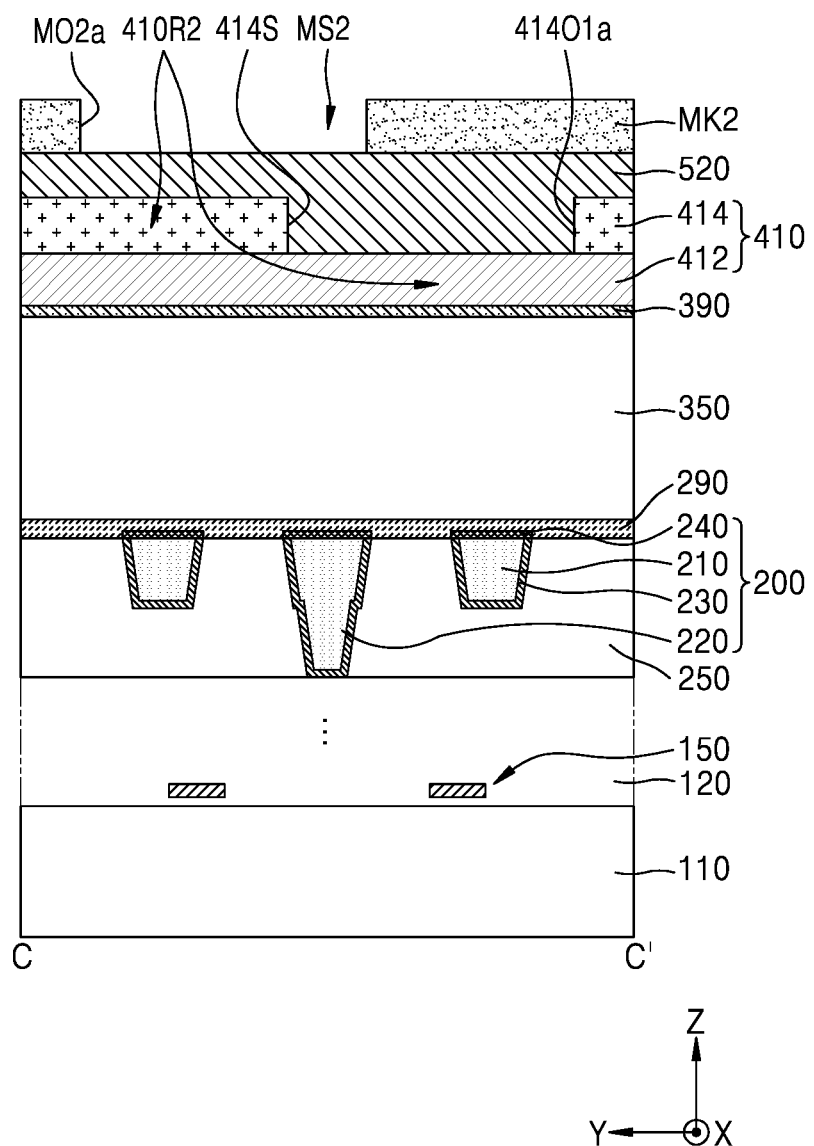

Referring to FIGS. 3A to 3C together, a second mask layer MK2 having a second opening MO2 may be formed on the reference hard mask layer 410 having the first recess 414O1. For example, the second mask layer MK2 may include a photoresist or may be formed using the photoresist. In some embodiments, a second anti-reflective film 520 may be formed on the reference hard mask layer 410 prior to forming the second mask layer MK2.

For example, a second opening MO2 may be formed in plural in the shape of lines extending in the second horizontal direction (the Y direction) parallel to each other. The second opening MO2 may include a second cutting opening MO2a and a second extension opening MO2b. An extension length of the second cutting opening MO2a in the second horizontal direction (the Y direction) may be less than an extension length of the second extension opening MO2b. Moreover, a width in the first horizontal direction (the X direction) of each of the first cutting opening MO1a and the second cutting opening MO2a may have the same value.

A portion of the second opening MO2 and a portion of the first recess 414O1 may overlap with each other in the vertical direction (the Z direction). For example, a portion of the second cutting opening MO2a and a portion of the first cutting recess 414O1a may overlap with each other in the vertical direction (the Z direction), and the second extension opening MO2b and the first extension recess 414O1b may not overlap with each other in the vertical direction (the Z direction). Specifically, a portion of the second cutting opening MO2a may overlap with the first recess stitch region 414S in the vertical direction (the Z direction).

For example, a portion of the second cutting opening MO2a may overlap with a portion of the lower wiring layer 210 underlying thereof, and one end of the second cutting opening MO2a in the second horizontal direction (the Y direction) may overlap with a portion adjacent to a side surface of the lower wiring layer 210 underlying thereof in the vertical direction (the Z direction). In some embodiments, one end of the second cutting opening MO2a may be aligned with a portion of the side surface of the lower wiring layer 210 underlying thereof in the vertical direction (the Z direction).

A portion of the second cutting opening MO2a overlapping with the first recess stitch region 414S in the vertical direction (the Z direction) may be defined as a second mask stitch region MS2. The second mask stitch region MS2 may be a portion overlapping with a portion of the lower wiring layer 210 located below.

Referring to FIGS. 3A to 4C together, by removing a second region 410R2, which is a portion of the reference hard mask layer 410 using the second mask layer MK2 as an etch mask, a second recess 414O2 may be formed. The second region 410R2 may be a portion of the reference hard mask layer 410 located under the second opening MO2 of the second mask layer MK2 and may be a portion in which the second region 410R2 is removed. After forming the second recess 414O2, the second mask layer MK2 and the second anti-reflective film 520 may be removed.

The second recess 414O2 may include a second cutting recess 414O2a corresponding to the second cutting opening MO2a of the second mask layer MK2 and a second extension recess 414O2b corresponding to the second extension opening MO2b of the second mask layer MK2. The second cutting recess 414O2a may communicate with the first cutting recess 414O1a. The first recess 414O1 and the second recess 414O2 together may constitute a reference recess 410O.

The reference recess 410O may extend in the vertical direction (the Z direction) from the upper surface of the reference hard mask layer 410 toward the semiconductor substrate 110, but the reference etch stop film 390 may be exposed at a portion (e.g., may be exposed by/through a first portion) of a bottom level of the reference recess 410O and the reference etch stop film 390 may not be exposed at another portion (e.g., may not be exposed by/through a second portion) of the bottom level of the reference recess 410O. Specifically, the reference etch stop film 390 may be exposed at the bottom level of the portion of the reference recess 410O corresponding to the second mask stitch region MS2, and the reference etch stop film 390 may not be exposed at the bottom level of a remaining portion of the reference recess 410O.

A portion of the reference recess 410O formed corresponding to the second mask stitch region MS2 may be defined as a reference recess stitch region 410S. The reference recess stitch region 410S may pass through the reference hard mask layer 410 in the vertical direction (the Z direction), and then may expose the reference etch stop film 390 at a bottom level of the reference recess stitch region 410S. The reference recess stitch region 410S may include a first recess stitch region 414S that passes through the second reference hard mask layer 414 in the vertical direction (the Z direction) and a second recess stitch region 412S that passes through the first reference hard mask layer 412 in the vertical direction (the Z direction), wherein the first recess stitch region 414S and the second recess stitch region 412S may communicate with each other. The first recess stitch region 414S may be a portion formed by using the first mask layer MK1 shown in FIGS. 1A to 1C, and the second recess stitch region 412S may be a portion formed by using the second mask layer MK2 shown in FIGS. 3A to 3C. That is, the reference recess stitch region 410S may be formed in a portion corresponding to a portion where the first opening MO1 of the first mask layer MK1 overlaps with the second opening MO2 of the second mask layer MK2.

The reference etch stop film 390 may be exposed at the bottom level of a first portion of the reference recess stitch region 410S in the reference recess 410O and the first reference hard mask layer 412 may be exposed at the bottom level of a second portion of the reference recess region 410O.

Referring to FIGS. 4A to 5C together, a portion of the reference hard mask layer 410 may be removed to form a hard mask opening 412O. In a process of forming the hard mask opening 412O, the second reference hard mask layer 414 of the reference hard mask layer 410 may be removed and a portion of the first reference hard mask layer 412 may remain. For example, with respect to the results shown in FIGS. 4A to 4C, a blanket etch may be performed to remove the second reference hard mask layer 414 and a portion of an exposed first reference hard mask layer 412. At this time, the portion of the reference etch stop film 390 exposed at the bottom of the reference recess stitch region 410S may be also removed to form a first etch opening 390O1 that exposes the reference wiring insulating layer 350, in a portion corresponding to the reference recess stitch region 410S in the reference etch stop film 390. The first etch opening 390O1 may communicate with the hard mask opening 412O.

Referring to FIGS. 1A to 5C together, the hard mask opening 412O may correspond to the first opening MO1 of the first mask layer MK1 and the second opening MO2 of the second mask layer MK2, and may be formed in a portion of the reference hard mask layer 410 with which overlaps in the vertical direction (the Z direction), i.e., a portion of the first reference hard mask layer 412.

In this case, a first etch opening 390O1 may be formed in a portion of the reference etch stop film 390, which corresponds to a portion where the first opening MO1 of the first mask layer MK1 overlaps with the second opening MO2 of the second mask layer MK2 in the vertical direction (the Z direction), and the first etch opening 390O1 may communicate with the hard mask opening 412O. Specifically, the first etch opening 390O1 may be formed in the portion of the reference etch stop film 390, which corresponds to a portion adjacent to and overlapped with one end of each of the first cutting opening MO1a of the first mask layer MK1 and the second cutting opening MO2a of the second mask layer MK2 in the vertical direction (the Z direction), and the first etch opening 390O1 may communicate with the hard mask opening 412O.

Central lines (for example, lines C-C' in FIGS. 1A to 5C) in a long axis direction (for example, the Y direction) of the first cutting opening MO1a of the first mask layer MK1 and the second cutting opening MO2a of the second mask layer MK2 that partly overlap each other, may be located on the same straight line, and widths thereof in the short axis direction (for example, the X direction) may be the same. That is, the central lines in a long axis direction (for example, the Y direction) of the first cutting opening MO1a of the first mask layer MK1 and the second cutting opening MO2a of the second mask layer MK2 that partly overlap each other, may be located on the same straight line (for example, lines C-C' in FIGS. 1A to 5C) on the semiconductor substrate 110, the lower wiring layer 210, and the reference wiring insulating layer 350 which overlap each other in the vertical direction (the Z direction). Thus, the hard mask opening 412O formed correspondingly to the first cutting opening MO1a of the first mask layer MK1 and the second cutting opening MO2a of the second mask layer MK2 may have a shape extending in the second horizontal direction (the Y direction) with a constant width in the first horizontal direction (the X direction), similar to the hard mask opening 412O formed corresponding to the first extension opening MO1b of the first mask layer MK1 and the second extension opening MO2b of the second mask layer MK2. However, unlike the hard mask opening 412O formed correspondingly to the first extension opening MO1b of the first mask layer MK1 and the second extension opening MO2b of the second mask layer MK2, the hard mask opening 412O formed correspondingly to the first cutting opening MO1a of the first mask layer MK1 and the second cutting opening MO2a of the second mask layer MK2 may be formed so as to communicate with the first etch opening 390O1.

Herein, for convenience of understanding, the first opening MO1 of the first mask layer MK1 is separately described by dividing it into the first cutting opening MO1a and the first extension opening MO1b and the second opening MO2 of the second mask layer MK2 is also separately described by dividing it into the second cutting opening MO2a and the second extension opening MO2b. That is, even though it is separately described that an overlapping portion of the first opening MO1 of the first mask layer MK1 overlapping with the second opening MO2 of the second mask layer MK2 and a connected portion connected to the overlapping portion adjacent thereto is conceptually referred as the first cutting opening MO1a, and another portion of the first opening MO1 of the first mask layer MK1 is conceptually referred as the first extension opening MO1b, the first cutting opening MO1a and the first extension opening MO1b in the first mask layer MK1 may be oppositely referred to in another region depending on positions to be shown in other drawings, besides these drawings. Similarly, the second cutting opening MO2a and the second extension opening MO2b in the second mask layer MK2 may be oppositely referred in another region depending on positions to be shown in other drawings, besides these drawings.

Herein, all of the reference recess stitch region 410S of the reference hard mask layer 410, the second recess stitch region 412S of the first reference hard mask layer 412, the first recess stitch region 414S of the second reference hard mask layer 414, the first mask stitch region MS1 of the first opening MO1, and the second mask stitch region MS2 of the second opening MO2 may substantially overlap with each other in the vertical direction (the Z direction) with respect to the semiconductor substrate 110. Therefore, any portion of the integrated circuit device corresponding to (e.g., overlapped in the vertical direction (the Z direction) by) the reference recess stitch region 410S, the first recess stitch region 414S, the second recess stitch region 412S, the first mask stitch region MS1 and the second mask stitch region MS2 overlapping with each other in the vertical direction (the Z direction) with respect to the semiconductor substrate 110, may be defined as a stitch region.

Figure 6A:
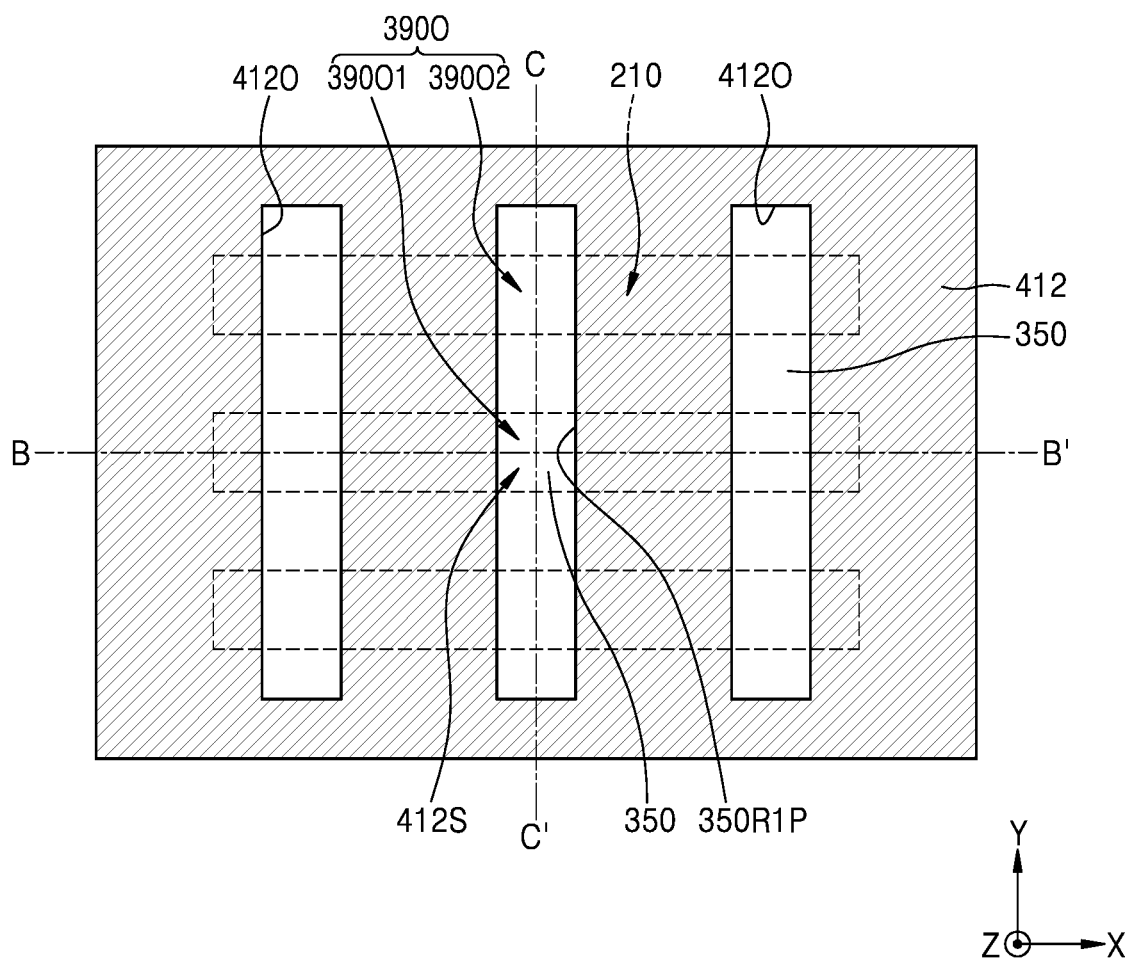
Figure 6B:
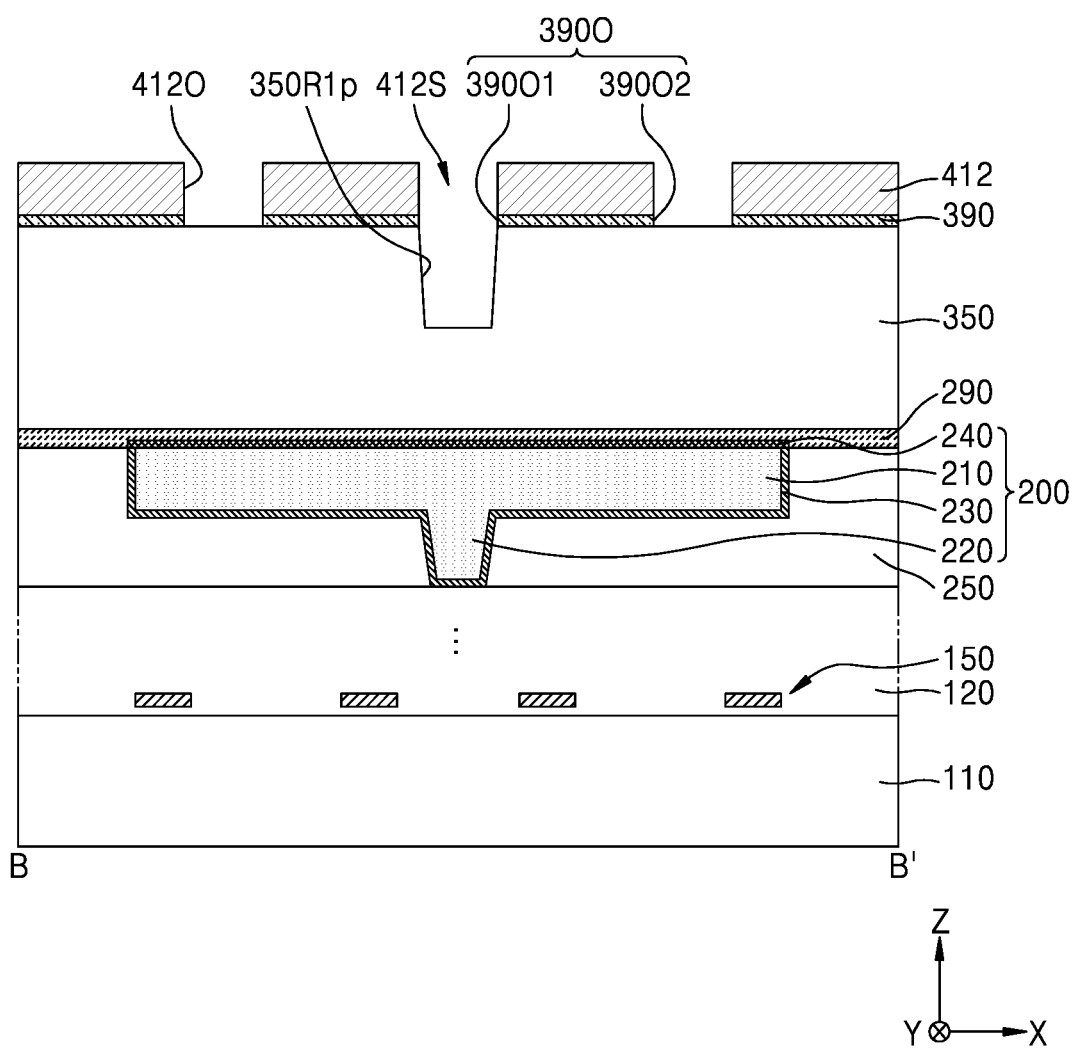
Figure 6C:
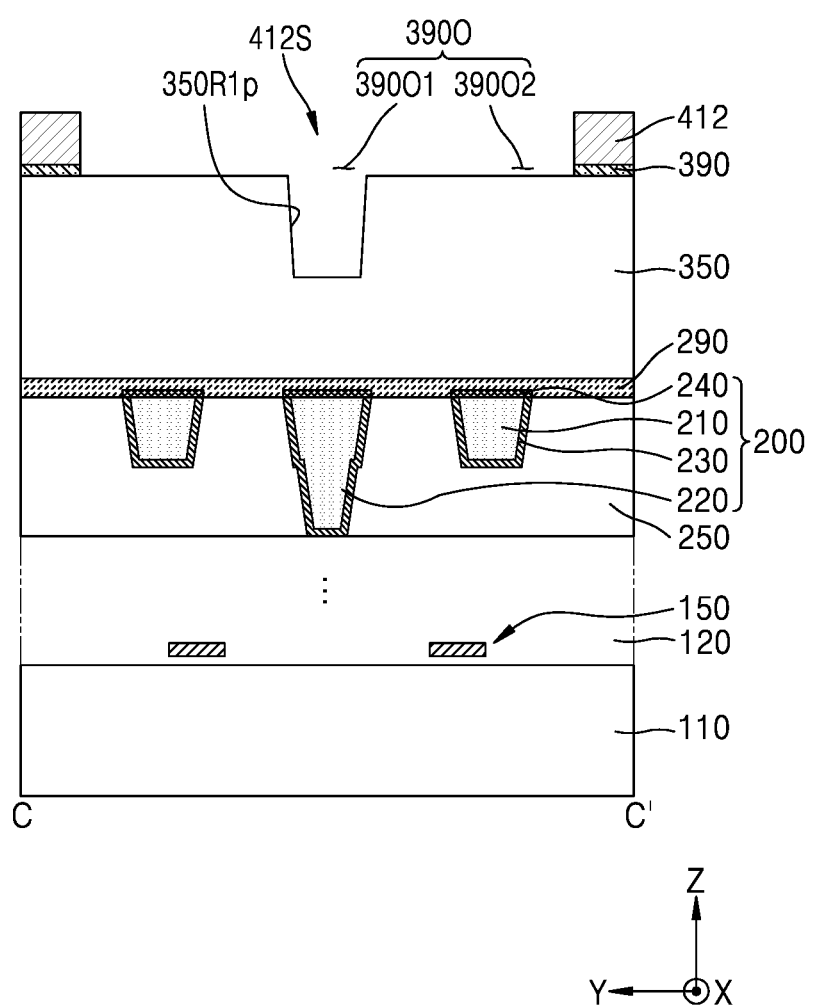

Referring to FIGS. 6A to 6C together, a portion of the reference etch stop film 390 may be removed by using the first reference hard mask layer 412 having the hard mask opening 412O as an etch mask, to form a second etch opening 390O2 exposing the reference wiring insulating layer 350. In a process of forming the second etch opening 390O2, a portion of an upper portion of the reference wiring insulating layer 350 exposed under the first etch opening 390O1 may be also removed, and thus a preliminary reference wiring recess 350R1p may be formed. The preliminary reference wiring recess 350R1p may extend downward from an upper surface of the reference wiring insulating layer 350, and a lower level of the preliminary reference wiring recess 350R1p may be lower than a level of the upper surface of the reference wiring insulating layer 350 and may be higher than a lower surface of the reference wiring insulating layer 350, so that a portion of the reference wiring insulating layer 350 may be maintained at an exposed state at the lower level of the preliminary reference wiring recess 350R1p.

The first etch opening 390O1 and the second etch opening 390O2 may together constitute a reference etch opening 390O.

Figure 7A:
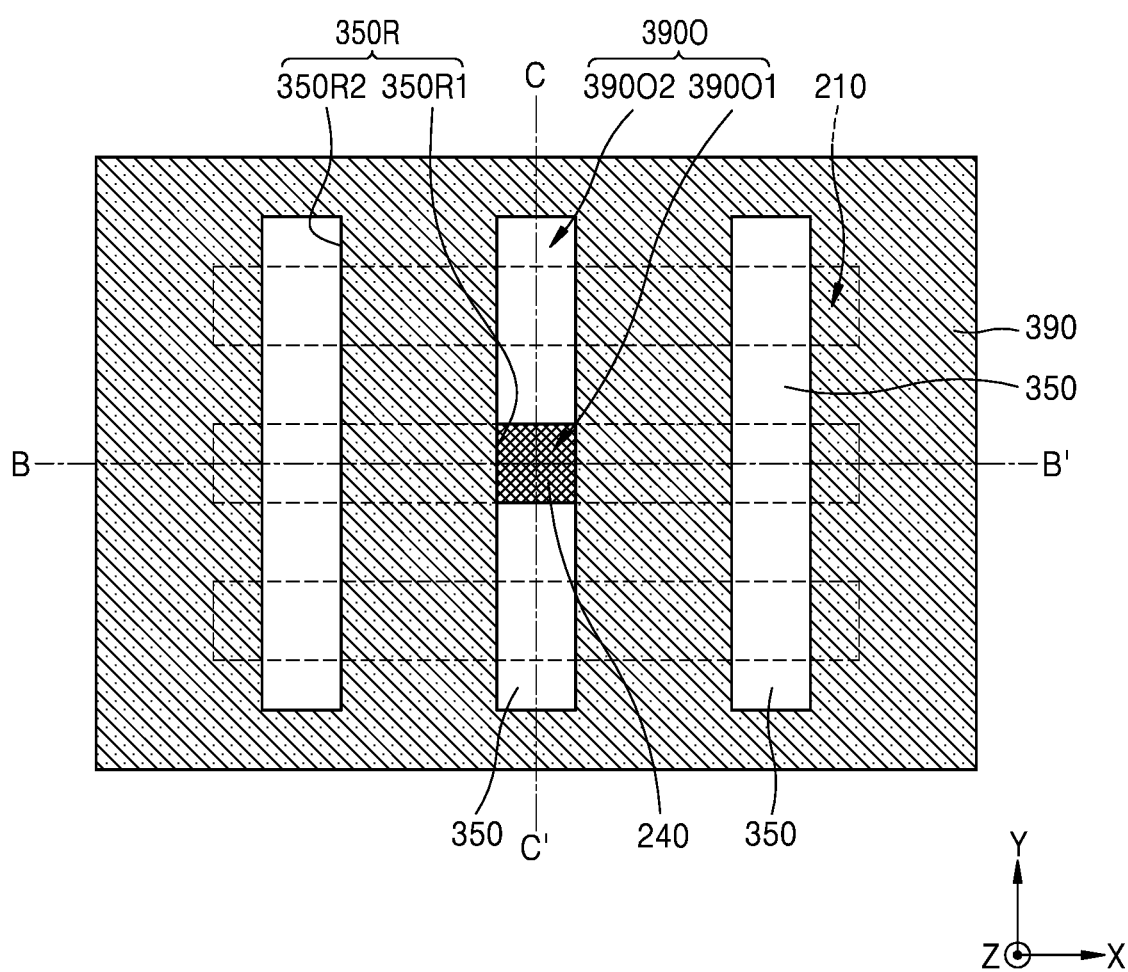
Figure 7B:
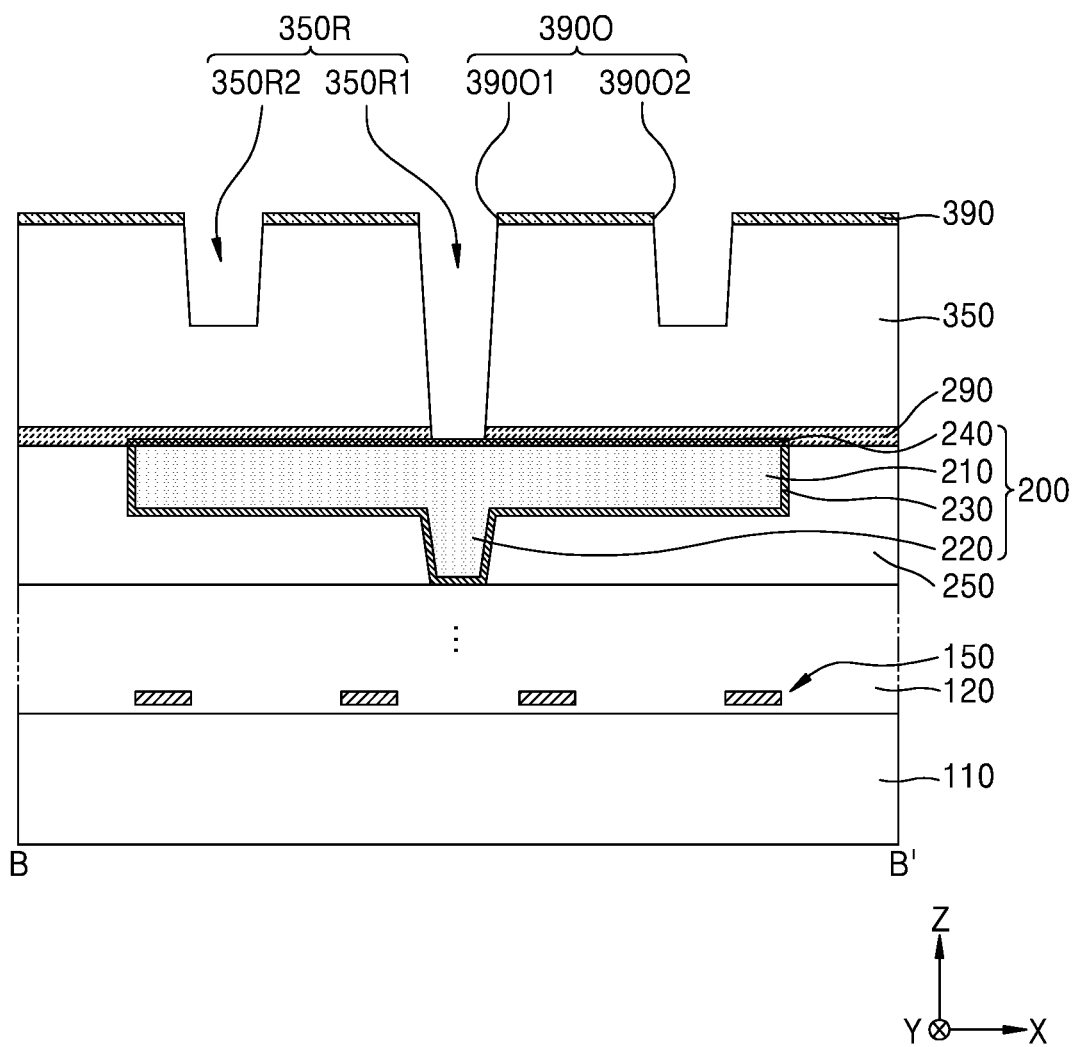
Figure 7C:
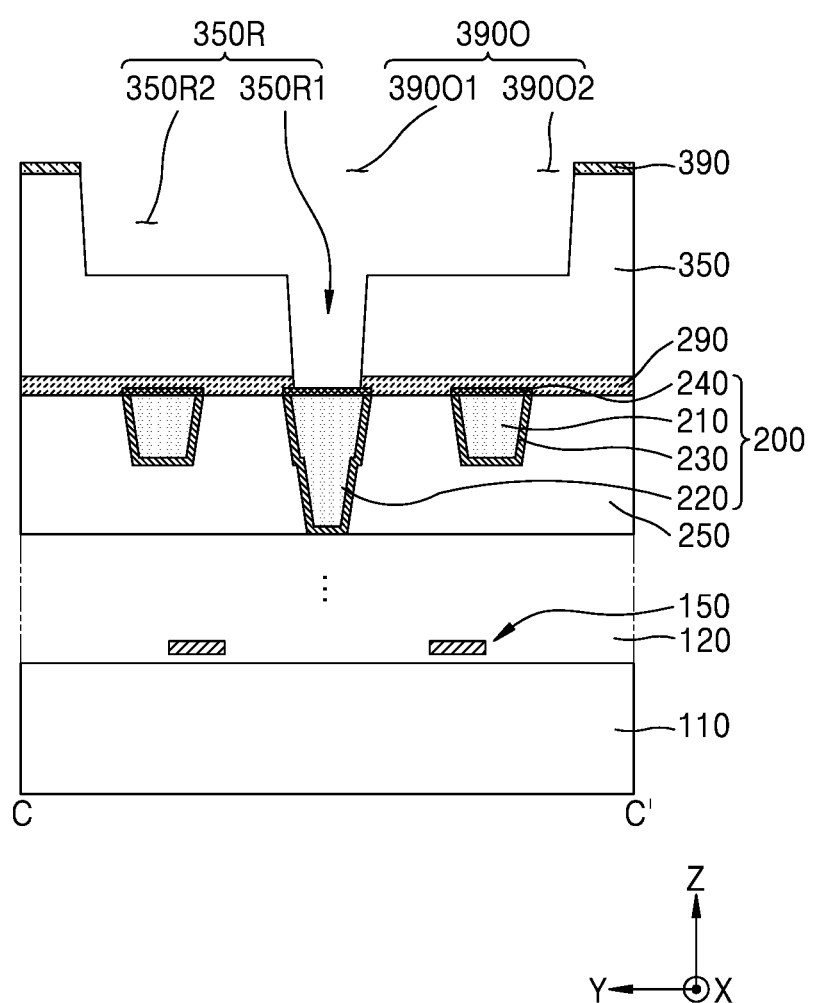

Referring to FIGS. 7A to 7C together, a reference wiring recess 350R may be formed by removing a portion of the reference wiring insulating layer 350 using the reference etch stop film 390 using the reference etch opening 390O as an etch mask. The reference wiring recess 350R may include a first reference wiring recess 350R1 and a second reference wiring recess 350R2.

Since a portion of the reference wiring insulating layer 350 is removed under a condition that the preliminary reference wiring recess 350R1p shown in FIGS. 6A to 6C is formed on a lower side of the first etch opening 390O1, a depth of the first reference wiring recess 350R1, which is a portion of the reference wiring recess 350R formed on the lower side of the first etch opening 390O1, may be greater than a depth of the second reference wiring recess 350R2, which is a portion of the reference wiring recess 350R formed on the lower side of the second etch opening 390O2.

The first reference wiring recess 350R1 may extend from the upper surface to the lower surface of the reference wiring insulating layer 350 so that the lower wiring structure 200 may be exposed by/through the lower level of the first reference wiring recess 350R1. The second reference wiring recess 350R2 may extend downward from the upper surface of the reference wiring insulating layer 350, and the lower level of the second reference wiring recess 350R2 may be lower than a level of the upper surface of the reference wiring insulating layer 350 and may be higher than the lower surface of the reference wiring insulating layer 350, so that a portion of the reference wiring insulating layer 350 may be maintained at an exposed state at the lower level of the second reference wiring recess 350R2. That is, the first reference wiring recess 350R1 may be formed by removing the reference wiring insulating layer 350 from the upper surface to the lower surface thereof, and the second reference wiring recess 350R2 may be formed by removing a portion of the upper portion of the reference wiring insulating layer 350.

Figure 8A:
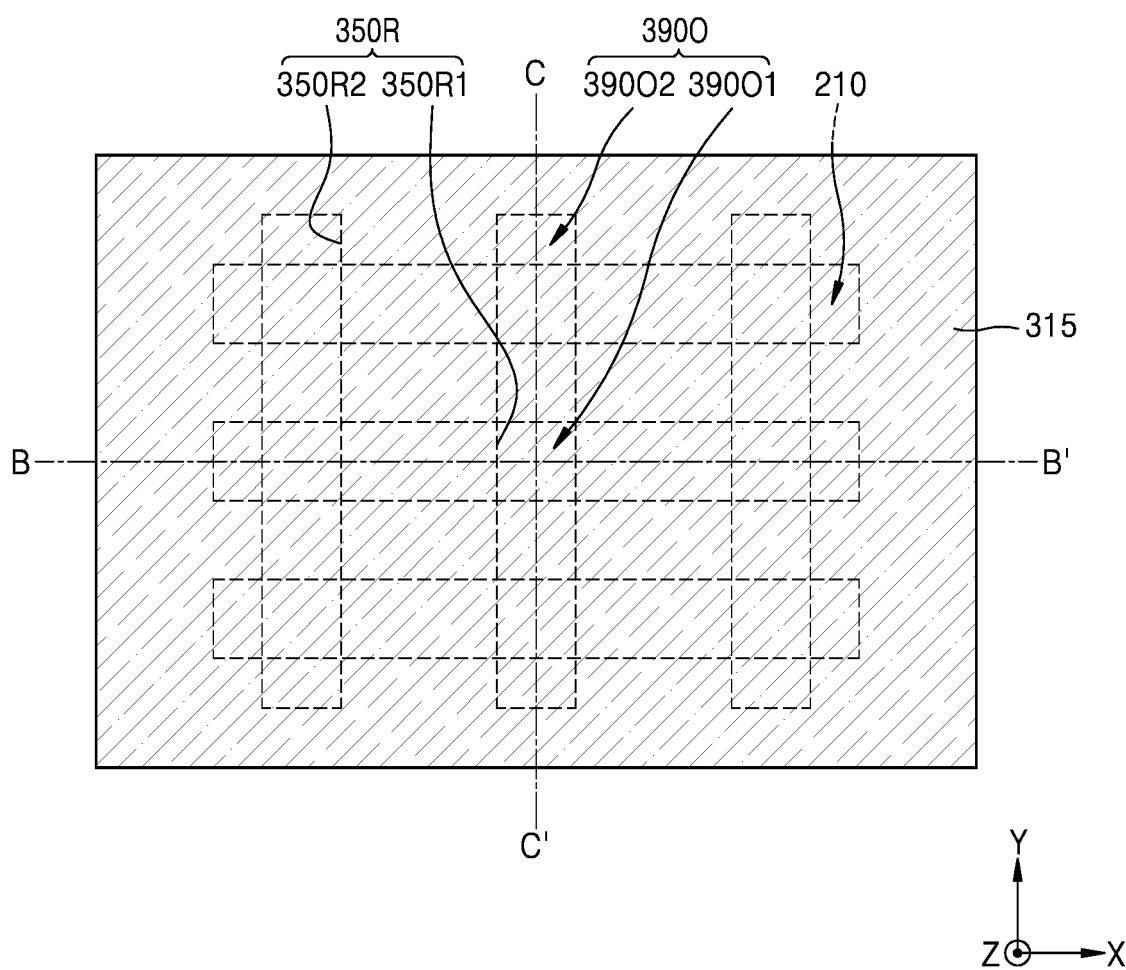
Figure 8B:
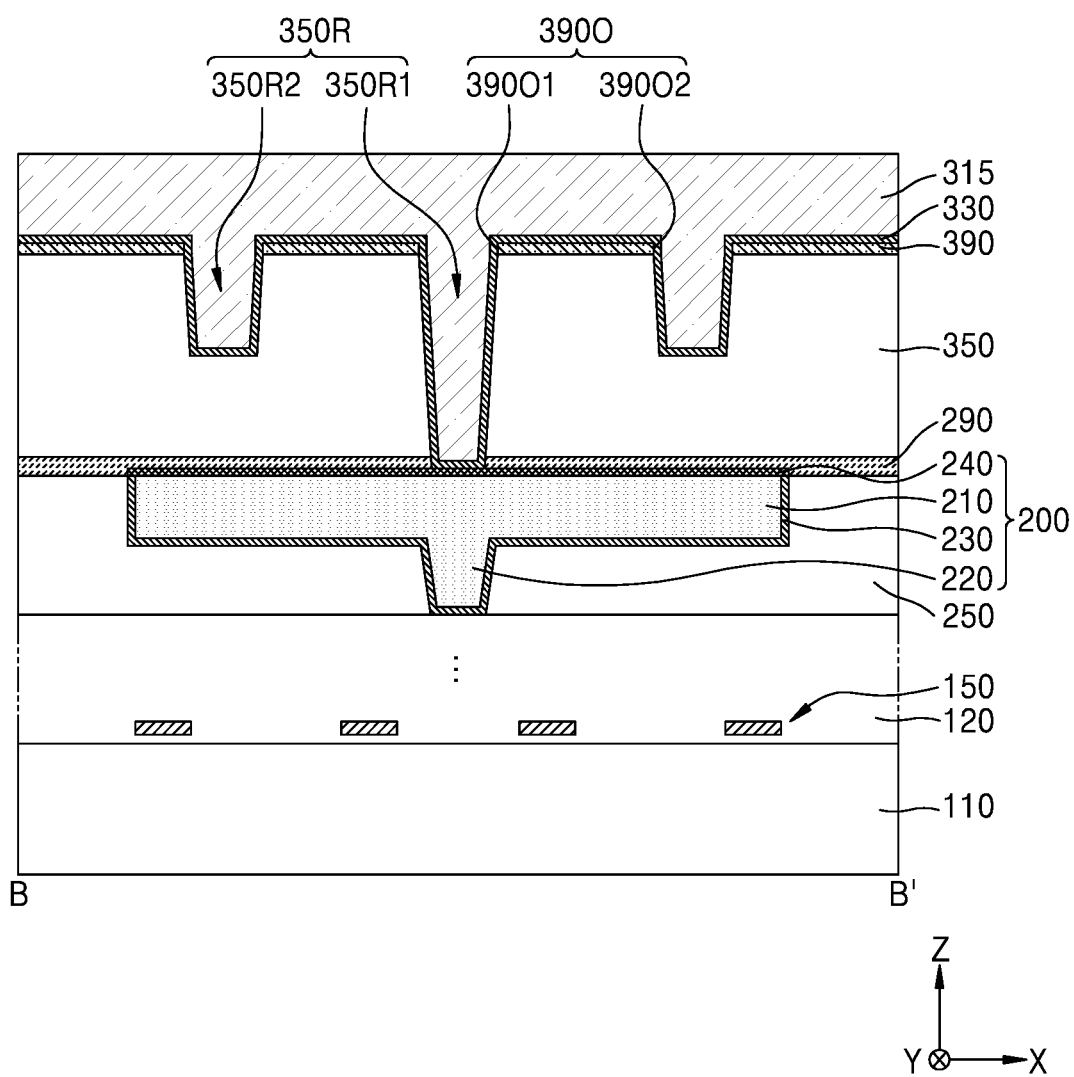
Figure 8C:
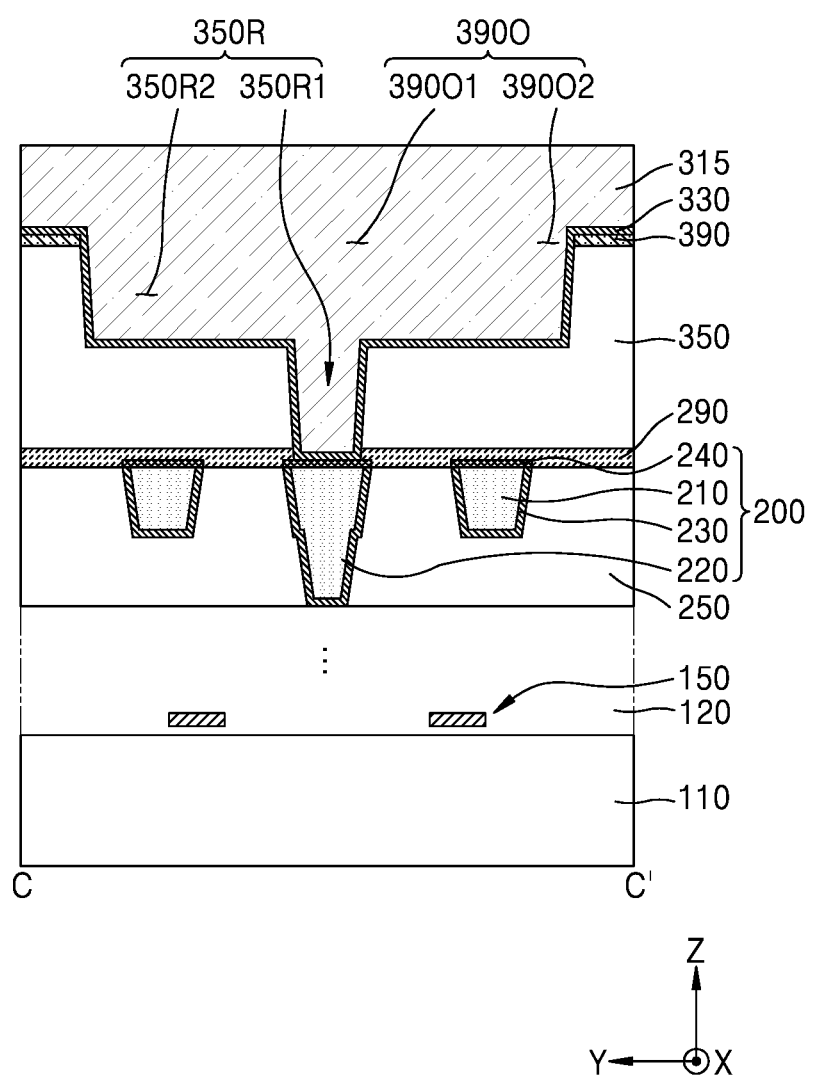
Figure 9A:
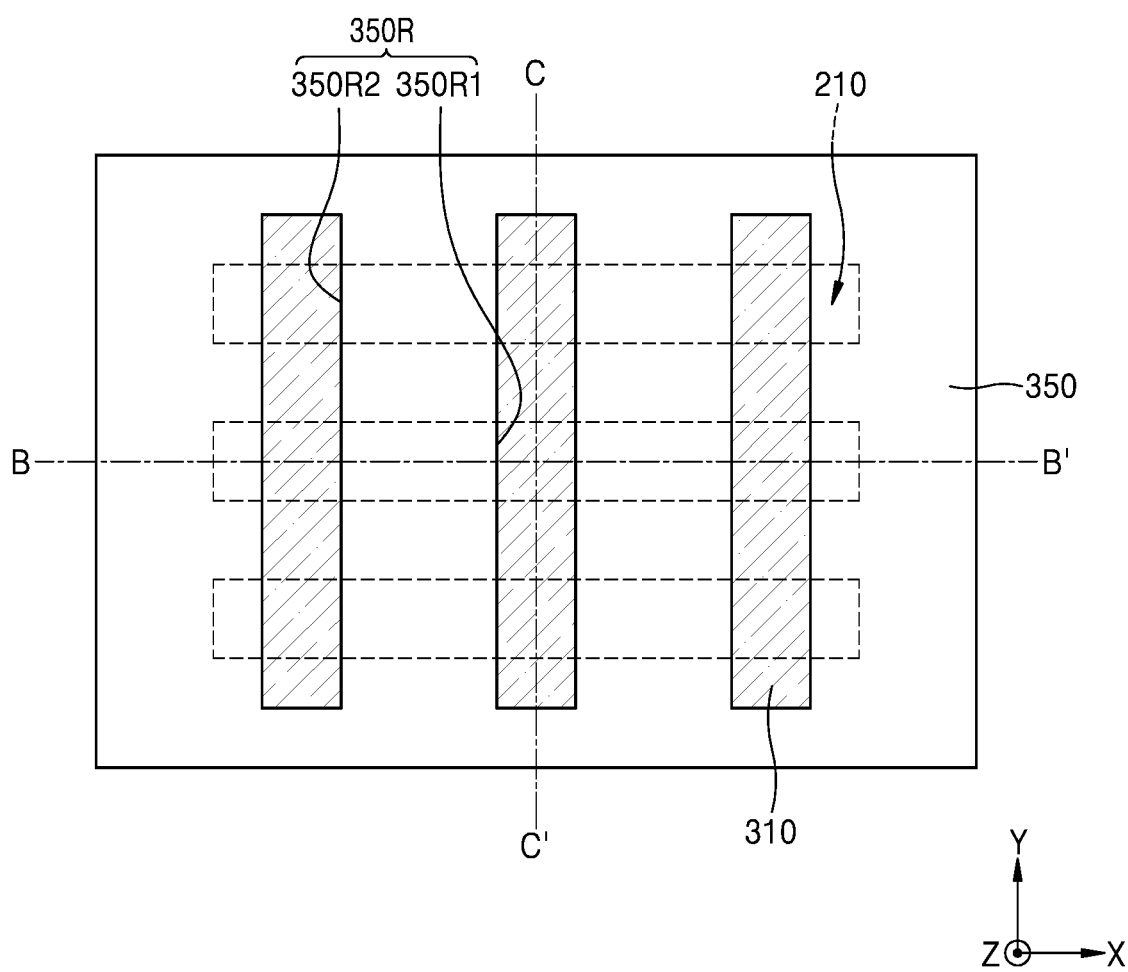
Figure 9B:
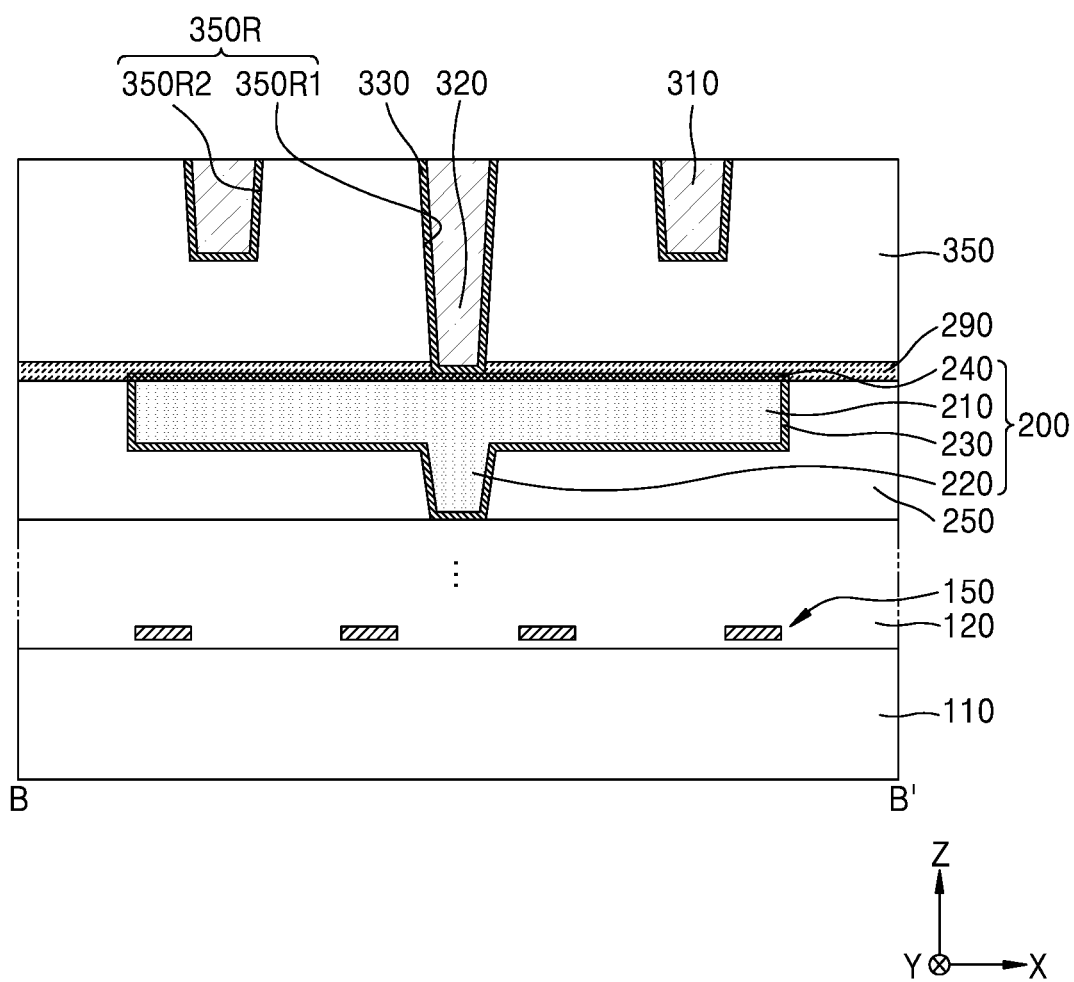
Figure 9C:
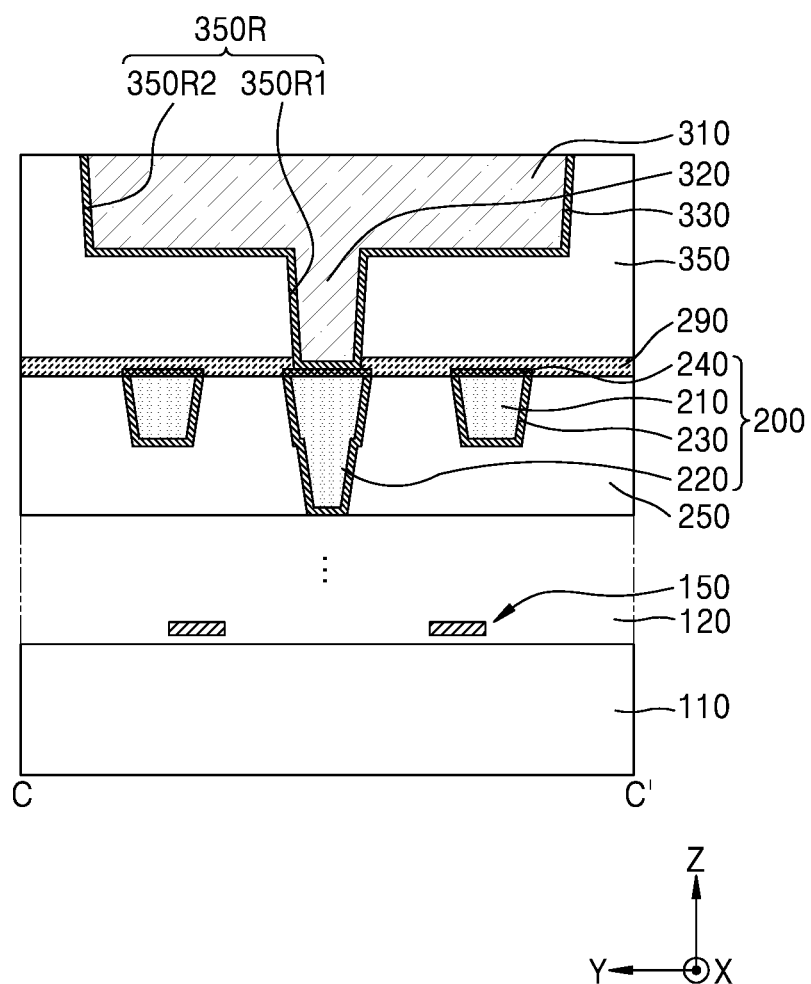

Referring to FIGS. 8A to 8C together, after forming the reference barrier layer 330 covering the reference etch stop film 390 and an exposed surface of the reference wiring insulating layer 350 having the reference wiring recess 350R, a reference wiring material layer 315 may be formed on the reference barrier layer 330. The reference barrier layer 330 may be conformally formed on the reference etch stop film 390 and the exposed surface of the reference wiring insulating layer 350 having the reference wiring recess 350R. The reference wiring material layer 315 may be formed in (e.g., to fill) the reference wiring recess 350R and on (e.g., to cover) the upper surface of the reference etch stop film 390.

The reference barrier layer 330 may include a nitride or an oxide of a metal such as Ti, Ta, Ru, Mn, Co, or W, or may include an alloy such as CoWP, CoWB, or CoWBP. The reference wiring material layer 315 may include a metal material such as W, Cu, Ti, Ta, Ru, Mn, or Co.

Referring to FIGS. 8A to 9C together, a portion of the reference wiring material layer 315 on (e.g., covering) the upper surface of the reference etch stop film 390 may be removed to form the reference wiring layer 310 and the reference via plug 320. The reference wiring layer 310 may refer to a portion of a remaining portion of the reference wiring material layer 315 located at a level higher than the bottom level of the second reference wiring recess 350R2, and the reference via plug 320 may refer to a portion of the remaining portion of the reference wiring material layer 315 located at a level lower than the bottom of the second reference wiring recess 350R2 and connected to the reference wiring layer 310. Thus, the reference wiring layer 310 may have a substantially constant height and width and may extend in the second horizontal direction (the Y direction), and the reference via plug 320 may have a substantially constant horizontal area under the reference wiring layer 310 or may extend in the vertical direction (the Z direction) toward the semiconductor substrate 110 with a continuously decreasing or increasing horizontal area.

In a process of forming the reference wiring layer 310 and the reference via plug 320, a portion of the reference barrier layer 330 covering the upper surface of the reference etch stop film 390 and the reference etch stop film 390 may be removed together, so that the upper surface of the reference wiring insulating layer 350 may be exposed.

In order to form the reference wiring layer 310 and the reference via plug 320, a process of removing a portion of the reference wiring material layer 315 may be performed by a chemical-mechanical polishing (CMP) method. In the process of forming the reference wiring layer 310 and the reference via plug 320, the reference etch stop film 390 may be completely removed.

Figure 10A:
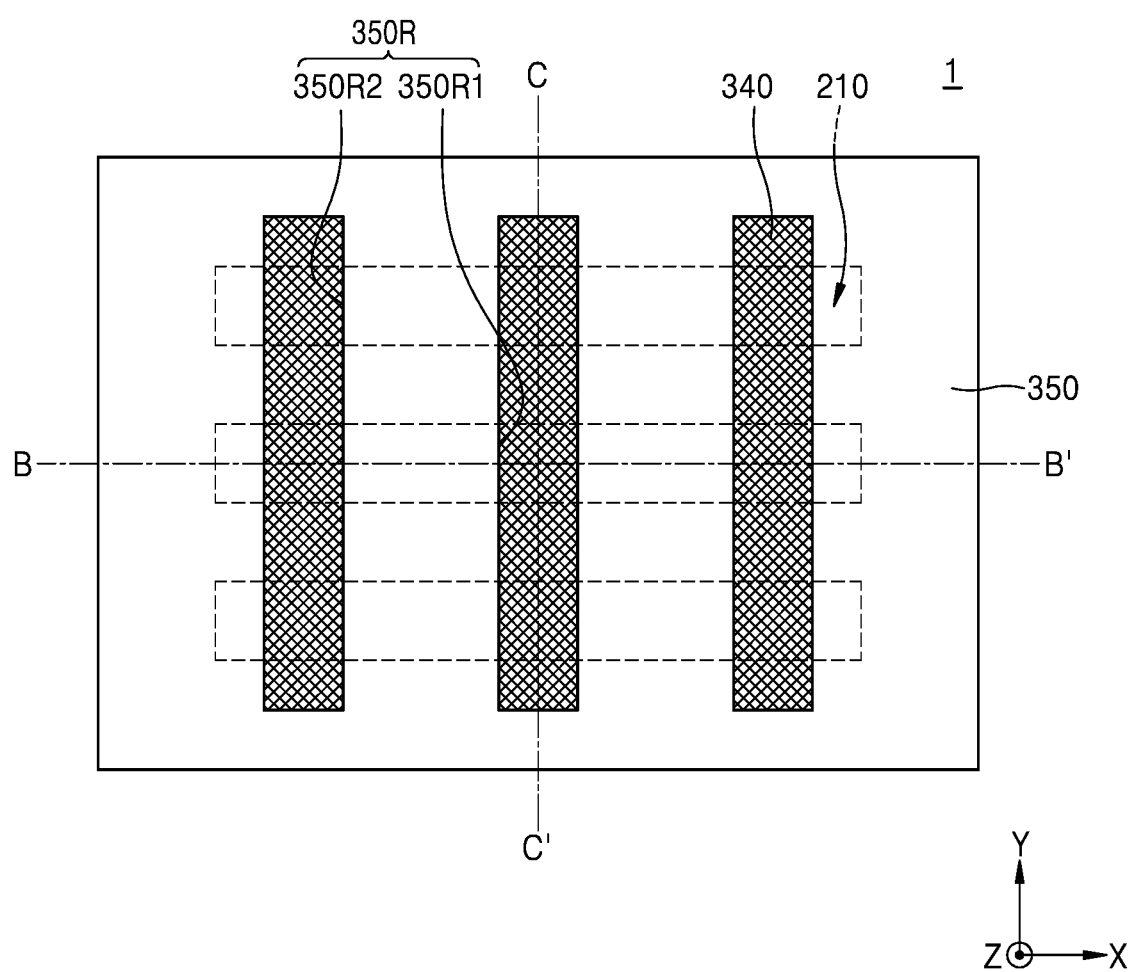
FIGS. 10A to 10C are a plan view and cross-sectional views illustrated for explaining a method of manufacturing an integrated circuit device, according to example embodiments of the inventive concepts, wherein specifically.
Figure 10B:
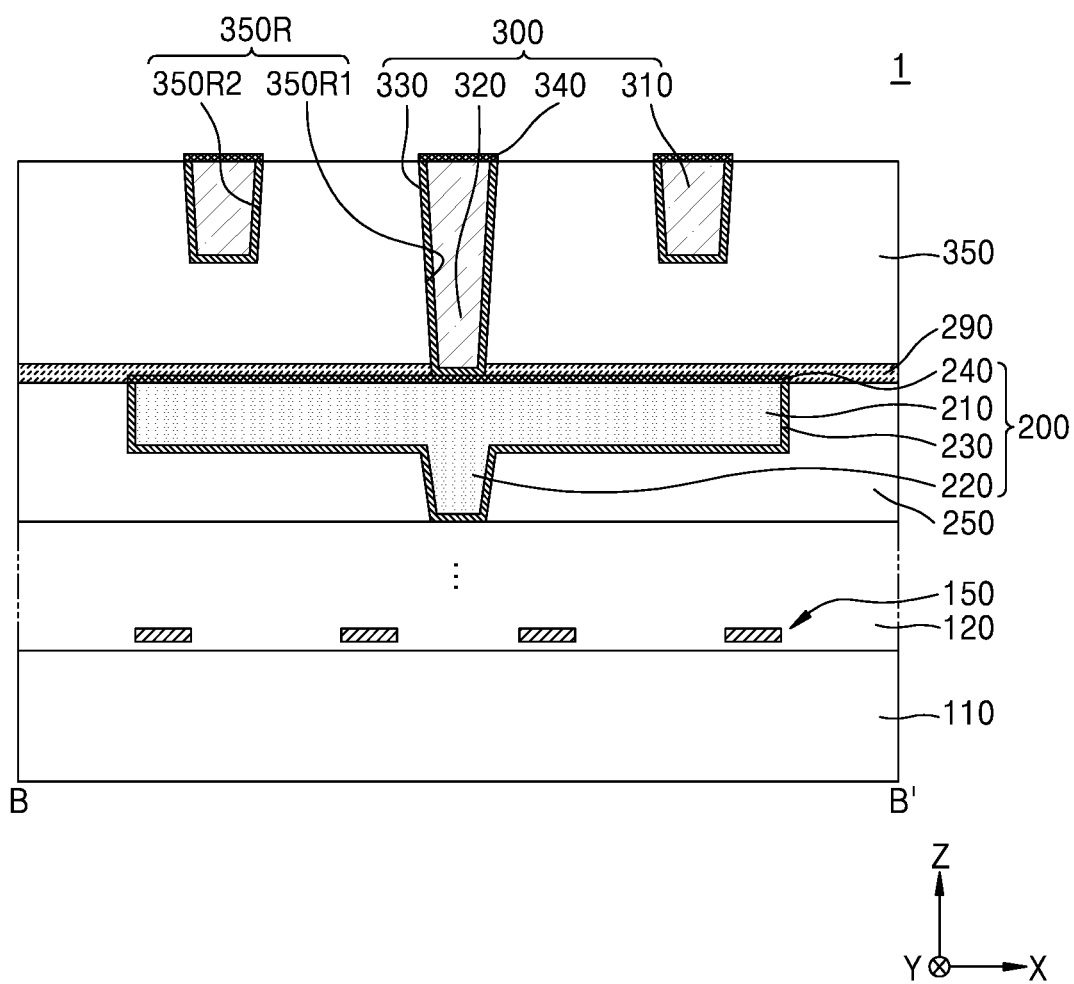
Figure 10C:
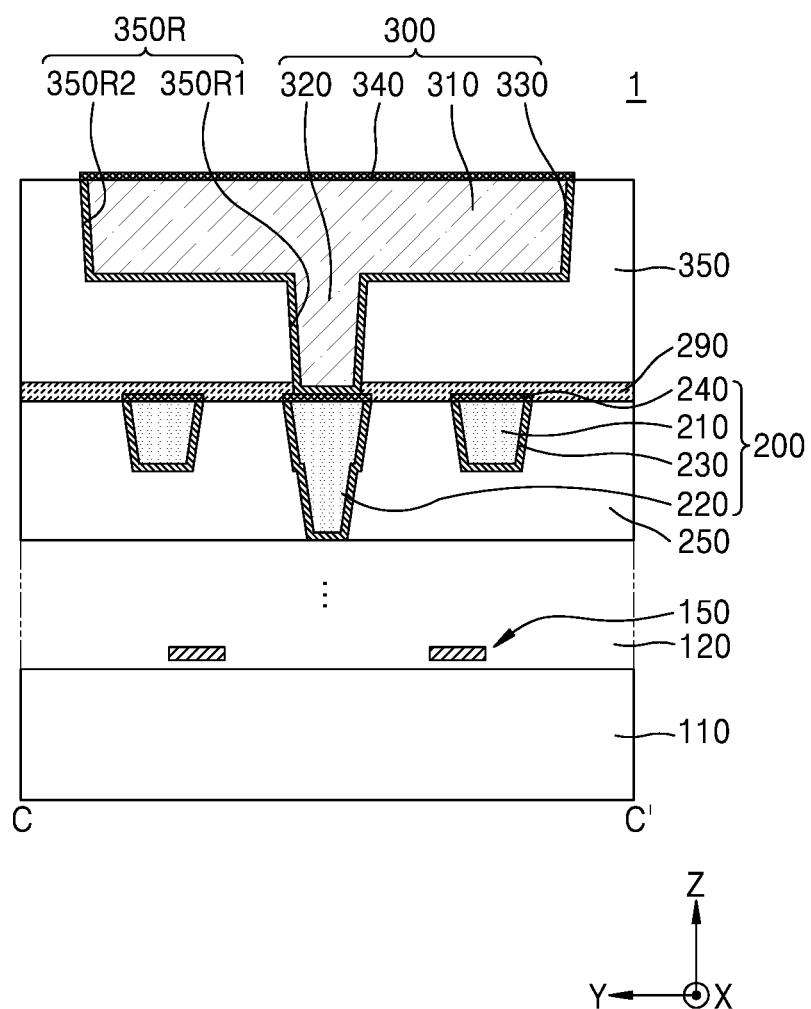

FIGS. 10A to 10C are a plan view and cross-sectional views illustrated for explaining a method of manufacturing an integrated circuit device, according to example embodiments of the inventive concepts. Specifically, FIGS. 10B and 10C are cross-sectional views taken along lines B-B' and C-C' in FIG. 10A. In FIGS. 10A to 10C, the same reference numerals as in FIGS. 1A to 9C denote the same members, and a repeated detailed description thereof may be omitted herein.

Referring to FIGS. 10A to 10C, an integrated circuit device 1 may include the device layer 120 including a plurality of semiconductor devices 150, the lower wiring structure 200, and a reference wiring structure 300. The lower wiring structure 200 may be electrically connected to each semiconductor device 150, so that the lower wiring structure 200 may provide electrical connections between the plurality of semiconductor devices 150 and electrical connections between the plurality of semiconductor devices 150 and the reference wiring structure 300.

The lower wiring structure 200 may include the lower wiring layer 210 and the lower via plug 220 connected to the lower wiring layer 210. The lower wiring insulation layer 250 may fill the space between the lower wiring layer 210 and the lower via plug 220. In some embodiments, the lower wiring layer 210 and the lower via plug 220 that are in contact with each other may be formed integrally.

The lower wiring layer 210 may be formed in plural as a line shape, extending in the first horizontal direction (the X direction) in parallel with each other. The lower via plug 220 may extend from the bottom surface of the lower wiring layer 210 toward the semiconductor substrate 110.

The lower wiring structure 200 may further include the lower barrier layer 230 surrounding bottom surfaces and side surfaces of the lower wiring layer 210 and the lower via plug 220. The lower barrier layer 230 may be disposed between (a) the lower wiring layer 210 and the lower via plug 220 and (b) the lower wiring insulating layer 250. In some embodiments, the lower wiring structure 200 may further include the lower cover layer 240 covering the upper surface of the lower wiring layer 210.

The lower etch stop film 290 may cover the upper surfaces of the lower wiring structure 200 and the lower wiring insulating layer 250. The lower etch stop film 290 may cover a portion of the upper surface of the lower wiring layer 210 or a portion of the upper surface of the lower cover layer 240. The reference wiring structure 300 may be connected to a portion that is not covered with the lower etch stop film 290, in the upper surface of the lower wiring layer 210 or the upper surface of the lower cover layer 240.

The reference wiring structure 300 may include the reference wiring layer 310 and the reference via plug 320 connected to the reference wiring layer 310. The reference wiring insulating layer 350 may fill the space between the reference wiring layer 310 and the reference via plug 320. In some embodiments, the reference wiring layer 310 and the reference via plug 320 that are in contact with each other may be formed integrally.

The reference wiring layer 310 may be formed in plural in the shape of lines extending in parallel to each other in the second horizontal direction (the Y direction). The reference via plug 320 may extend from the bottom surface of the reference wiring layer 310 toward the semiconductor substrate 110, to be electrically connected to the lower wiring structure 200.

The reference wiring structure 300 may further include the reference barrier layer 330 surrounding the bottom surface and the side surfaces of the reference wiring layer 310 and the reference via plug 320. The reference barrier layer 330 may be disposed between (a) the reference wiring layer 310 and the reference via plug 320 and (b) the reference wiring insulating layer 350. In some embodiments, the reference wiring structure 300 may further include the reference cover layer 340 that covers the upper surface of the reference wiring layer 310.

The lower etch stop film 290 may be disposed between the lower wiring insulating layer 250 and the reference wiring insulating layer 350. However, since the reference etch stop film 390 shown in FIGS. 1A to 8C may be completely removed as described with reference to FIGS. 9A to 9C, the reference etch stop film 390 may not remain on the reference wiring insulating layer 350 and the reference wiring structure 300. Therefore, the reference etch stop film 390 may not be disposed between the reference wiring insulating layer 350 and an insulating layer disposed on an upper side of the reference wiring insulating layer 350, for example, the upper wiring insulating layer 650 shown in FIGS. 11A to 11C, so that the upper surface of the reference wiring insulating layer 350 and a lower surface of the upper wiring insulating layer 650 may contact with each other.

Referring to FIGS. 1A to 10C together, the reference via plug 320 included in the integrated circuit device 1 according to the inventive concepts may be a fully-aligned-via (FAV). The reference via plug 320 may be formed in a portion of the reference wiring insulating layer 350 corresponding to a portion where the first opening MO1 of the first mask layer MK1 overlaps with the second opening MO2 of the second mask layer MK2, namely, a portion where the first mask stitch region MS1 overlaps with the second mask stitch region MS2.

Specifically, the reference via plug 320 may be aligned by a width in the first horizontal direction (the X direction) of each of the first opening MO1 and the second opening MO2, and thus a width in the first horizontal direction (the X direction) of the reference via plug 320 may be determined/controlled, and may also be aligned by a width in the second horizontal direction (the Y direction) of a portion where the first opening MO1 and the second opening MO2 overlap with each other, namely, a portion where the first mask stitch region MS1 and the second mask stitch region MS2 overlap with each other, and thus a width in the second horizontal direction (the Y direction) of the reference via plug 320 may be determined/controlled.

Therefore, unlike a via plug in a self-aligned via (SAV) in which the via plug is aligned by a width of an opening of a mask layer for forming a wiring layer and a width of the via plug is confined in only one direction, for example, in the first horizontal direction (the X direction), widths of both the first horizontal direction (the X direction) and the second horizontal direction (the Y direction) perpendicular to each other in the reference via plug 320 may be confined, and thus electrical reliability of the integrated circuit device 1 may be improved.

In some embodiments, the lower via plug 220 may be, but is not limited to, the SAV, and may be the FAV.

FIGS. 11A to 15C are plan views and cross-sectional views illustrated in accordance with a process sequence for explaining a method of manufacturing an integrated circuit device, according to example embodiments of the inventive concepts. Specifically, each of FIGS. 11B, 12B, 13B, 14B, and 15B and each of FIGS. 11C, 12C, 13C, 14C, and 15C are cross-sectional views taken along lines B-B' and C-C' of each of FIGS. 11A, 12A, 13A, 14A, and 15A. In FIGS. 11A to 15C, the same reference numerals as in FIGS. 1A to 10C denote the same members, and a repeated detailed description thereof may be omitted herein.

Figure 11A:
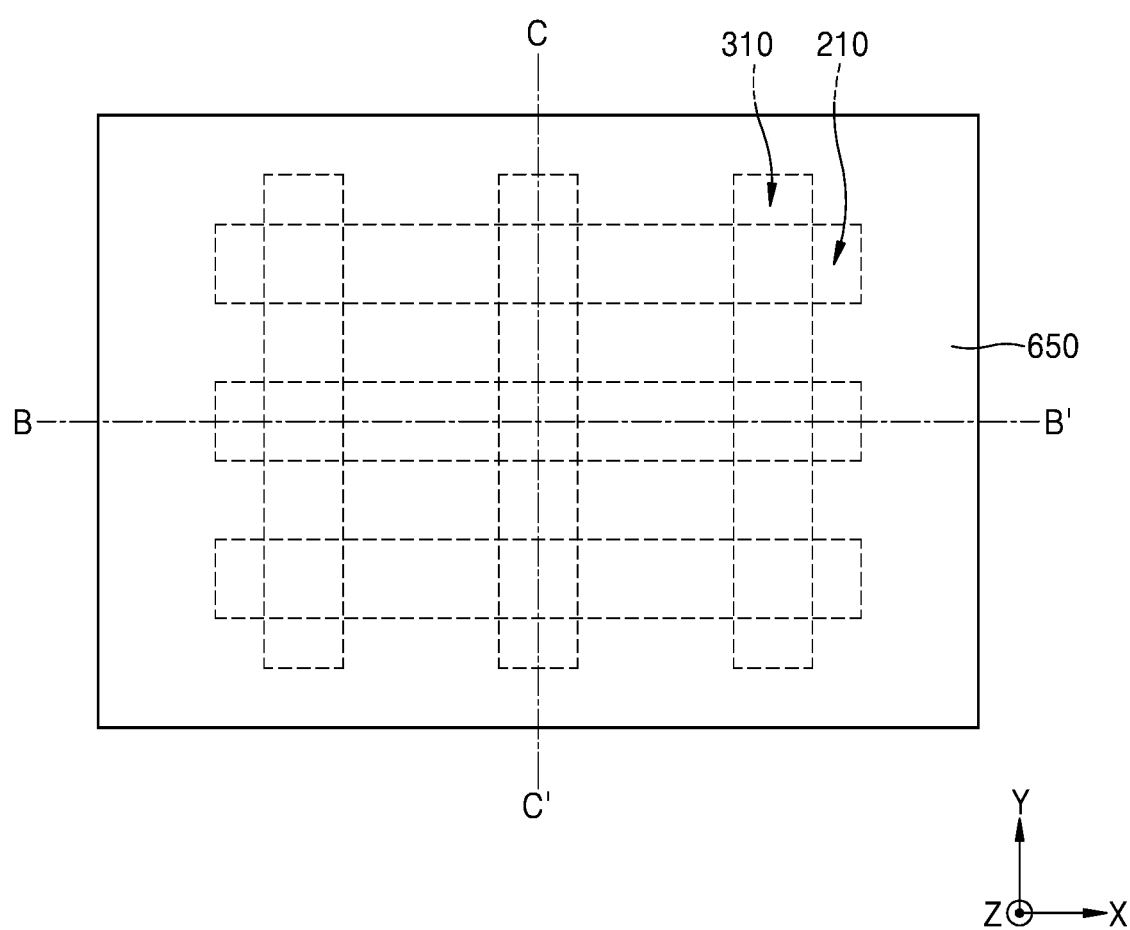
FIGS. 11A to 15C are plan views and cross-sectional views illustrated in accordance with a process sequence for explaining a method of manufacturing an integrated circuit device, according to example embodiments of the inventive concepts, wherein specifically, each of FIGS. 11B, 12B, 13B, 14B, and 15B and each of FIGS. 11C, 12C, 13C, 14C, and 15C are cross-sectional views taken along lines B-B' and C-C' of each of FIGS. 11A, 12A, 13A, 14A, and 15A.
Figure 11B:
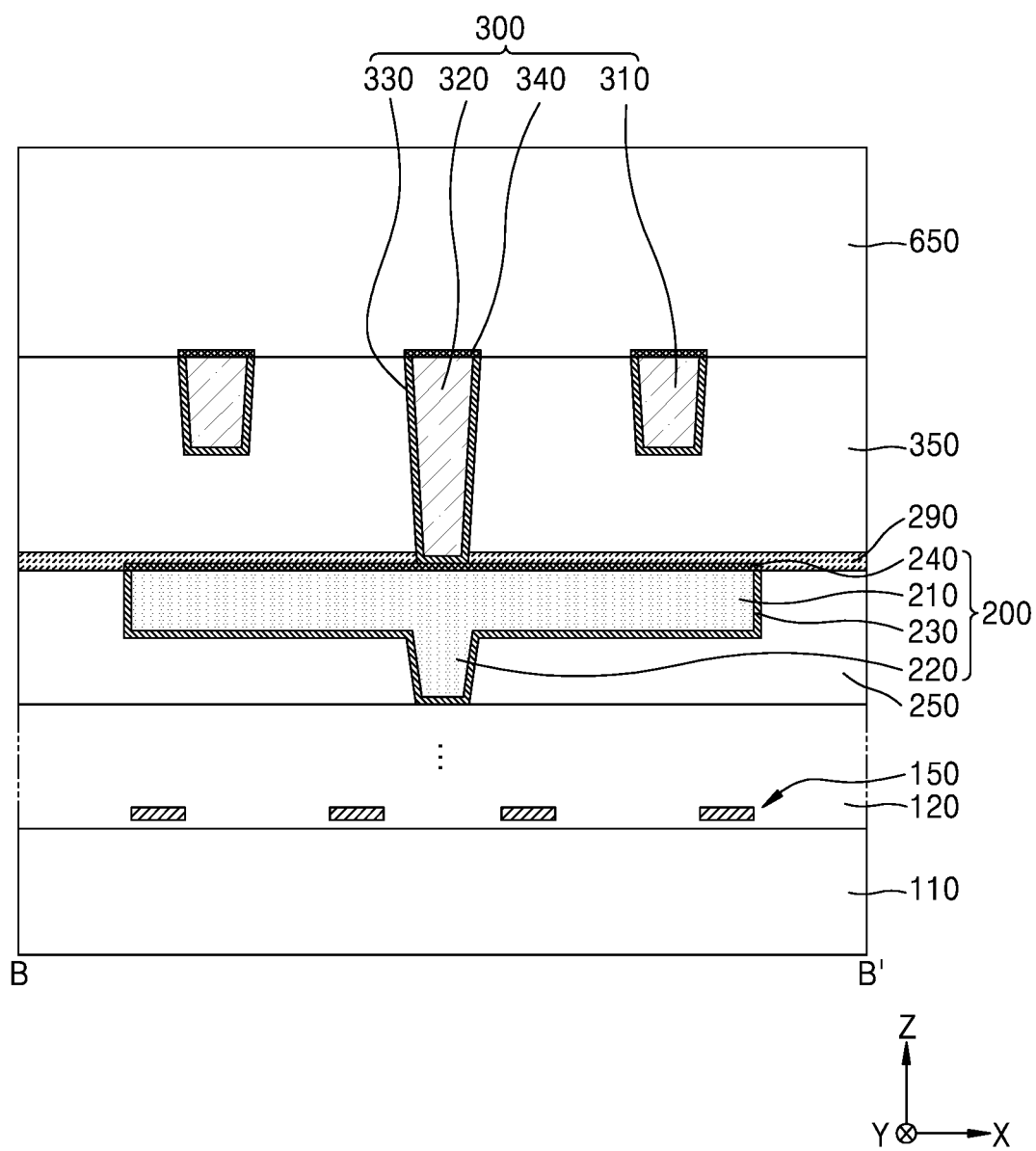
Figure 11C:
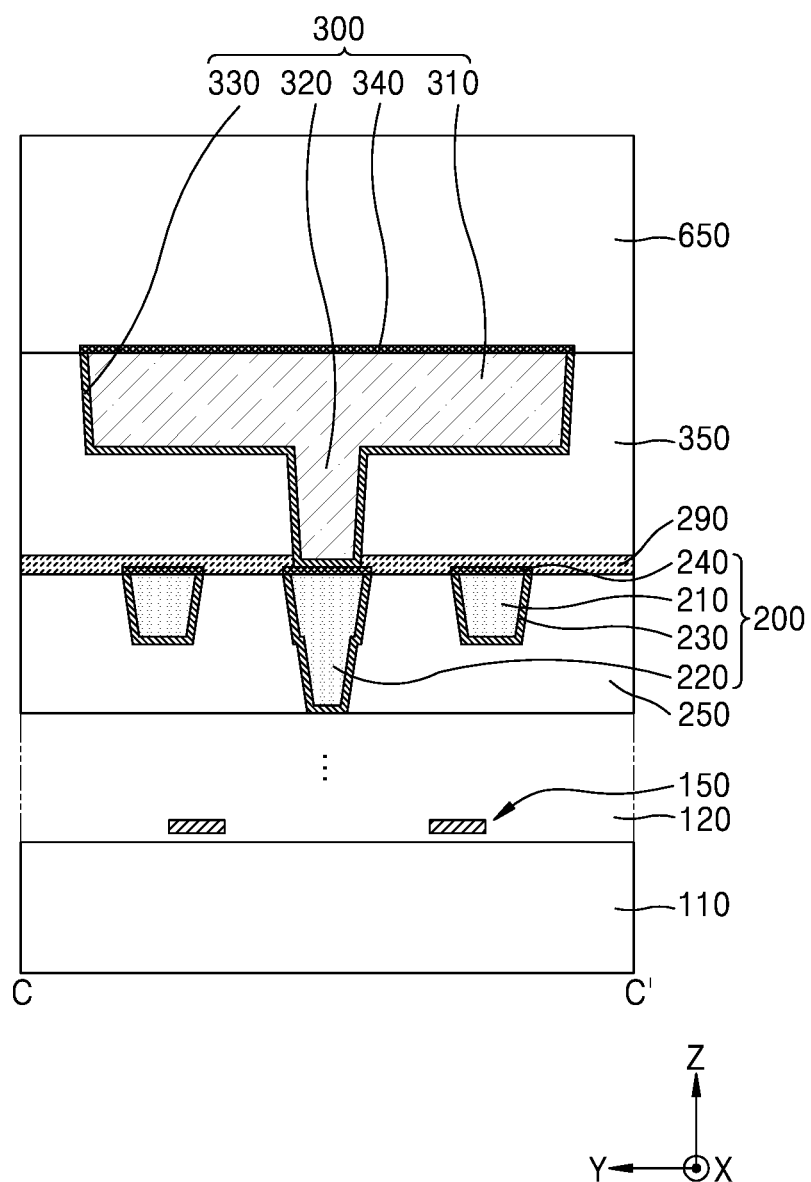

Referring to FIGS. 11A to 11C together, the upper wiring insulating layer 650 may be formed on the result of FIGS. 10A to 10C, namely, on the reference wiring structure 300 and the reference wiring insulating layer 350. An upper surface of the reference wiring insulating layer 350 and a lower surface of the upper wiring insulating layer 650 may contact each other.

For example, the upper wiring insulating layer 650 may include a silicon oxide, or an insulating material having a dielectric constant lower than that of the silicon oxide. In some embodiments, the upper wiring insulating layer 650 may include a TEOS film, or an ULK film having the ultra low dielectric constant of 2.2 to 2.4. The ULK film may include a SiOC film or a SiCOH film.

Figure 12A:
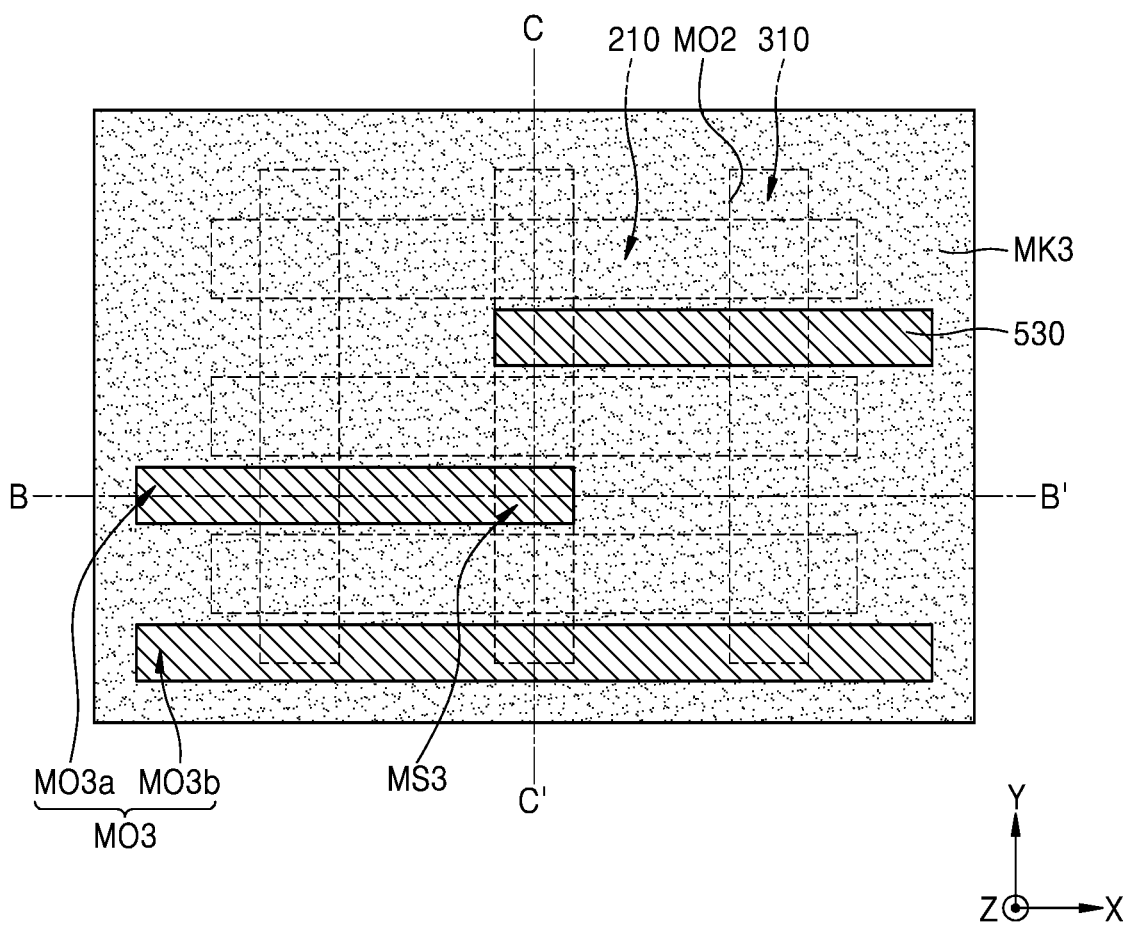
Figure 12B:
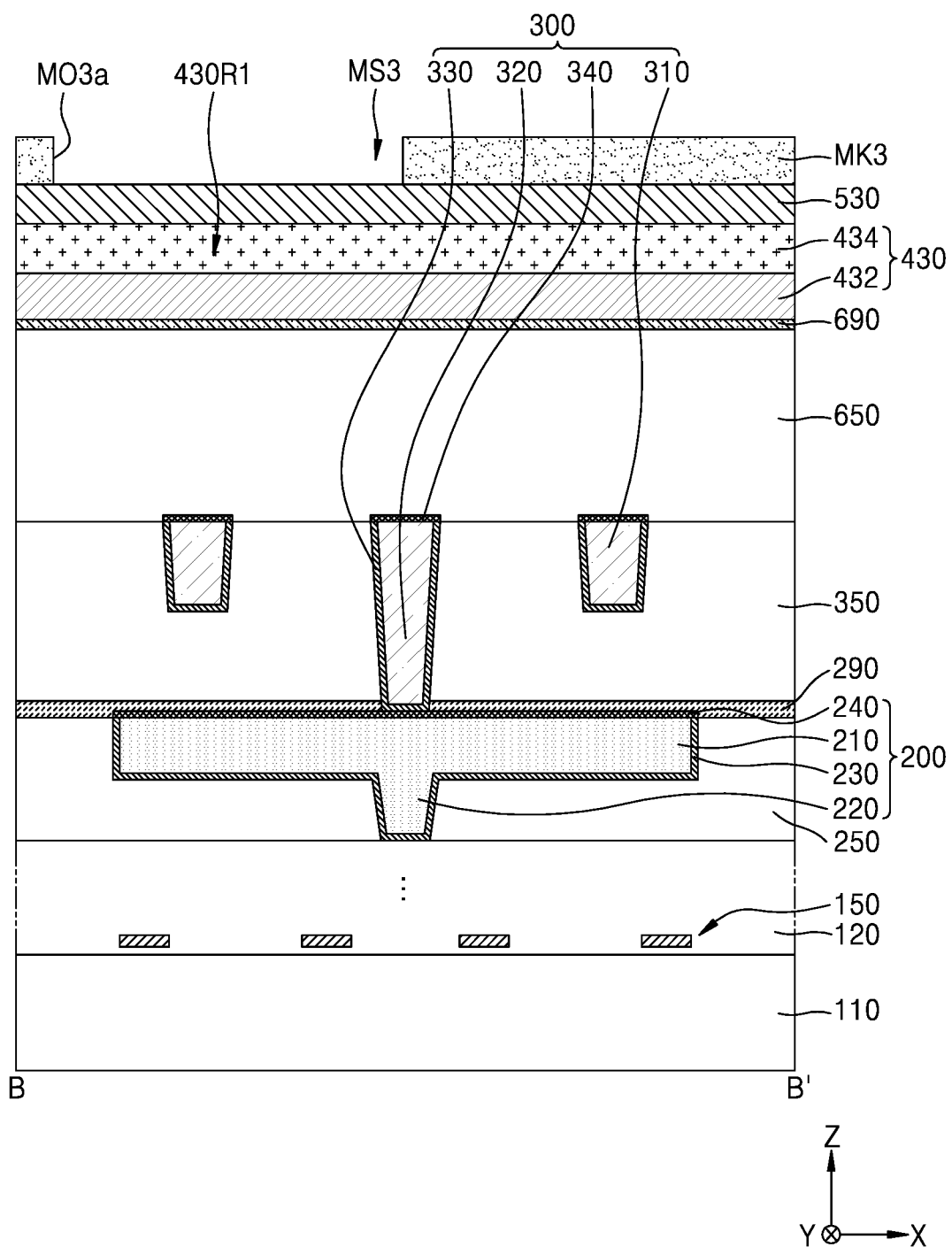
Figure 12C:
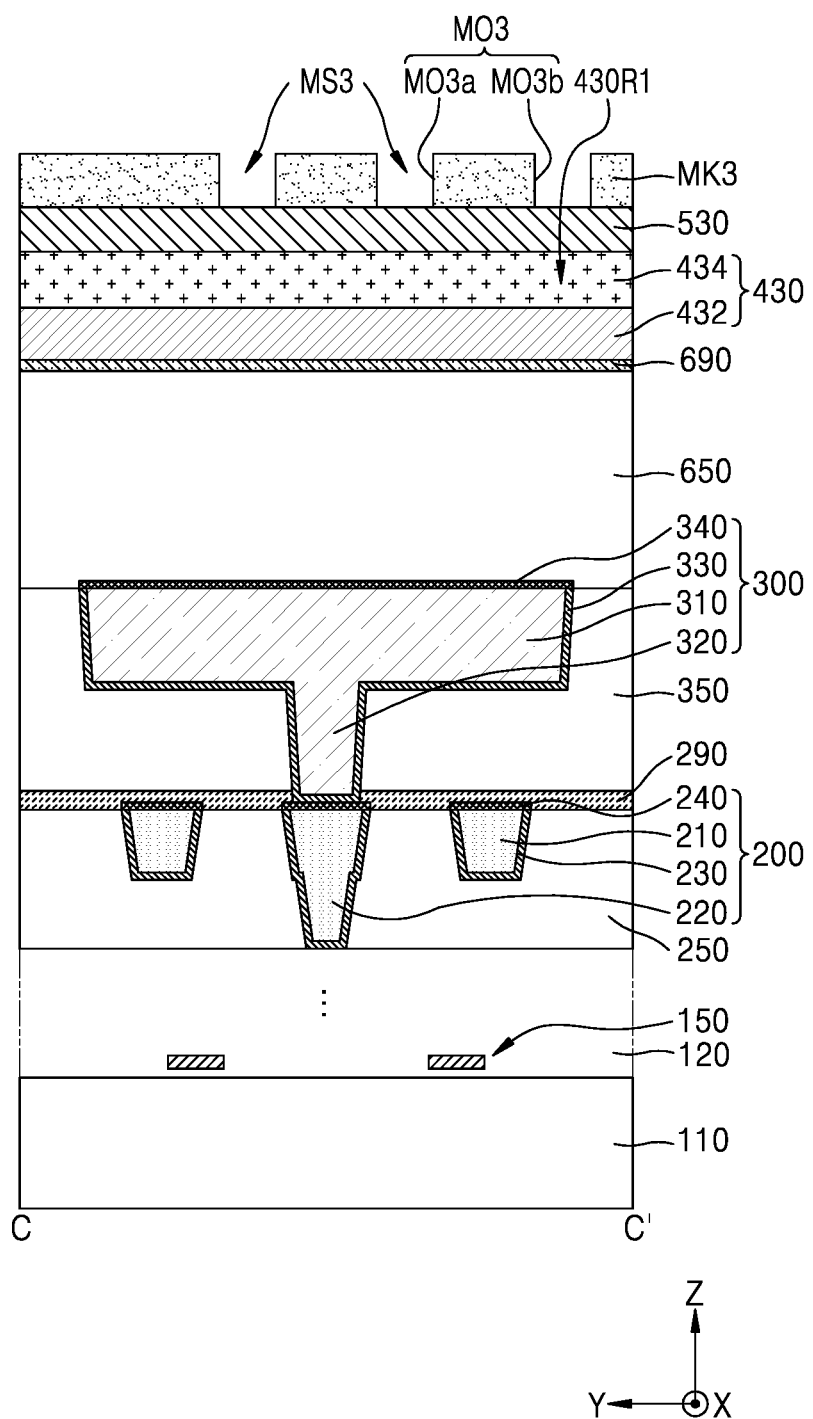
Figure 13A:
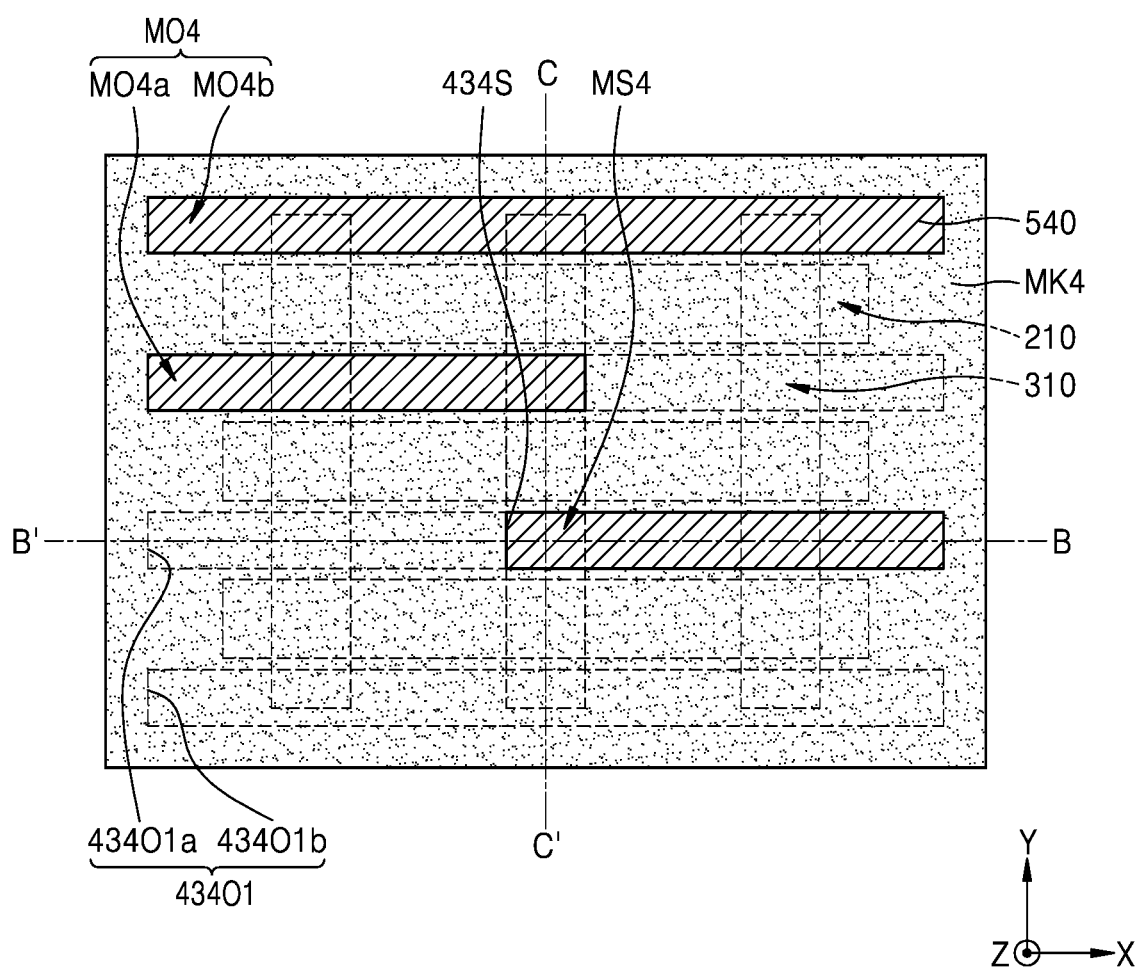
Figure 13B:
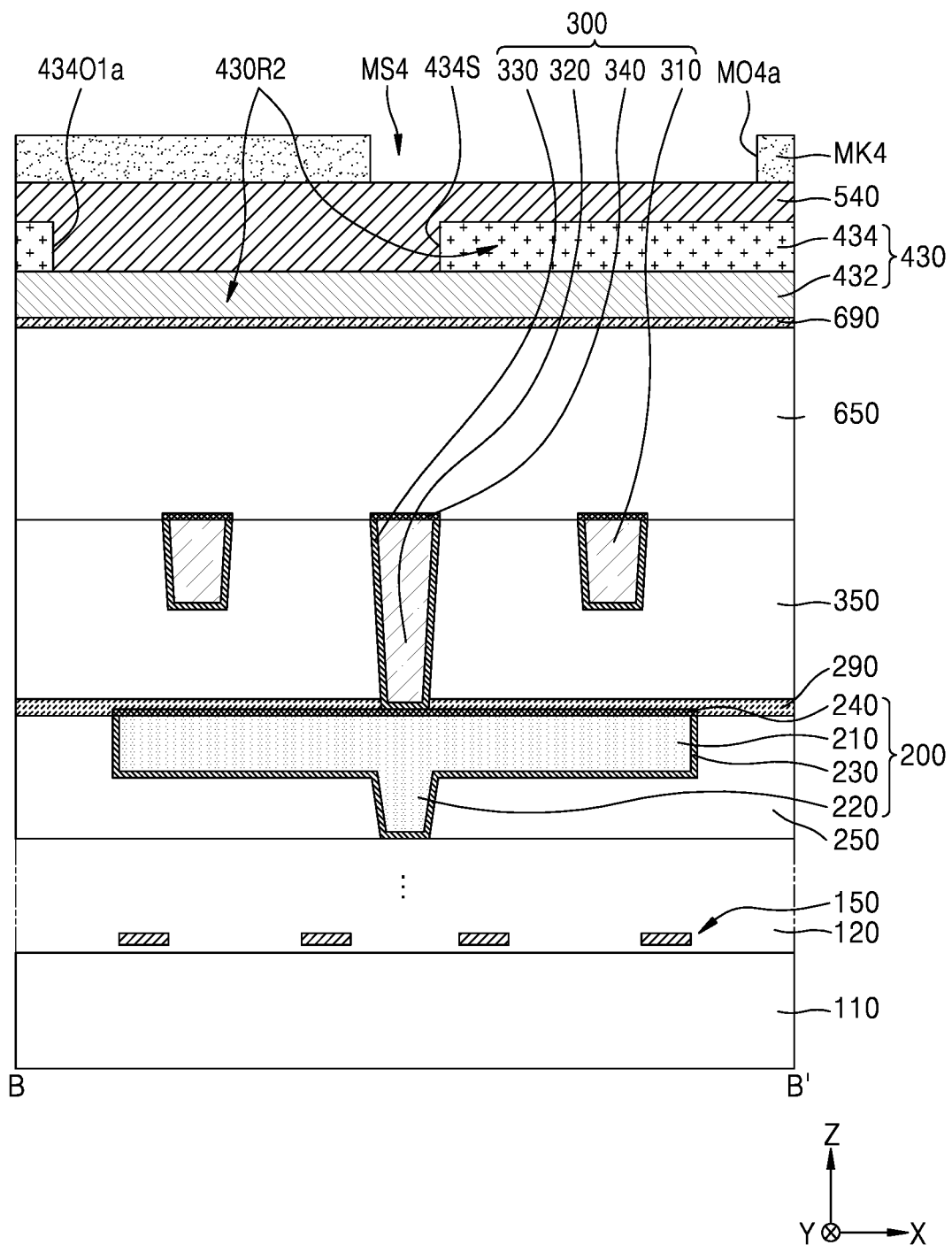
Figure 13C:
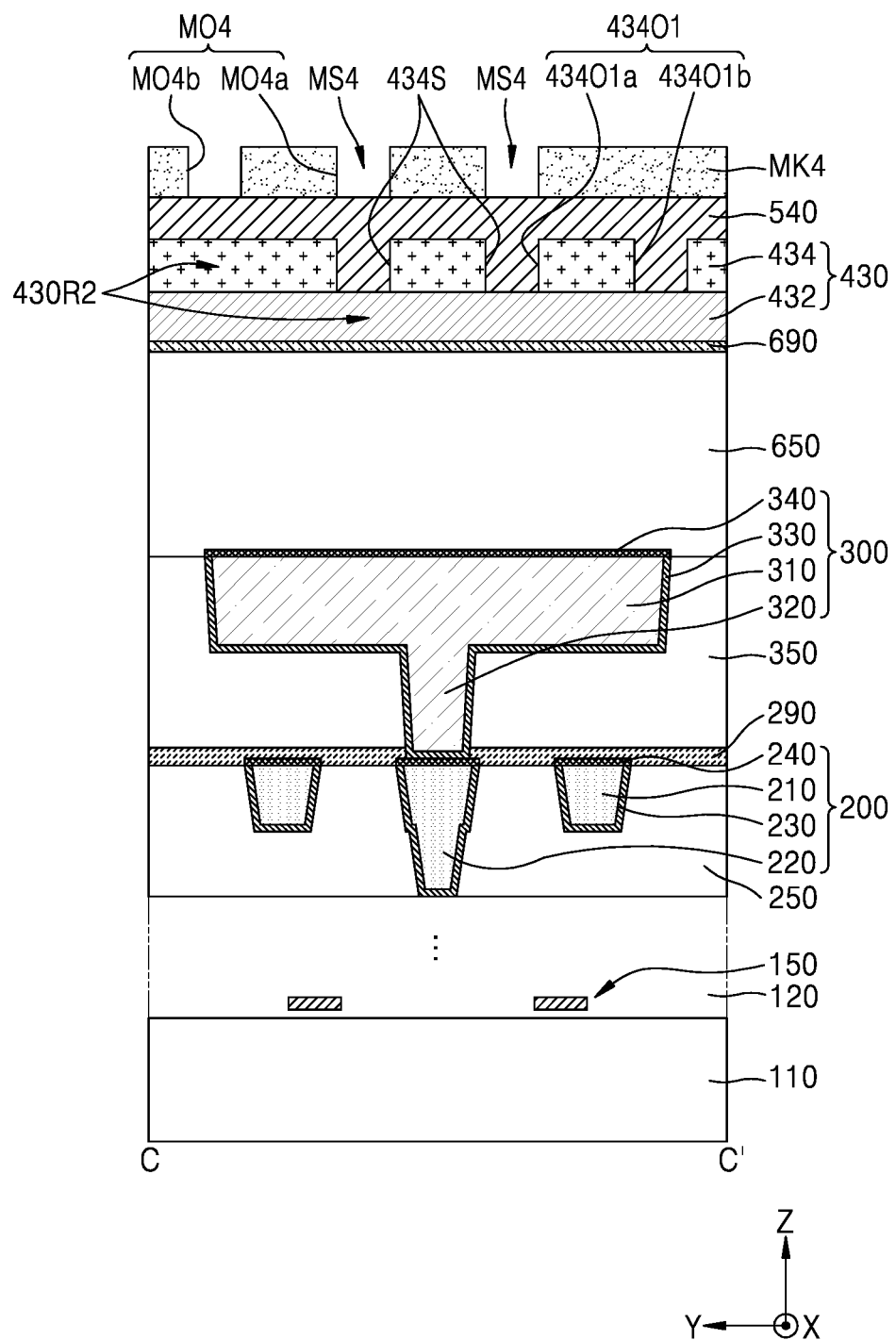
Figure 14A:
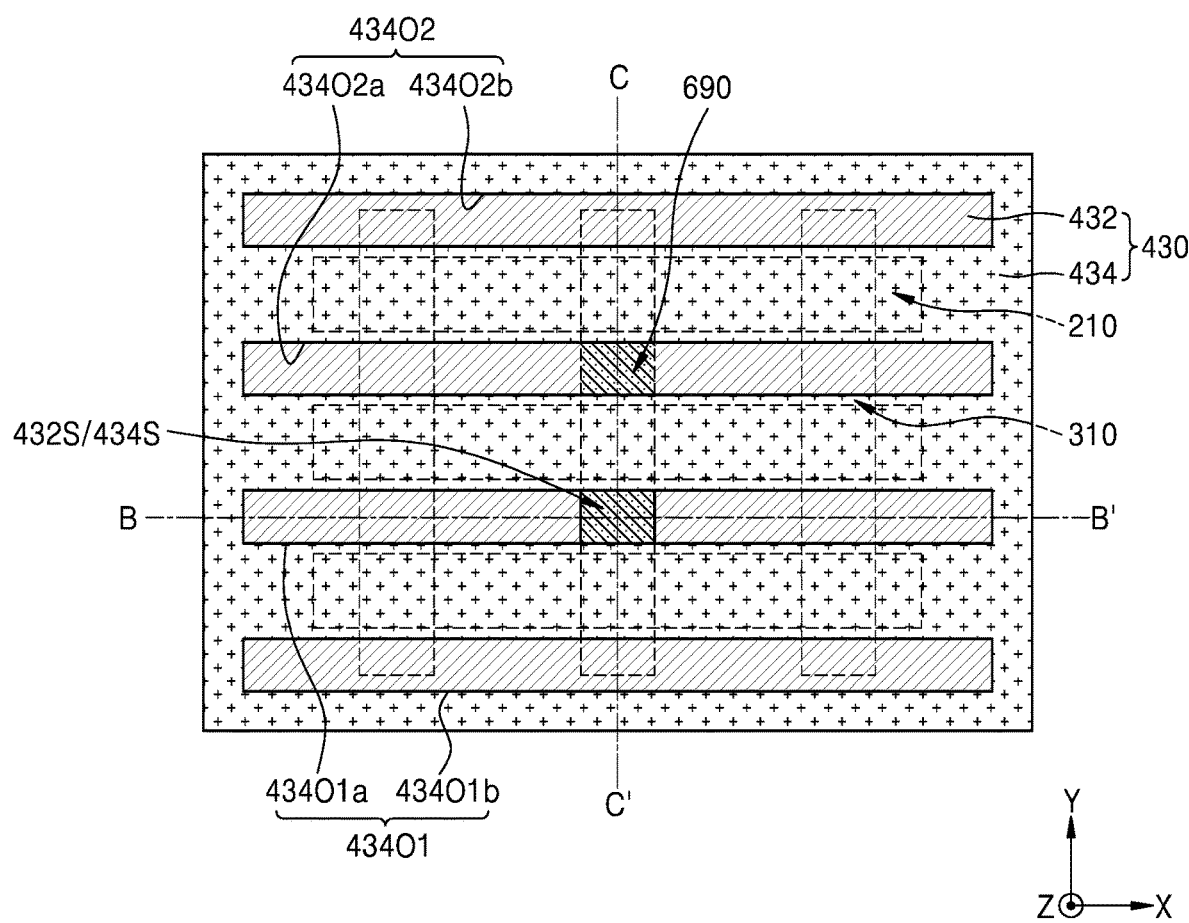
Figure 14B:
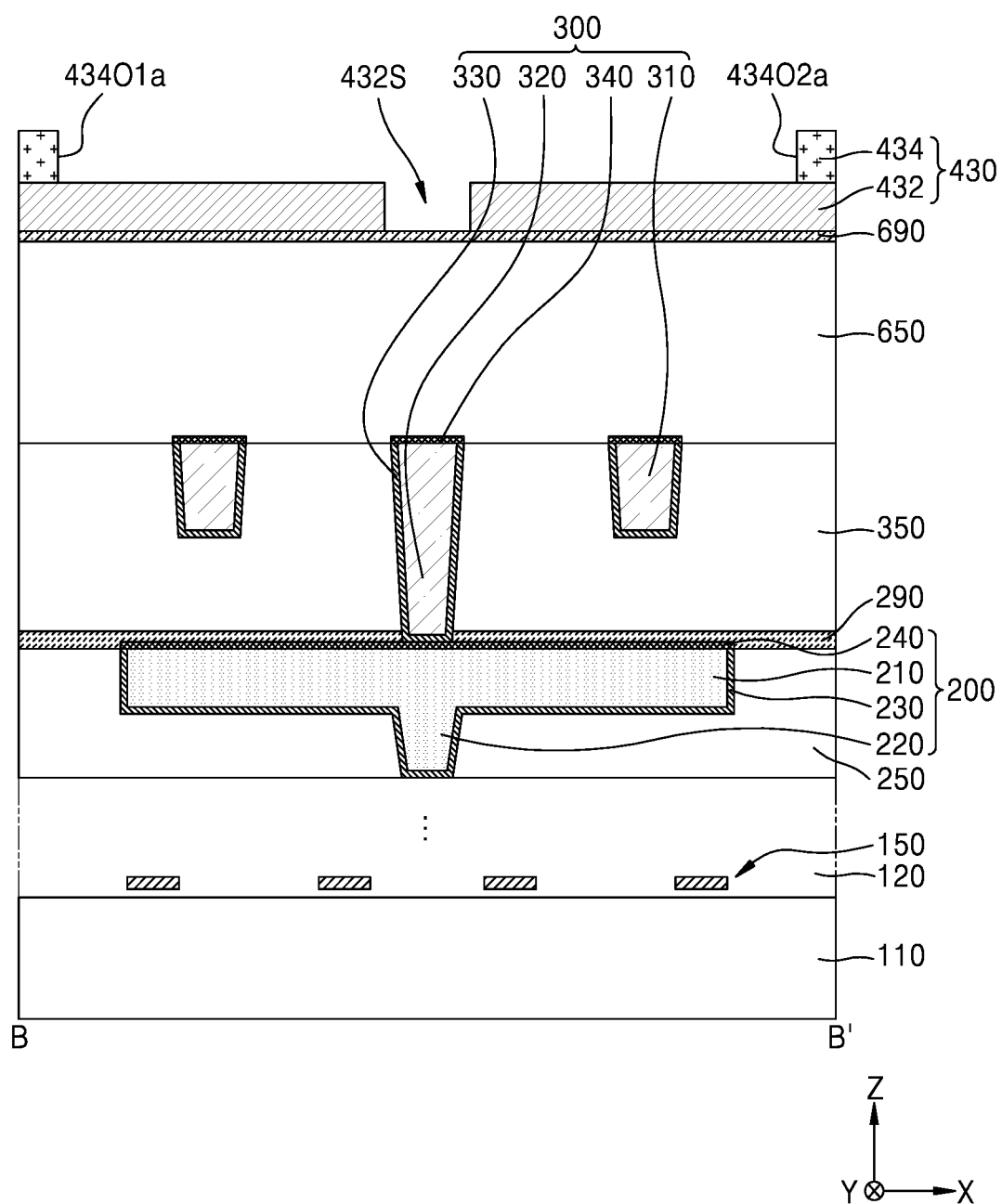
Figure 14C:
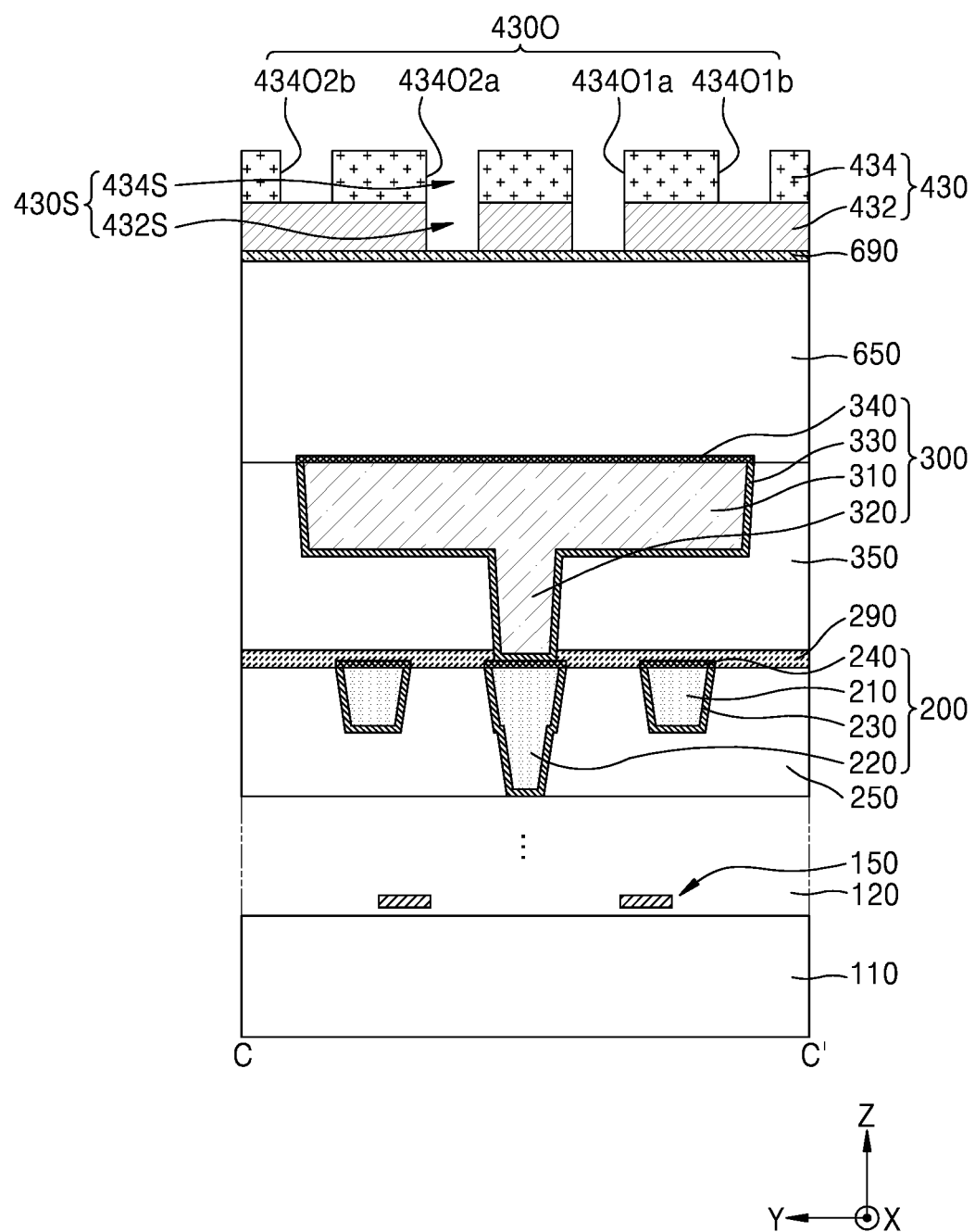
Figure 15A:
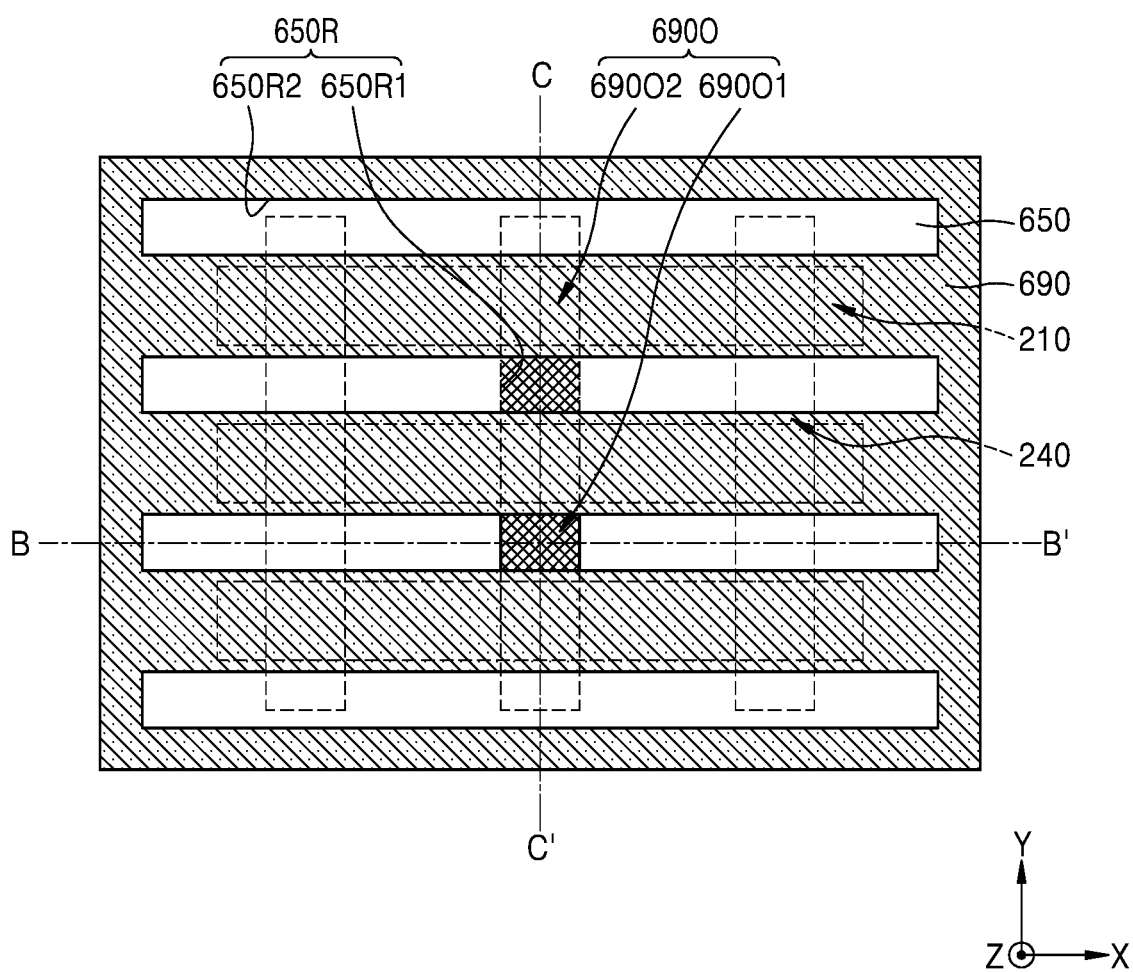
Figure 15B:
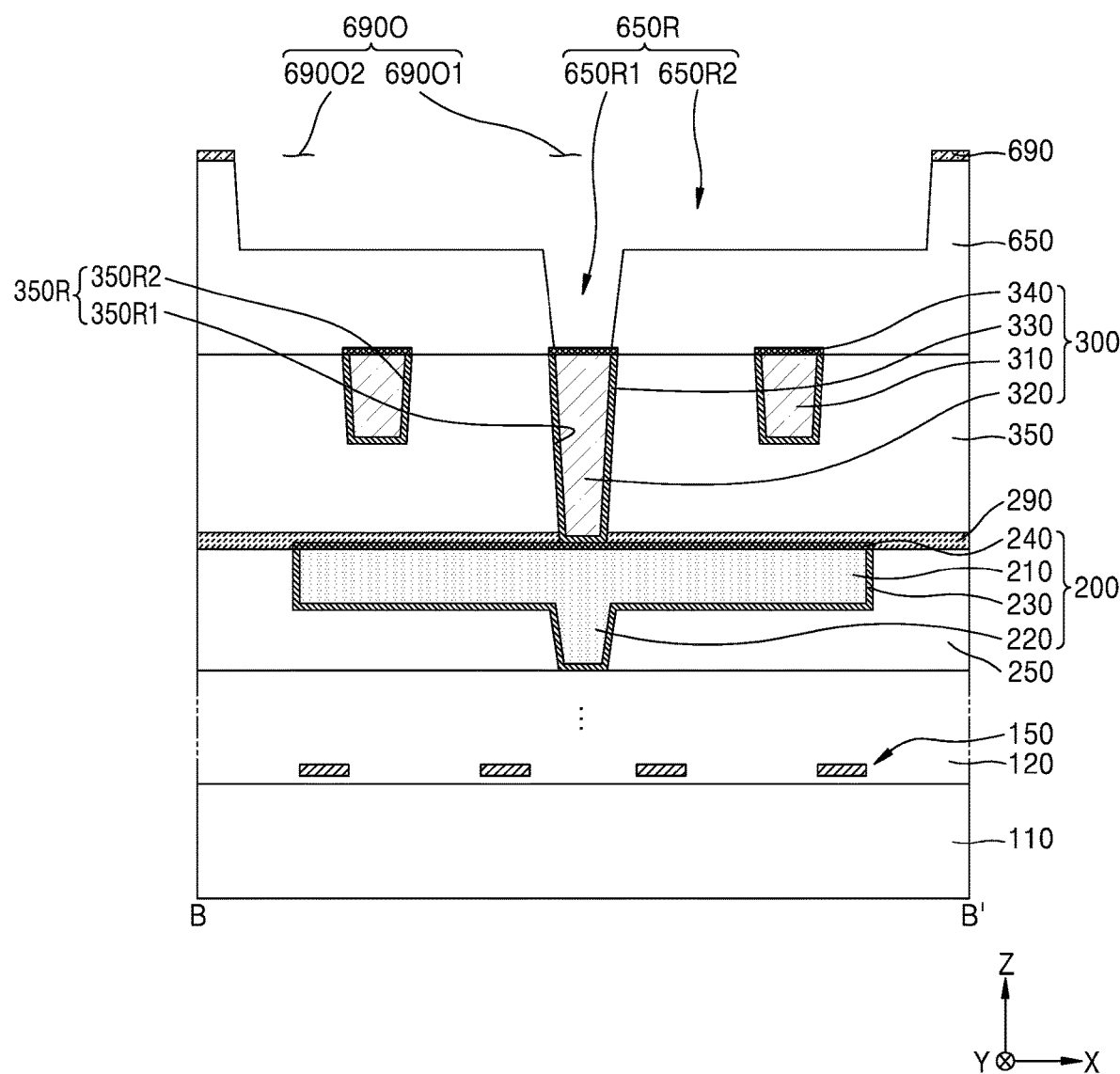
Figure 15C:
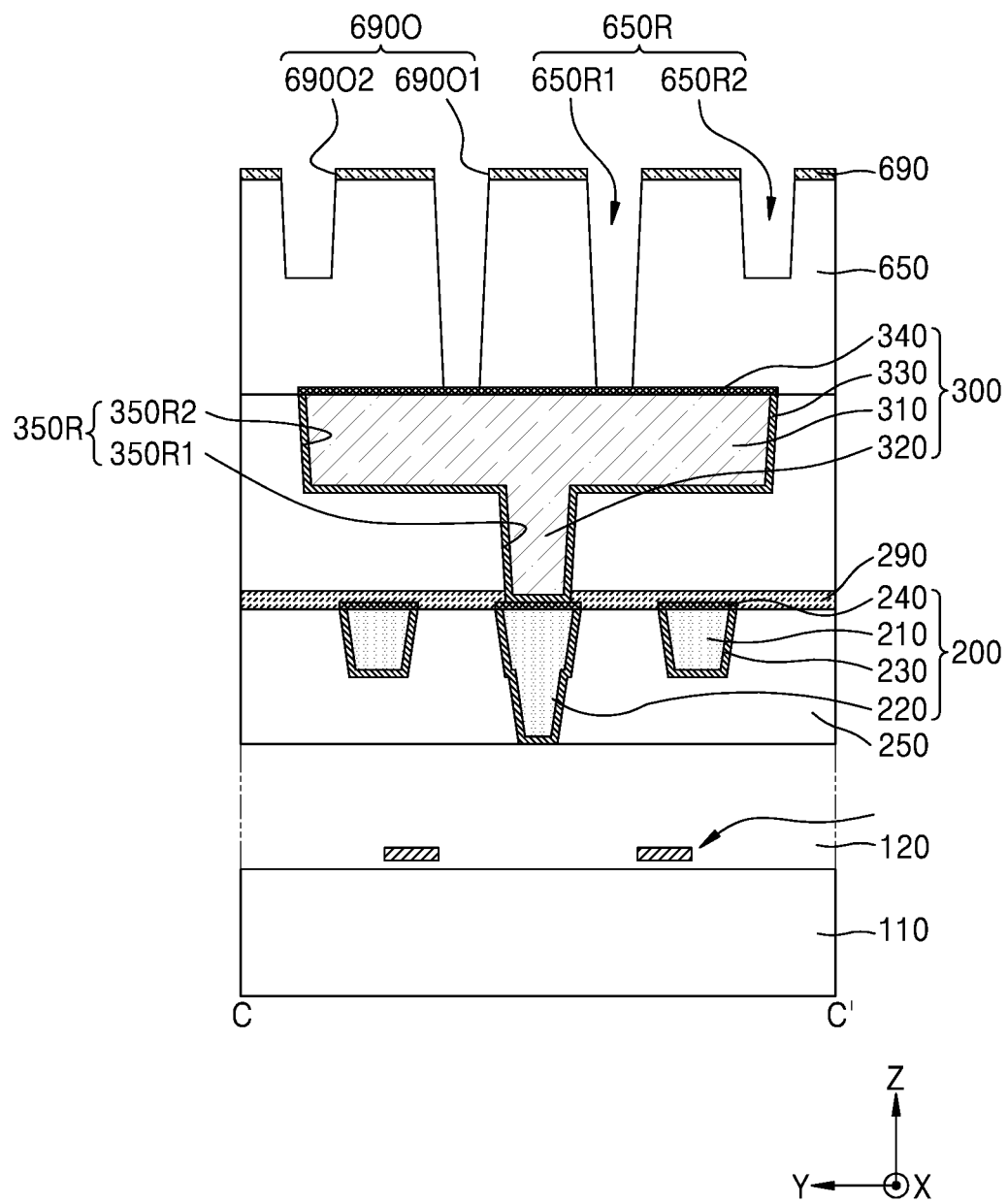

Referring to FIGS. 12A to 12C together, an upper etch stop film 690 and an upper hard mask layer 430 may be sequentially formed on the upper wiring insulating layer 650. For example, the upper etch stop film 690 may include SiCN, or may include a stacked structure of SiCN/SiN or SiCN/SiN/AlN. In some embodiments, the upper etch stop film 690 may include a material containing carbon. The upper hard mask layer 430 may include TiN or SiON, or may include a stacked structure of SiON/TiN. In some embodiments, the upper hard mask layer 430 may include a first upper hard mask layer 432 and a second upper hard mask layer 434 stacked on the first upper hard mask layer 432. For example, the first upper hard mask layer 432 may include a metal nitride such as TiN, and the second upper hard mask layer 434 may include an oxynitride such as SiON. The first upper hard mask layer 432 and the second upper hard mask layer 434 may have a large etch selectivity ratio or may have similar etch characteristics depending on conditions of an etch process.

On the upper hard mask layer 430, a third mask layer MK3 having a third opening MO3 may be formed. For example, the third mask layer MK3 may include a photoresist or may be formed using the photoresist. In some embodiments, a third anti-reflective film 530 may be formed on the upper hard mask layer 430 prior to forming the third mask layer MK3.

For example, the third opening MO3 may be formed in plural in a shape of lines extending in the first horizontal direction (the X direction) in parallel with each other. The third opening MO3 may include a third cutting opening MO3a and a third extension opening MO3b. An extension length of the third cutting opening MO3a in the first horizontal direction (the X direction) may be less than an extension length of the third extension opening MO3b. For example, a portion of the third cutting opening MO3a may overlap with a portion of the lower reference wiring layer 310, and one end of the third cutting opening MO3a may overlap with a portion adjacent to a side surface of the reference wiring layer 310 in the vertical direction (the Z direction). In some embodiments, one end of the third cutting opening MO3a may be mutually aligned in the vertical direction (the Z direction) with a portion of the side surface of the lower reference wiring layer 310 located below.

A portion of the third cutting opening MO3a adjacent to one end of the third cutting opening MO3a and overlapping with a portion of the reference wiring layer 310 underlying thereof may be defined as a third mask stitch region MS3. The third mask stitch region MS3 of the third opening MO3 may correspond to a portion overlapping with a fourth opening MO4 described in FIGS. 13A to 13C in the vertical direction (the Z direction). A portion of the fourth opening MO4 overlapping with the third mask stitch region MS3 in the vertical direction (the Z direction) may be defined as a fourth mask stitch region MS4.

Referring to FIGS. 12A to 13C together, similar to a method described in FIGS. 2A to 3C, a third region 430R1, which is a portion of the upper hard mask layer 430, may be removed using the third mask layer MK3 as an etch mask, to form the third recess 434O1. The third region 430R1 may be a portion of the upper hard mask layer 430 located under the third opening MO3 of the third mask layer MK3 and thus the third recess 434O1 may be a portion removed from the upper hard mask layer 430. After forming the third recess 434O1, the third mask layer MK3 and the third anti-reflective film 530 may be removed.

The third recess 434O1 may extend from the upper surface of the upper hard mask layer 430 toward the semiconductor substrate 110 in the vertical direction (the Z direction), but the upper etch stop film 690 may not be exposed at/by a lower level of the third recess 434O1. Namely, a depth of the third recess 434O1 in the vertical direction (the Z direction) may have a value less than a thickness of the upper hard mask layer 430.

When the upper hard mask layer 430 includes a first upper hard mask layer 432 and a second upper hard mask layer 434 stacked on the first upper hard mask layer 432, the third recess 434O1 may pass through the second upper hard mask layer 434 and then expose the first upper hard mask layer 432 by/through the lower level of the third recess 434O1. Namely, the third recess 434O1 may be formed by removing a portion of the second upper hard mask layer 434 using the third mask layer MK3 as an etch mask. A depth of the third recess 434O1 in the vertical direction (the Z direction) may be equal to or greater than a thickness of the second upper hard mask layer 434.

The third recess 434O1 may include a third cutting recess 434O1a and a third extension recess 434O1b respectively formed correspondingly to the third cutting opening MO3a and the third extension opening MO3b of the third mask layer MK3. An extension length of the third cutting recess 434O1a in the first horizontal direction (the X direction) may be less than an extension length of the third extension recess 434O1b. For example, a portion of the third cutting recess 434O1a may overlap with a portion of the reference wiring layer 310 located therebelow, and one end of the third cutting recess 434O1a may overlap with a portion adjacent to a side surface of the reference wiring layer 310 located therebelow, in the vertical direction (the Z direction). In some embodiments, one end of the third cutting recess 434O1a may be mutually aligned with a portion of the side surface of the reference wiring layer 310 located therebelow in the vertical direction (the Z direction).

In the third cutting recess 434O1a, a portion adjacent to one end of the third cutting recess 434O1a and overlapping with a portion of the reference wiring layer 310 located therebelow may be defined as a third recess stitch region 434S.

A fourth mask layer MK4 having a fourth opening MO4 may be formed on the upper hard mask layer 430 having the third recess 434O1. For example, the fourth mask layer MK4 may include a photoresist or may be formed using the photoresist. In some embodiments, a fourth anti-reflective film 540 may be formed on the upper hard mask layer 430 prior to forming the fourth mask layer MK4.

For example, the fourth opening MO4 may be formed in plural in a line shape, extending in the first horizontal direction (the X direction) in parallel with each other. The fourth opening MO4 may include a fourth cutting opening MO4a and a fourth extension opening MO4b. An extension length of the fourth cutting opening MO4a in the first horizontal direction (the X direction) may be less than an extension length of the fourth extension opening MO4b.

A portion of the fourth opening MO4 and a portion of the third recess 434O1 may overlap each other in the vertical direction (the Z direction). For example, a portion of the fourth cutting opening MO4a and a portion of the third cutting recess 434O1a may overlap with each other in the vertical direction (the Z direction), and the fourth extension opening MO4b and the third extension recess 434O1b may not overlap with each other in the vertical direction (the Z direction). Specifically, a portion of the fourth cutting opening MO4a may overlap with the third recess stitch region 434S in the vertical direction (the Z direction).

For example, a portion of the fourth cutting opening MO4a may overlap with a portion of the reference wiring layer 310 located therebelow, and one end of the fourth cutting opening MO4a may overlap with a portion adjacent to the side surface of the reference wiring layer 310 located therebelow in the vertical direction (the Z direction). In some embodiments, one end of the fourth cutting opening MO4a may be mutually aligned in the vertical direction (the Z direction) with a portion of the side surface of the reference wiring layer 310 located therebelow.

A portion of the fourth cutting opening MO4a mutually overlapping with the third recess stitch region 434S in the vertical direction (the Z direction) may be defined as a fourth mask stitch region MS4. The fourth mask stitch region MS4 may be a portion overlapping with a portion of the reference wiring layer 310 located therebelow.

Figure 4A:
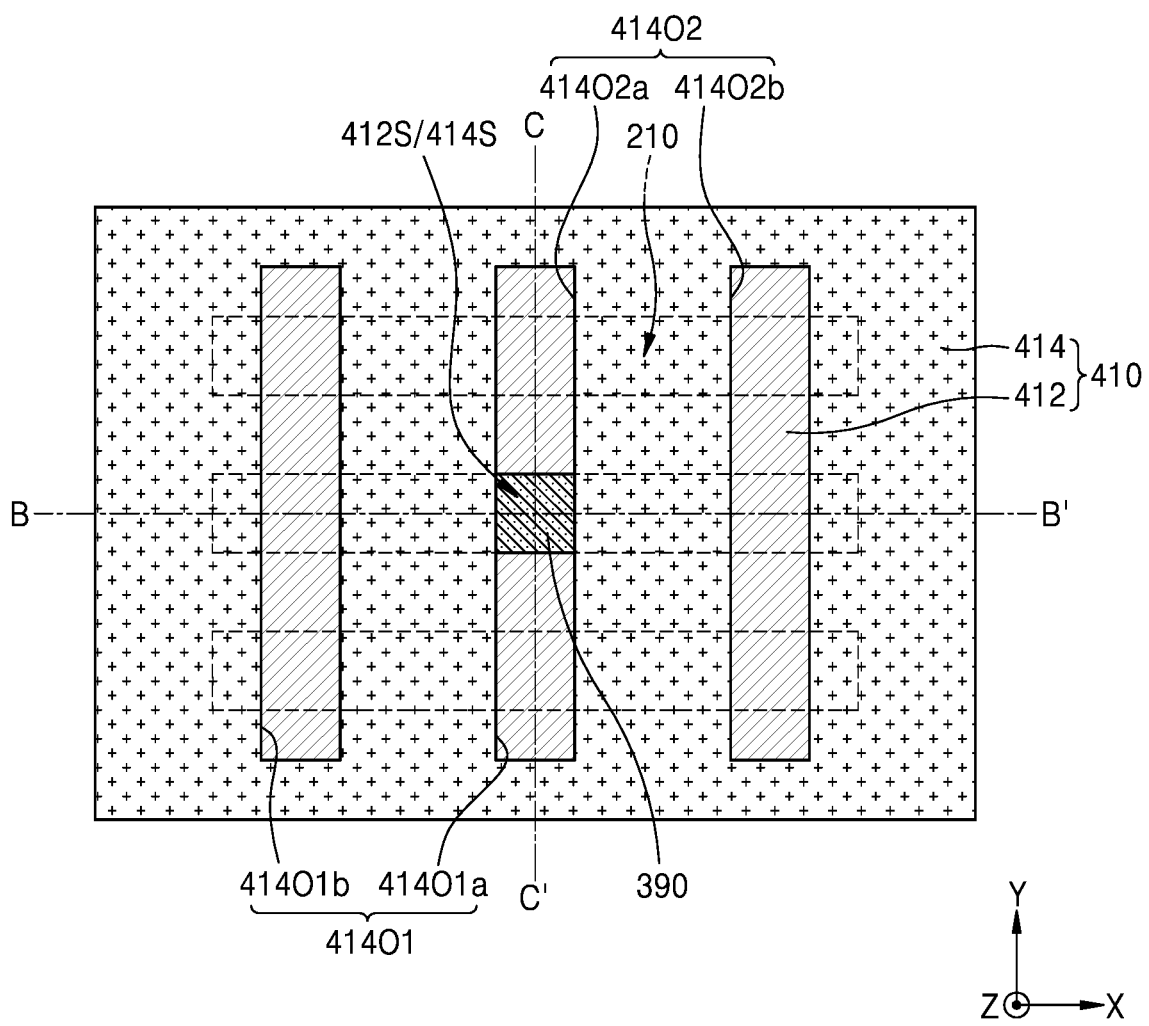
Figure 4B:
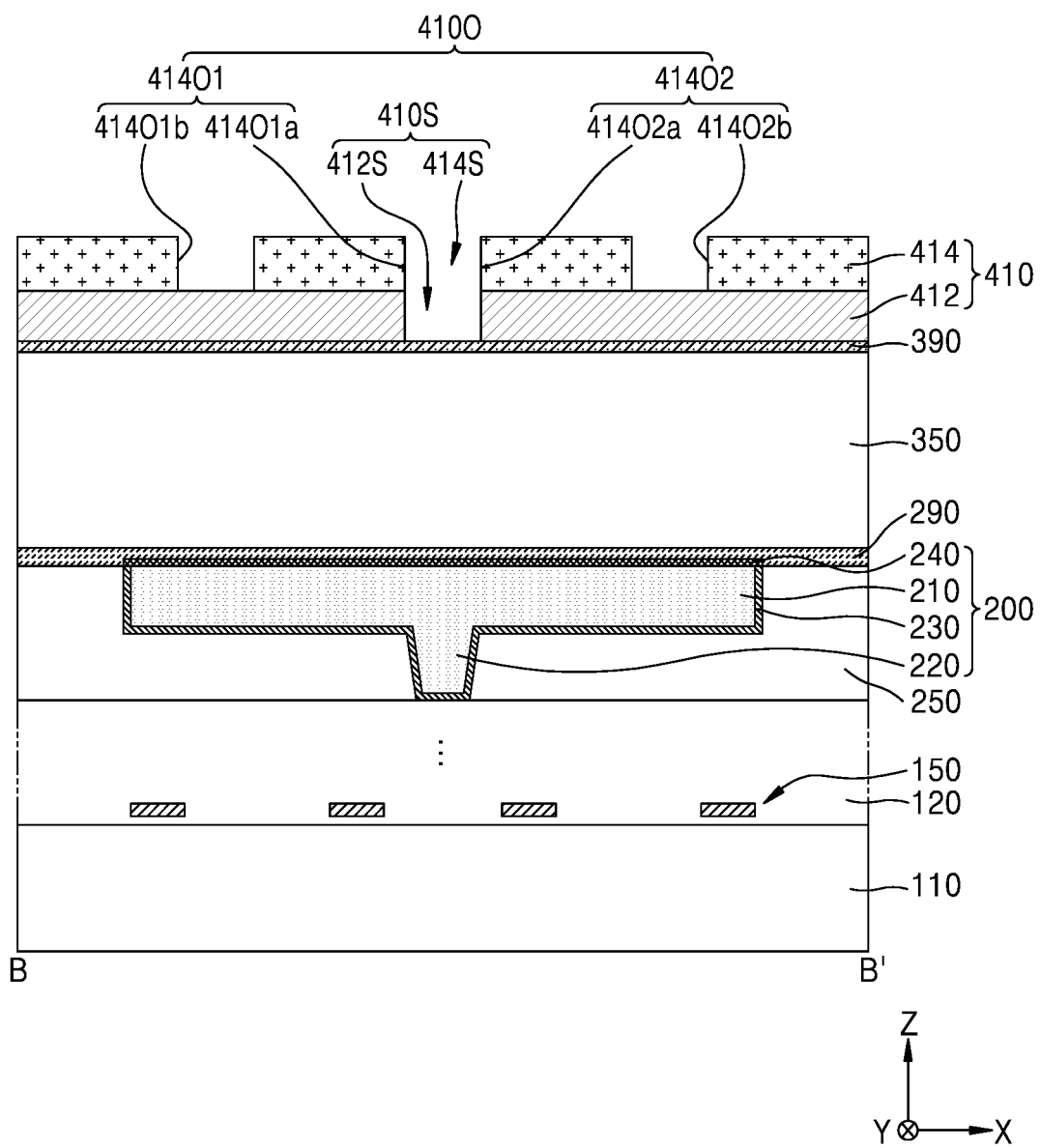
Figure 4C:
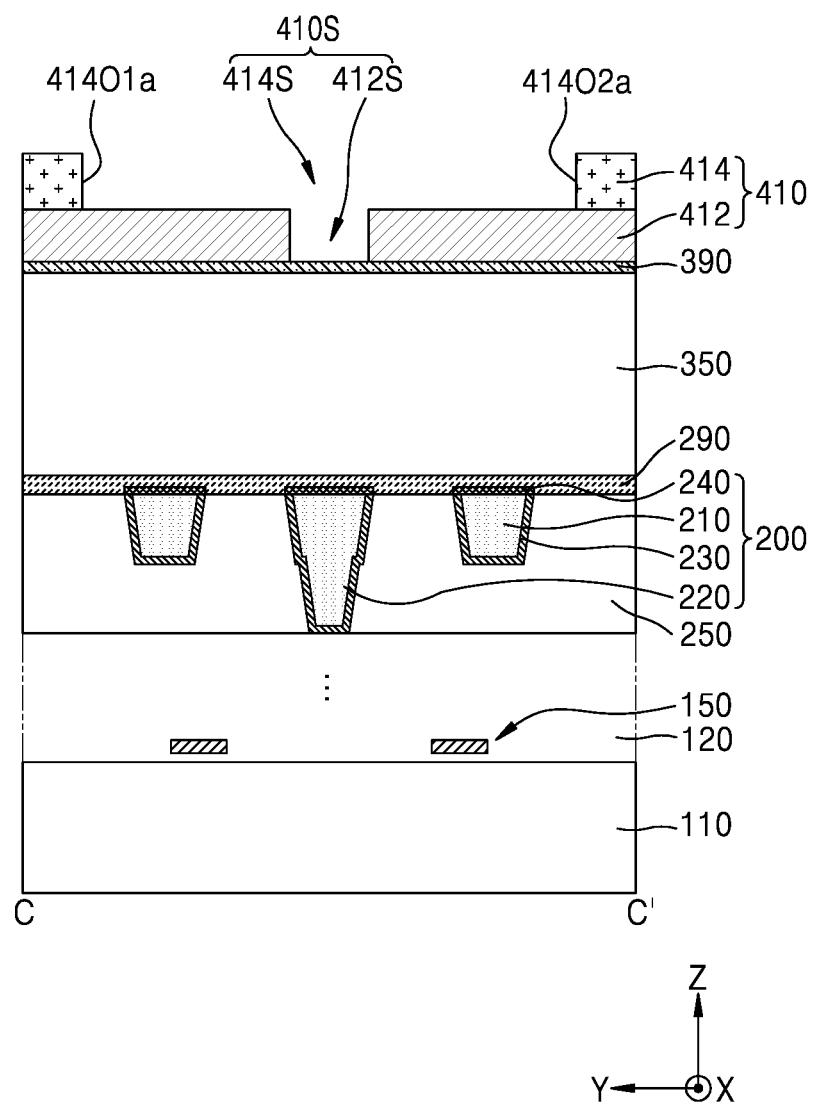
Figure 5A:
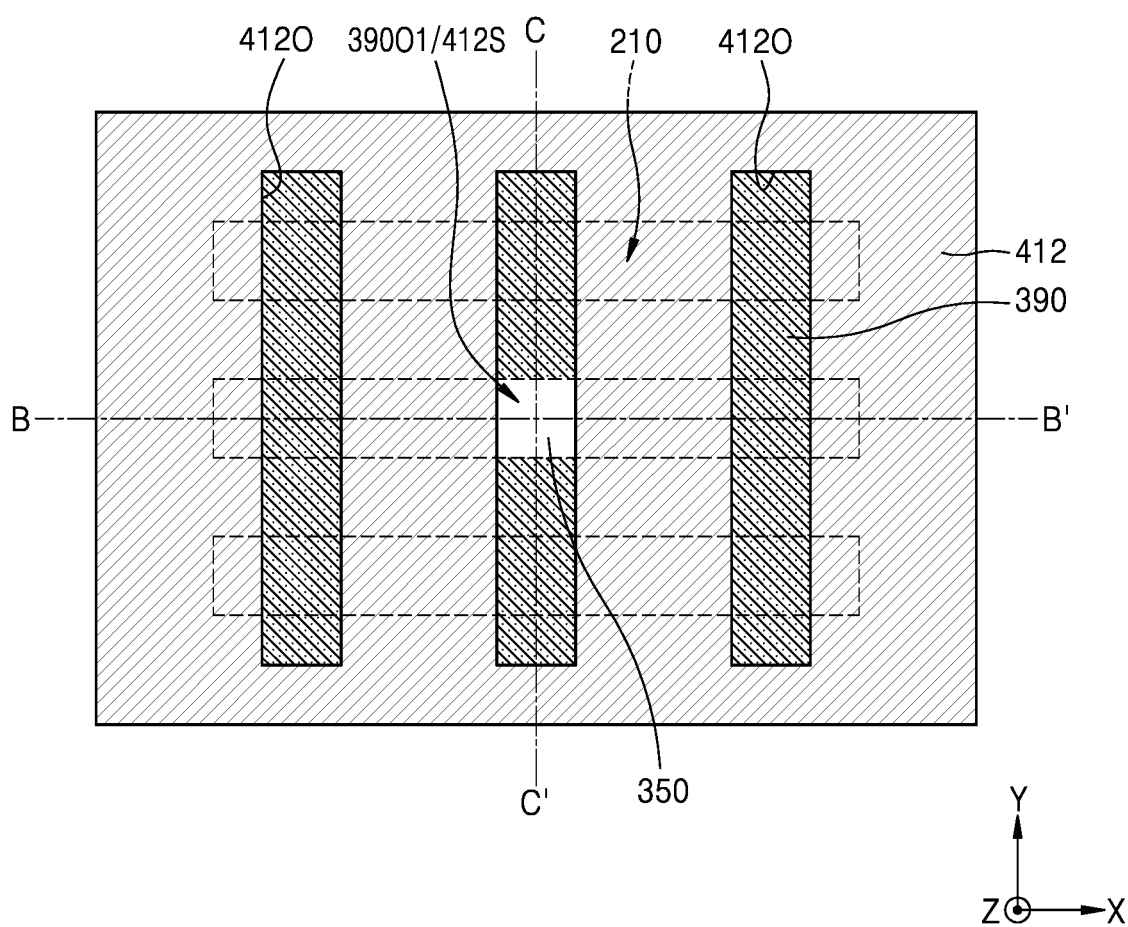
Figure 5B:
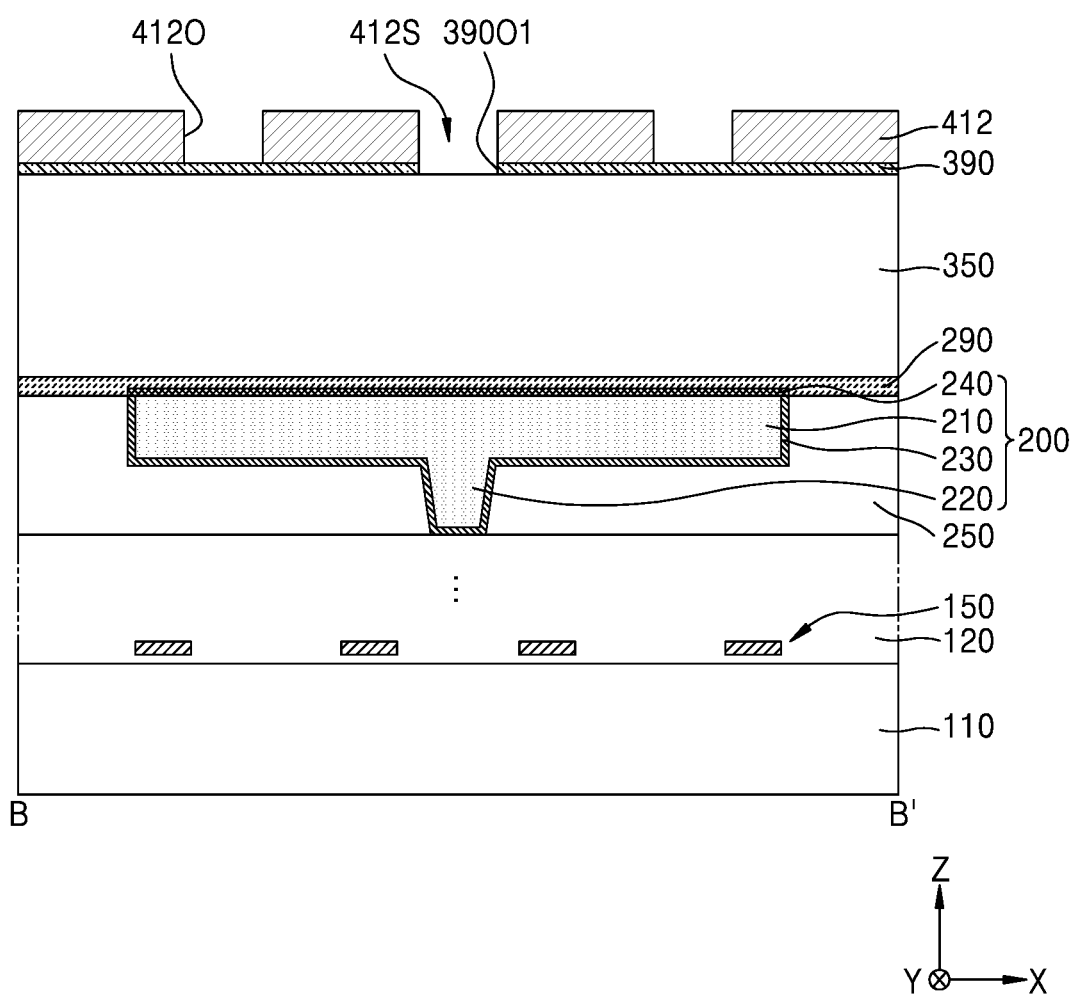
Figure 5C:
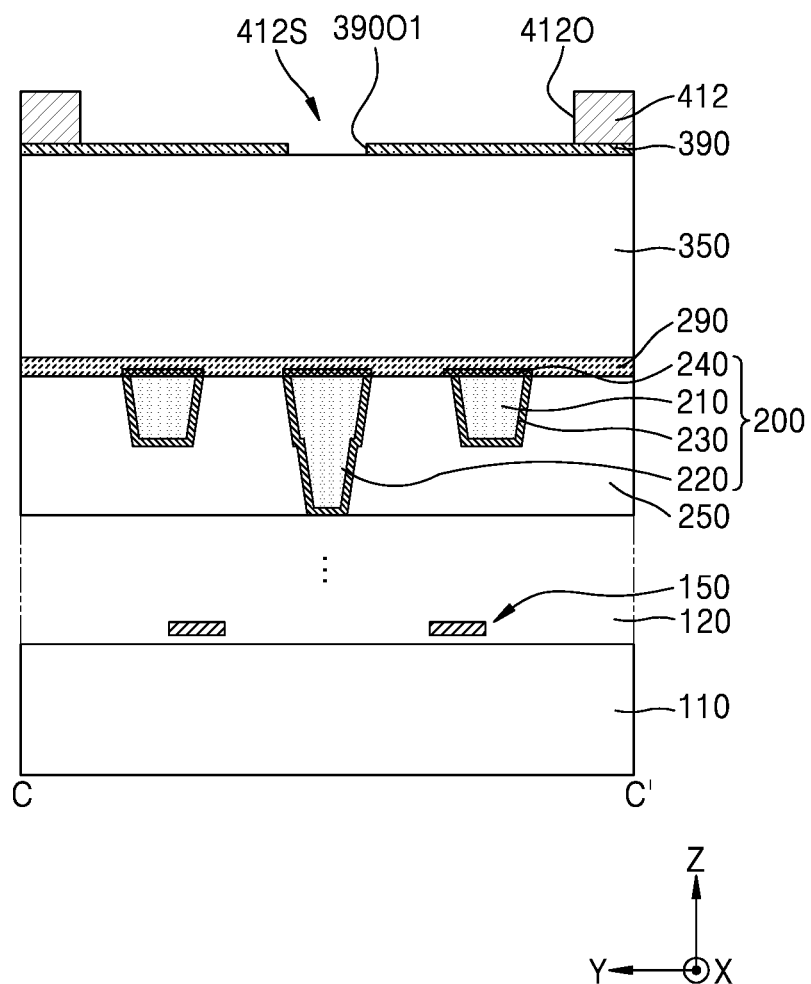

Referring to FIGS. 13A to 14C together, a fourth region 430R2, which is a portion of the upper hard mask layer 430, may be removed using a fourth mask layer MK4 as an etch mask similarly to a method described with respect to FIGS. 4A to 4C, thereby forming a fourth recess 434O2. The fourth region 430R2 is a portion of the upper hard mask layer 430 located under the fourth opening MO4 of the fourth mask layer MK4 and thus the fourth recess 434O2 may be a portion formed by removing the fourth region 430R2. After forming the fourth recess 434O2, the fourth mask layer MK4 and the fourth anti-reflective film 540 may be removed.

The fourth recess 434O2 may include a fourth cutting recess 434O2a and a fourth extension recess 434O2b respectively formed correspondingly to the fourth cutting opening MO4a and the fourth extension opening MO4b of the fourth mask layer MK4. The fourth cutting recess 434O2a may communicate with the third cutting recess 434O1a. The third recess 434O1 and the fourth recess 434O2 may together constitute the upper recess 430O.

The upper recess 430O may extend in the vertical direction (the Z direction) from the upper surface of the upper hard mask layer 430 toward the semiconductor substrate 110, but the upper etch stop film 690 may be exposed by/through a portion of a bottom level of the upper recess 430O and the upper etch stop film 690 may not be exposed by/through another portion of the bottom level of the upper recess 430O. Specifically, the upper etch stop film 690 may be exposed by/through a bottom level of the portion of the upper recess 430O formed correspondingly to the fourth mask stitch region MS4, and the upper etch stop film 690 may not be exposed by/through the bottom level of a remaining portion of the upper recess 430O.

A portion of the upper recess 430O formed correspondingly to the fourth mask stitch region MS4 may be defined as an upper recess stitch region 430S. The upper recess stitch region 430S may pass through the upper hard mask layer 430 in the vertical direction (the Z direction), and a bottom level of the upper recess stitch region 430S may expose the upper etch stop film 690. The upper recess stitch region 430S may include a third recess stitch region 434S that passes through the second upper hard mask layer 434 in the vertical direction (the Z direction) and a fourth recess stitch region 432S that passes through the first upper hard mask layer 432 in the vertical direction (the Z direction), and the third recess stitch region 434S and the fourth recess stitch region 432S may communicate with each other. The third recess stitch region 434S may be a portion formed by using the third mask layer MK3 shown in FIGS. 12A to 12C, and the fourth recess stitch region 432S may be a portion formed by using the fourth mask layer MK4 shown in FIGS. 13A to 13C. That is, the upper recess stitch region 430S may be formed in a portion corresponding to a portion where the third opening MO3 of the third mask layer MK3 overlaps with the fourth opening MO4 of the fourth mask layer MK4.

The upper etch stop film 690 may be exposed by/through the bottom level of the upper recess stitch region 430S in the upper recess 430O and the first upper hard mask layer 432 may be exposed by/through a bottom level of a remaining portion in the upper recess region 430O.

Referring to FIGS. 14A to 15C together, in a manner similar to that described with respect to FIGS. 5A to 7C, a portion of the upper hard mask layer 430 may be removed, wherein the second upper hard mask layer 434 of the upper hard mask layer 430 may be removed and a portion of the first upper hard mask layer 432 thereof may remain. At this time, the portion of the upper etch stop film 690 exposed at the bottom of the upper recess stitch region 430S may be also removed to form a third etch opening 690O1 that exposes the upper wiring insulating layer 650.

Thereafter, a portion of the upper etch stop film 690 may be then removed using the first upper hard mask layer 432 as an etch mask to form a fourth etch opening 690O2 exposing the upper wiring insulating layer 650. In a process of forming the fourth etch opening 690O2, a portion of the upper wiring insulating layer 650 that is exposed under the third etch opening 690O1 may be removed. At this time, a remaining portion of the first upper hard mask layer 432 may be also removed. The third etch opening 690O1 and the fourth etch opening 690O2 may together constitute an upper etch opening 690O.

A portion of the upper wiring insulating layer 650 may be removed using the upper etch stop film 690 having the upper etch opening 690O as an etch mask to form the upper wiring recess 650R. The upper wiring recess 650R may include a first upper wiring recess 650R1 and a second upper wiring recess 650R2.

Since a portion of the upper wiring insulating layer 650 under the third etch opening 690O1 is already removed before forming the upper wiring recess 650R, a depth of the first upper wiring recess 650R1 which may be a portion of the upper wiring recess 650R and may be formed under the third etch opening 690O1 may be larger than a depth of the second upper wiring recess 650R2 which may be a portion of the upper wiring recess 650R and may be formed under the fourth etch opening 690O2.

The first upper wiring recess 650R1 may extend from the upper surface to the lower surface of the upper wiring insulating layer 650 so that the reference wiring structure 300 may be exposed by/through a bottom level of the first upper wiring recess 650R1. The second upper wiring recess 650R2 may extend downwardly from the upper surface of the upper wiring insulating layer 650, and the bottom level of the second upper wiring recess 650R2 may be lower than a level of the upper surface of the upper wiring insulating layer 650 and higher than a level of the lower surface of the upper wiring insulation layer 650, so that a portion of the upper wiring insulation layer 650 may be maintained at an exposed state at the bottom level of the second upper wiring recess 650R2.

Figure 16A:
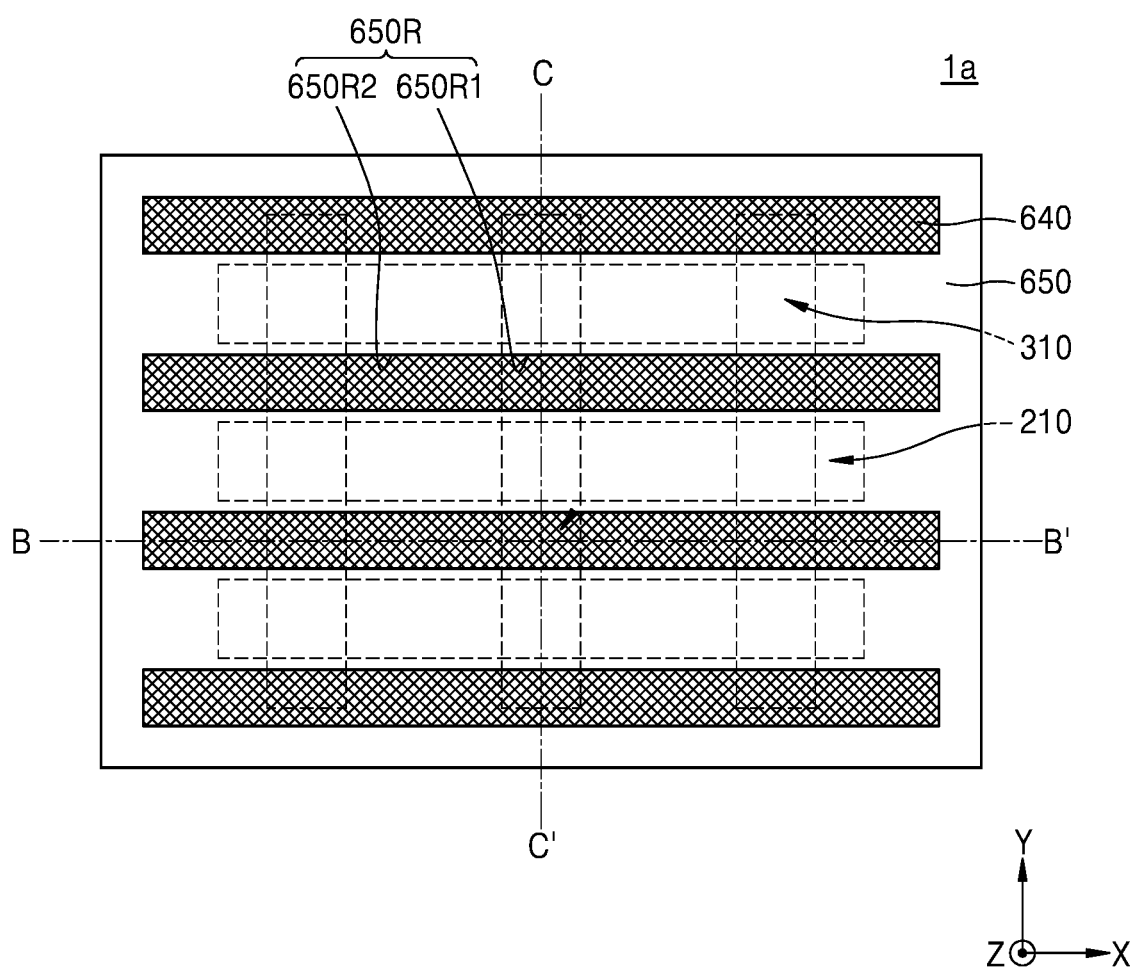
FIGS. 16A to 16C are a plan view and cross-sectional views illustrated for explaining a method of manufacturing an integrated circuit device, according to example embodiments of the inventive concepts, wherein specifically.
Figure 16B:
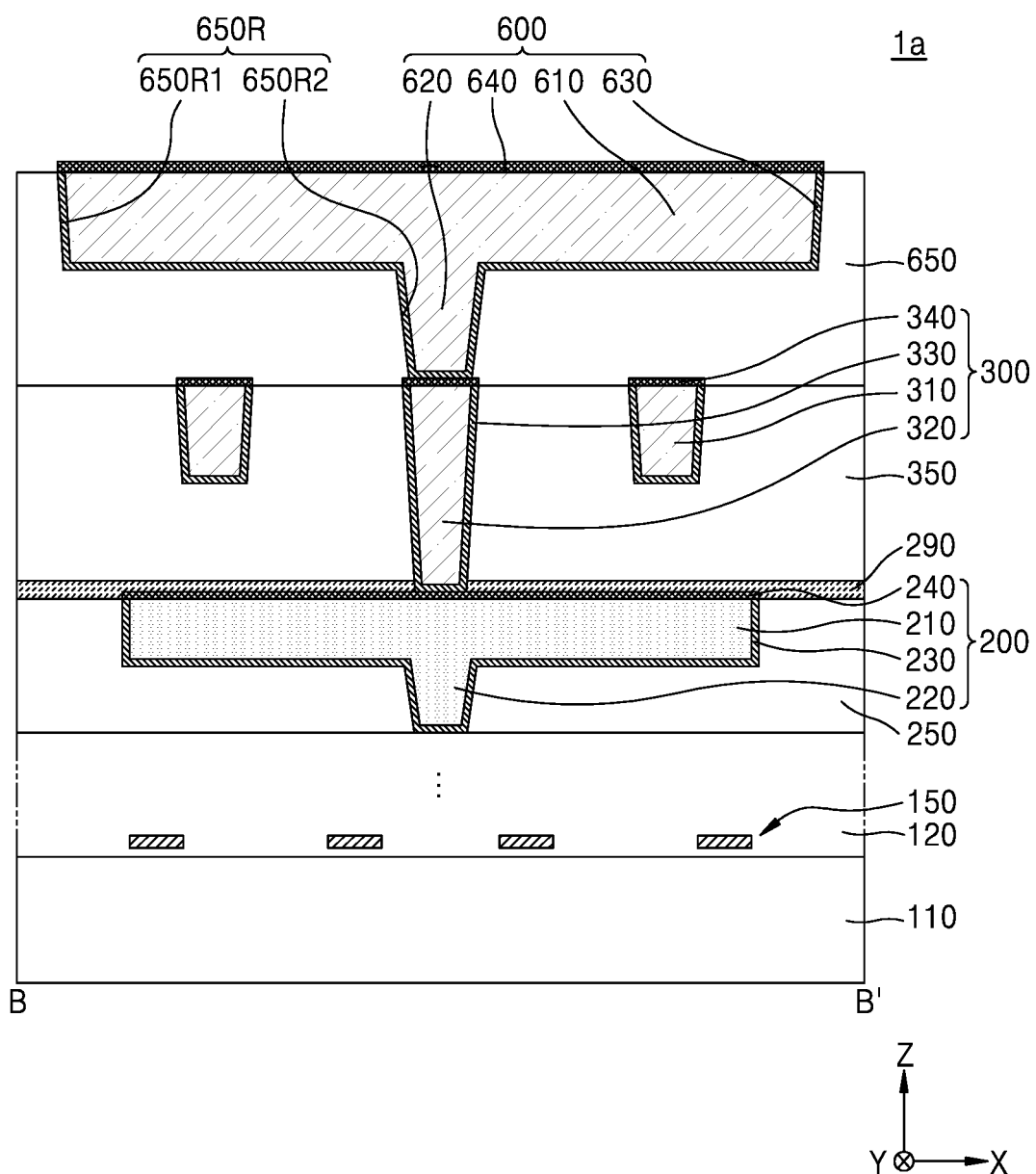
Figure 16C:
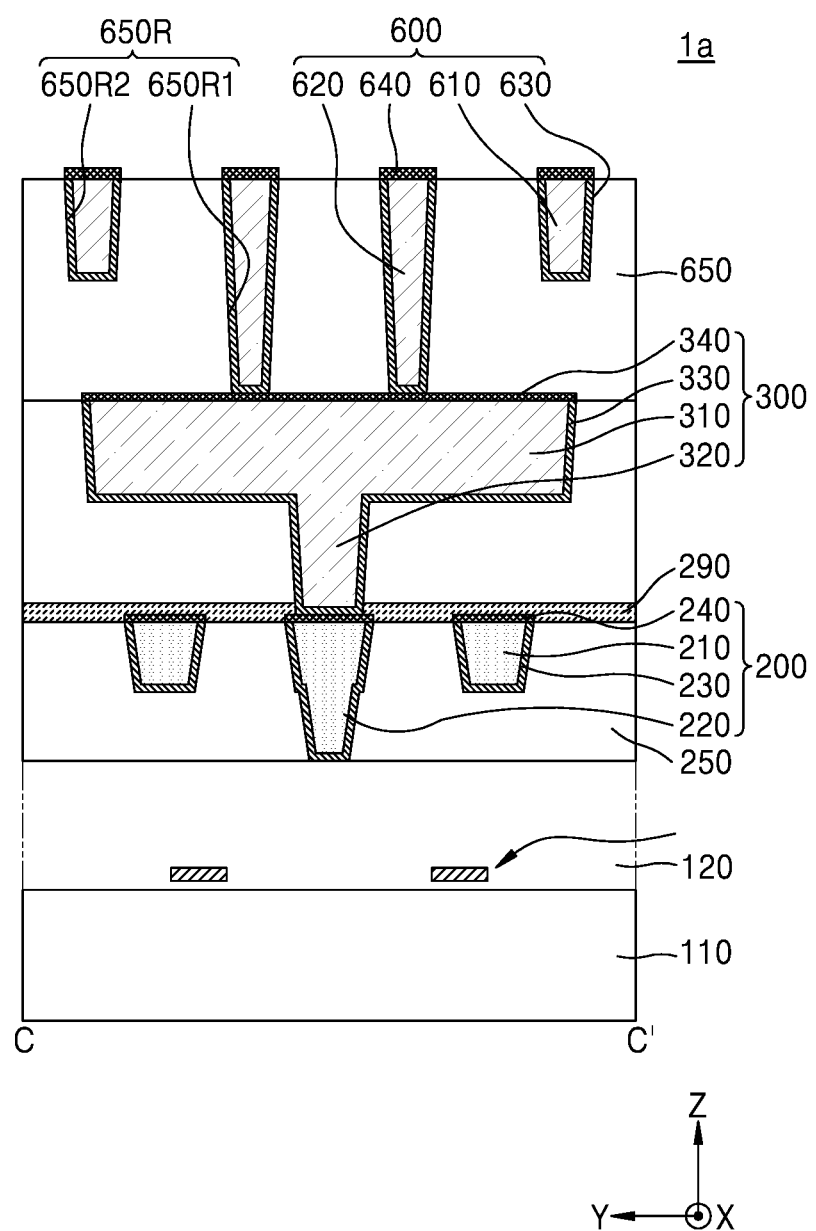

FIGS. 16A to 16C are a plan view and cross-sectional views illustrated for explaining a method of manufacturing an integrated circuit device, according to example embodiments of the inventive concepts. Specifically, FIGS. 16B and 16C are cross-sectional views taken along lines B-B' and C-C' in FIG. 16A. In FIGS. 16A to 16C, the same reference numerals as in FIGS. 1A to 15C denote the same members, and a repeated detailed description thereof may be omitted herein.

Referring to FIGS. 16A to 16C together, an upper wiring structure 600 may be formed to form an integrated circuit device 1a, in a method similar to the method of forming the reference wiring structure 300 described with reference to FIGS. 8A to 10C.

Specifically, after an upper barrier layer 630 covering an exposed surfaces of the upper etch stop film 690 and the upper wiring insulating layer 650 having the upper wiring recess 650R shown in FIGS. 11A to 15C may be formed, an upper wiring material layer may be formed on the upper barrier layer 630. The upper barrier layer 630 may conformally be formed on the exposed surfaces of the upper etch stop film 690 and the upper wiring insulating layer 650 having the upper wiring recess 650R. The upper wiring material layer may be formed to fill the upper wiring recess 650R and to be on (e.g., to cover) the upper surface of the upper etch stop film 690.

The upper barrier layer 630 may include a nitride or an oxide of a metal such as Ti, Ta, Ru, Mn, Co, or W, or may include an alloy such as CoWP, CoWB, or CoWBP. The upper wiring material layer may include a metal material such as W, Cu, Ti, Ta, Ru, Mn or Co.

Thereafter, a portion of the upper wiring material layer on (e.g., covering) the upper surface of the upper etch stop film 690 may be removed to form an upper wiring layer 610 and an upper via plug 620. The upper wiring layer 610 may refer to a portion of a remaining portion of the upper wiring material layer located at a higher level than the bottom level of the second upper wiring recess 650R2, and the upper via plug 620 may refer to a portion of the remaining portion of the upper wiring material layer located at a lower level than the bottom of the second upper wiring recess 650R2 and connected to the upper wiring layer 610. Thus, the upper wiring layer 610 may have a substantially constant height and width and may extend in the first horizontal direction (the X direction), and the upper via plug 620 may have a substantially constant horizontal area under the upper wiring layer 610 or may extend in the vertical direction (the Z direction) toward the semiconductor substrate 110 with a continuously decreasing or increasing horizontal area.

In a process of forming the upper wiring layer 610 and the upper via plug 620, a portion of the upper barrier layer 630 covering the upper surface of the upper etch stop film 690 and the upper etch stop film 690 may be removed together, so that the upper surface of the upper wiring insulating layer 650 may be exposed.

In order to form the upper wiring layer 610 and the upper via plug 620, a process of removing a portion of the upper wiring material layer may be performed by a CMP method. In the process of forming the upper wiring layer 610 and the upper via plug 620, the upper etch stop film 690 may be completely removed.

The integrated circuit device 1a may include the device layer 120 including a plurality of semiconductor devices 150, the lower wiring structure 200, the reference wiring structure 300, and the upper wiring structure 600. The lower wiring structure 200 may be electrically connected to each semiconductor device 150, so that the lower wiring structure 200 may provide electrical connections between the plurality of semiconductor devices 150 and electrical connections between the plurality of semiconductor devices 150 and the reference wiring structure 300. The reference wiring structure 300 may provide an electrical connection between the lower wiring structure 200 and the upper wiring structure 600.

The upper wiring structure 600 may include the upper wiring layer 610 and the upper via plug 620 connected to the upper wiring layer 610. The upper wiring insulating layer 650 may fill a space between the upper wiring layer 610 and the upper via plug 620. In some embodiments, the upper wiring layer 610 and the upper via plug 620 that are in contact with each other may be integrally formed.

The upper wiring layer 610 may be formed in plural in a line shape, extending in the first horizontal direction (the X direction) in parallel with each other. The upper via plug 620 may extend from the bottom surface of the upper wiring layer 610 toward the semiconductor substrate 110, to be electrically connected to the reference wiring structure 300.

The upper wiring structure 600 may further include an upper barrier layer 630 surrounding bottom surfaces and side surfaces of the upper wiring layer 610 and the upper via plug 620. The upper barrier layer 630 may be disposed between (a) the upper wiring layer 610 and the upper via plug 620 and (b) the upper wiring insulating layer 650. In some embodiments, the upper wiring structure 600 may further include an upper cover layer 640 on (e.g., covering) the upper surface of the upper wiring layer 610.

All of the upper etch stop film 690 shown in FIGS. 11A to 15C may be removed and thus may not remain on the upper wiring insulating layer 650 and the upper wiring structure 600.

Referring to FIGS. 11A to 15C together, the reference via plug 620 included in the integrated circuit device 1a according to the inventive concepts may be the FAV. The upper via plug 620 may be formed in a portion of the upper wiring insulating layer 650 corresponding to a portion where the third opening MO3 of the third mask layer MK3 overlaps with the fourth opening MO4 of the fourth mask layer MK4, namely, a portion where the third mask stitch region MS3 overlaps with the fourth mask stitch region MS4.

Specifically, the upper via plug 620 may be aligned by a width in the second horizontal direction (the Y direction) of each of the third opening MO3 and the fourth opening MO4, and thus a width in the second horizontal direction (the Y direction) of the upper via plug 620 may be determined/controlled, and may also be aligned by a width in the first horizontal direction (the X direction) of a portion where the third opening MO3 and the fourth opening MO4 overlap with each other, namely, a portion where the third mask stitch region MS3 and the fourth mask stitch region MS4 overlap with each other, and thus a width in the first horizontal direction (the X direction) of the upper via plug 620 may be determined/controlled.

Therefore, since the widths in the first horizontal direction (the X direction) and the second horizontal direction (the Y direction) perpendicular to each other may be confined, the electrical reliability of the integrated circuit device 1 having the reference via plug 320 may be improved.

FIGS. 16A to 16C illustrate that the lower via plug 220 is the SAV, the reference via plug 320 and the upper via plug 620 are the FAV, but is not limited thereto. For example, when the integrated circuit device has a multilayer wiring structure, all of the via plugs of each of the wiring structures may be the FAV. Alternatively, for example, when the integrated circuit device has a multilayer wiring structure, the via plug of at least one wiring structure located on an upper side may be the SAV, and at least one wiring structure located on a lower side may be the FAV.

While the inventive concepts have been particularly shown and described with reference to embodiments thereof, it will be understood that various changes in form and details may be made therein without departing from the scope of the following claims.

What is claimed is:

1. A method of manufacturing an integrated circuit device, the method comprising:
    sequentially forming a device layer, a wiring insulating layer, and a hard mask layer on a semiconductor substrate, the device layer comprising a plurality of semiconductor devices;
    sequentially removing a first region and a second region of the hard mask layer by using a first mask layer having a first opening extending in a first horizontal direction and a second mask layer having a second opening extending in the first horizontal direction as an etch mask, respectively, wherein a portion of the second opening overlaps in a vertical direction a stitch region that comprises a first portion of the wiring insulating layer and overlaps a portion of the first opening in the vertical direction;
    forming a first wiring recess passing through the wiring insulating layer and a second wiring recess having a depth that is less than a depth of the first wiring recess by removing the first portion of the wiring insulating layer by using as an etch mask a third region of the hard mask layer that remains after removing the first region and the second region of the hard mask layer; and
    forming a wiring structure that is in the first wiring recess and the second wiring recess and is electrically connected to the plurality of semiconductor devices.

2. The method of manufacturing the integrated circuit device of claim 1,
    wherein the first opening comprises a first cutting opening and a first extension opening and the second opening comprises a second cutting opening and a second extension opening, and
    wherein the first mask layer and the second mask layer are formed such that each of a portion of the first cutting opening adjacent to one end of the first cutting opening and a portion of the second cutting opening adjacent to one end of the second cutting opening overlaps the stitch region in the vertical direction.

3. The method of manufacturing the integrated circuit device of claim 2,
    wherein the first mask layer and the second mask layer are formed such that a center line in the first horizontal direction of each of the first cutting opening and the second cutting opening is on the same straight line on the wiring insulating layer.

4. The method of manufacturing the integrated circuit device of claim 3,
    wherein a width in a second horizontal direction perpendicular to the first horizontal direction of each of the first cutting opening and the second cutting opening has the same value.

5. The method of manufacturing the integrated circuit device of claim 2,
    wherein the first mask layer and the second mask layer are formed such that the first extension opening and the second extension opening overlap different respective portions of the wiring insulating layer.

6. The method of manufacturing the integrated circuit device of claim 1,
    wherein the first wiring recess is formed in the stitch region of the wiring insulating layer.

7. The method of manufacturing the integrated circuit device of claim 1, wherein the second wiring recess is formed in:
    a second portion of the wiring insulating layer that is overlapped by the first opening in the vertical direction outside of the stitch region; and
    a third portion of the wiring insulating layer that is overlapped by the second opening in the vertical direction outside of the stitch region.

8. The method of manufacturing the integrated circuit device of claim 1,
    wherein the hard mask layer comprises a first hard mask layer and a second hard mask layer stacked on the first hard mask layer,
    wherein the stitch region further comprises a portion of the first hard mask layer and a first portion of the second hard mask layer that overlap the first portion of the wiring insulating layer in the vertical direction, and
    wherein sequentially removing the first region and the second region of the hard mask layer comprises:
    removing the first portion of the second hard mask layer by using the first mask layer as an etch mask; and
    removing a second portion of the second hard mask layer and the portion of the first hard mask layer by using the second hard mask layer as an etch mask.

9. The method of manufacturing the integrated circuit device of claim 8, further comprising:
    forming an etch stop film between the wiring insulating layer and the hard mask layer, wherein the stitch region further comprises a portion of the etch stop film that overlaps the first portion of the wiring insulating layer in the vertical direction; and
    removing the portion of the etch stop film, after sequentially removing the first region and the second region of the hard mask layer.

10. The method of manufacturing the integrated circuit device of claim 9,
    wherein each of the first hard mask layer, the second hard mask layer, and the etch stop film comprises a different one among a metal nitride material, an oxynitride material, and a material comprising carbon.

11. A method of manufacturing an integrated circuit device, the method comprising:
- sequentially forming a device layer, a wiring insulating layer, an etch stop film, and a hard mask layer on a semiconductor substrate comprising portion that is in a stitch region of integrated circuit device, the device layer comprising a plurality of semiconductor devices;
- forming a first recess in the hard mask layer by removing a first region of the hard mask layer by using as an etch mask a first mask layer having a first opening that has a portion in the stitch region and extends in a first horizontal direction;
- forming a second recess by removing a second region of the hard mask layer by using as an etch mask a second mask layer having a second opening that has a portion in the stitch region and extends in the first horizontal direction;
- removing a first portion of the etch stop film that is in the stitch region;
- removing a third region of the hard mask layer and a second portion of the etch stop film through the first recess, removing a fourth region of the hard mask layer and a third portion of the etch stop film through the second recess, and removing a portion of an upper first portion of the wiring insulating layer that is in the stitch region; and
- forming a first wiring recess passing through the wiring insulating layer in the stitch region and forming a second wiring recess having a depth that is less than a depth of the first wiring recess, by removing a second portion of the wiring insulating layer by using as an etch mask a fifth region of the hard mask layer that remains after removing the third region and the fourth region of the hard mask layer.

12. The method of manufacturing the integrated circuit device of claim 11, further comprising:
- forming a wiring material layer in the first wiring recess and the second wiring recess and on the etch stop film and the wiring insulating layer; and
- forming a wiring structure in the first wiring recess and the second wiring recess that is electrically connected to the plurality of semiconductor devices, by removing any remaining portions of the etch stop film and a portion of the wiring material layer that is on the wiring insulating layer,
- wherein a first width of the wiring structure is controlled in the first horizontal direction and a second width of the wiring structure is controlled in a second horizontal direction that is perpendicular to the first horizontal direction, by forming the first recess using the first mask layer having the first opening and by forming the second recess using the second mask layer having the second opening.

13. The method of manufacturing the integrated circuit device of claim 12,
- further comprising forming an upper wiring insulating layer on the wiring insulating layer and the wiring structure.

14. The method of manufacturing the integrated circuit device of claim 13,
- wherein the upper wiring insulating layer is formed such that a lower surface of the upper wiring insulating layer is in contact with an upper surface of the wiring insulating layer.

15. The method of manufacturing the integrated circuit device of claim 11,
- wherein the hard mask layer comprises a first hard mask layer and a second hard mask layer stacked on the first hard mask layer, and
- wherein the first recess is formed by removing the first region of the second hard mask layer by using the first mask layer as an etch mask, and
- wherein the second recess is formed by removing the second region of the second hard mask layer and a portion of the first hard mask layer that is in the stitch region by using the second mask layer as an etch mask.

16. The method of manufacturing the integrated circuit device of claim 15,
- wherein the second recess is formed such that the first portion of the etch stop film in the stitch region is exposed through the second recess.

17. A method of manufacturing an integrated circuit device, the method comprising:
- sequentially forming a semiconductor substrate having a stitch region, a wiring insulating layer, an etch stop film, a first hard mask layer, and a second hard mask layer;
- forming a first recess by removing a first region of the second hard mask layer by using as an etch mask a first mask layer having a first opening that extends in a first horizontal direction and has a portion that is in the stitch region;
- forming a second recess by removing a second region of the second hard mask layer and a first portion of the first hard mask layer that is in the stitch region by using as an etch mask a second mask layer having a second opening that extends in the first horizontal direction and has a first portion in the stitch region and a second portion that is different from the first opening;
- removing a first portion of the etch stop film that is in the stitch region;
- removing a second portion of the first hard mask layer and a second portion of the etch stop film through the first recess, removing a third portion of the first hard mask layer and a third portion of the etch stop film through the second recess, and removing a portion of an upper first portion of the wiring insulating layer that is in the stitch region; and
- forming a first wiring recess passing through the wiring insulating layer and a second wiring recess having a depth that is less than that of the first wiring recess by removing a second portion of the wiring insulating layer by using a fourth portion of the first hard mask layer as an etch mask, wherein the first wiring recess is formed in the stitch region.

18. The method of manufacturing the integrated circuit device of claim 17,
- wherein the first hard mask layer comprises a metal nitride material, and the etch stop film comprises a material comprising carbon.

19. The method of manufacturing the integrated circuit device of claim 17, further comprising:
- forming a wiring structure in the first wiring recess and the second wiring recess; and
- forming an upper wiring insulating layer on the wiring insulating layer and the wiring structure and having a lower surface being in contact with an upper surface of the wiring insulating layer.

20. The method of manufacturing the integrated circuit device of claim 19, wherein forming the wiring structure comprises removing any remaining portion of the etch stop film on the wiring insulating layer.

\* \* \* \* \*